(12) United States Patent
Miyairi et al.

(10) Patent No.: US 8,043,969 B2
(45) Date of Patent: *Oct. 25, 2011

(54) METHOD FOR MANUFACTURING SEMICONDUCTOR DEVICE

(75) Inventors: Hidekazu Miyairi, Kanagawa (JP);
Koichiro Tanaka, Kanagawa (JP);
Hironobu Shoji, Tokyo (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/827,347

(22) Filed: Jun. 30, 2010

(65) Prior Publication Data

US 2010/0267179 A1  Oct. 21, 2010

Related U.S. Application Data

(63) Continuation of application No. 11/841,361, filed on Aug. 20, 2007, now Pat. No. 7,749,907.

(30) Foreign Application Priority Data

Aug. 25, 2006 (JP) .................................. 2006-229093

(51) Int. Cl.
*H01L 21/461* (2006.01)
(52) U.S. Cl. ................. 438/690; 438/759; 257/E21.596
(58) Field of Classification Search ............ 438/30, 438/149, 690, 706–708, 759; 257/E21.596; 219/121.73
See application file for complete search history.

(56) References Cited

U.S. PATENT DOCUMENTS

| 4,842,677 A | * | 6/1989 | Wojnarowski et al. ......... 216/65 |
| 4,861,694 A | | 8/1989 | Aoki et al. |
| 4,865,686 A | | 9/1989 | Sinohara |
| RE33,947 E | | 6/1992 | Shinohara |
| 5,302,547 A | | 4/1994 | Wojnarowski et al. |

(Continued)

FOREIGN PATENT DOCUMENTS

JP  63-84789  4/1988

(Continued)

OTHER PUBLICATIONS

Office Action re Chinese application No. CN 200710146856.X, dated Apr. 27, 2010 (with English translation).

*Primary Examiner* — Michael Lebentritt
*Assistant Examiner* — Daniel Whalen
(74) *Attorney, Agent, or Firm* — Husch Blackwell LLP

(57) ABSTRACT

A first layer is formed over a substrate, a light absorbing layer is formed over the first layer, and a layer having a light-transmitting property is formed over the light absorbing layer. The light absorbing layer is selectively irradiated with a laser beam via the layer having a light-transmitting property. When the light absorbing layer absorbs energy of the laser beam, due to emission of gas that is within the light absorbing layer, or sublimation, evaporation, or the like of the light absorbing layer, a part of the light absorbing layer and a part of the layer having a light-transmitting property in contact with the light absorbing layer are removed. By using the remaining part of the layer having a light-transmitting property or the remaining part of the light absorbing layer as a mask and etching the first layer, the first layer can be processed into a desired shape.

36 Claims, 30 Drawing Sheets

U.S. PATENT DOCUMENTS

| | | | |
|---|---|---|---|
| 5,708,252 A | 1/1998 | Shinohara et al. | |
| 6,149,988 A | 11/2000 | Shinohara et al. | |
| 6,182,570 B1 | 2/2001 | Rorke et al. | |
| 6,261,856 B1 | 7/2001 | Shinohara et al. | |
| 6,331,443 B1 | 12/2001 | Lee et al. | |
| 7,749,907 B2 * | 7/2010 | Miyairi et al. | 438/690 |
| 2003/0194882 A1 | 10/2003 | Dubowski et al. | |
| 2005/0064675 A1 | 3/2005 | Kim | |
| 2006/0246279 A1 | 11/2006 | Urairi et al. | |
| 2008/0026543 A1 | 1/2008 | Miyairi et al. | |
| 2008/0042288 A1 | 2/2008 | Yamazaki et al. | |
| 2008/0044744 A1 | 2/2008 | Yamazaki et al. | |
| 2008/0050851 A1 | 2/2008 | Tanaka et al. | |
| 2008/0050895 A1 * | 2/2008 | Miyairi et al. | 438/507 |
| 2008/0070393 A1 | 3/2008 | Miyairi et al. | |
| 2008/0176383 A1 * | 7/2008 | Tanaka et al. | 438/460 |
| 2008/0182207 A1 | 7/2008 | Yamazaki et al. | |
| 2008/0182349 A1 | 7/2008 | Yamazaki et al. | |
| 2008/0227232 A1 | 9/2008 | Yamazaki et al. | |

FOREIGN PATENT DOCUMENTS

| | | |
|---|---|---|
| JP | 2-317 | 1/1990 |
| JP | 9-325365 | 12/1997 |
| JP | 2006-303286 | 11/2006 |
| JP | 2007-157659 | 6/2007 |
| WO | WO 00/28604 A1 | 5/2000 |

* cited by examiner

METHOD FOR MANUFACTURING SEMICONDUCTOR DEVICE

This application is a continuation of application Ser. No. 11/841,361 filed on Aug. 20, 2007 now U.S. Pat. No. 7,749,907.

BACKGROUND OF THE INVENTION

1. Field of the Invention

The present invention relates to a method of manufacturing a semiconductor device having a semiconductor element.

2. Description of the Related Art

Conventionally, so-called active matrix driving method display panels or semiconductor integrated circuits which include semiconductor elements typified by thin film transistors (hereinafter also referred to as TFTs) and MOS transistors have been manufactured by using a light exposure process (hereinafter referred to as a photolithography process) which employs a photomask to form a resist mask, and then selectively etching various thin films.

In a photolithography process, after applying a resist over an entire surface of a substrate and performing pre-baking, the resist is exposed by being irradiated with ultraviolet light or the like through a photomask and is then developed to form a resist mask. Subsequently, using the resist mask as a mask, portions of thin films (thin films formed of semiconductor material, insulating material, or conductive material) other than portions that are to form a semiconductor layer and wirings are removed by etching, and thereby a semiconductor layer and wirings are formed.

Further, in Patent Document No. 1 (Japanese Published Patent Application No. S 63-84789) and Patent Document No. 2 (Japanese Published Patent Application No. H 2-317), the present applicants have described a thin film processing method in which a light-transmitting conductive film is irradiated with a linear laser beam having a wavelength of 400 μm or less and an open slot is formed.

SUMMARY OF THE INVENTION

However, photomasks used in photolithography techniques have a detailed form and are very expensive because a high degree of precision is required for their form. Further, it is necessary to prepare a plurality of expensive photomasks to manufacture a semiconductor device, so from an industrial point of view, this is a very large financial burden.

Further, when a design of a semiconductor device is changed, naturally the need to newly prepare a photomask to match a processing pattern which has changed arises. As previously mentioned, photomasks are objects which are formed with a detailed shape to a high degree of precision. Therefore, manufacturing them requires a considerable amount of time. That is, the replacement of photomasks which accompanies changes in design or defects in design results in not only a financial burden, but also in the risk of a time delay.

Further, in the case where an opening is formed by using an optical system to condense a laser beam which is emitted from a laser oscillator onto one location or a plurality of locations and irradiating with the laser beam, there is a problem in that due to the influence of unevenness of the pointing stability of the laser oscillator and the like, the location where the laser beam is condensed may vary.

Moreover, in the case of using a conventional photolithography process to etch a semiconductor film to form a semiconductor layer with a desired shape, a resist is applied onto a surface of the semiconductor film. Because the surface of the semiconductor film is directly exposed to the resist at that time, there is a problem in that the semiconductor film may be contaminated by impurities contained in the resist, such as oxygen, carbon, and heavy metal elements. Due to the contamination, an impurity element may get mixed into the semiconductor film and characteristics of the semiconductor element may deteriorate. Particularly with TFTs, there is a problem in that contamination causes variation in and deterioration of transistor characteristics.

Therefore, the present invention provides a method in which thin film processing is performed by a simple process with good precision, without using a photomask or a resist. Further, the invention provides a low-cost method of manufacturing a semiconductor device.

In the invention, a first layer is formed over a substrate, a light absorbing layer is formed over the first layer, a layer having a light-transmitting property is formed over the light absorbing layer, and the light absorbing layer is selectively irradiated with a laser beam via the layer having a light-transmitting property. When the light absorbing layer absorbs energy of the laser beam, due to emission of gas within the light absorbing layer, sublimation or evaporation of the light absorbing layer, or the like, a part of the light absorbing layer and a part of the layer having a light-transmitting property which is in contact with the light absorbing layer are physically detached. That is, a part of the light absorbing layer is irradiated with the laser beam, and a part of the irradiated region and a part of the layer having a light-transmitting property which is in contact with the irradiated region are removed. By using the remaining part of the layer having a light-transmitting property or the remaining part of the light absorbing layer as a mask and etching the first layer, the first layer can be processed into a desired form in a desired location without using a conventional photolithography technique.

When a layer having a light-transmitting property is formed over a light absorbing layer, the light absorbing layer can be irradiated with a laser beam. Further, the light absorbing layer which has been irradiated with the laser beam absorbs energy of the laser beam and is sublimated or evaporated, so the light absorbing layer and the layer having a light-transmitting property can be selectively processed. Further, when a layer having a light-transmitting property is formed, even if materials with which etching selectively is difficult to obtain between the light absorbing layer and the first layer, that is, materials having a low etching speed, are used, the first layer can be etched using the processed layer having a light-transmitting property as well as the processed light absorbing layer as a mask. Therefore, by providing a layer having a light-transmitting property over a light absorbing layer, the number of materials that can be selected for use for the first layer and the light absorbing layer can be increased.

Further, in a case where the light absorbing layer is a conductive layer it is preferable that the light absorbing layer has a thin film thickness so that energy of the absorbed laser beam is not transmitted outside the irradiated region and so that the light absorbing layer is easily sublimated or evaporated. However, in a case where a layer having a light-transmitting property is not formed over the light absorbing layer and only the light absorbing layer is formed, and the light absorbing layer which has been processed by irradiation with a laser beam is used as a mask, if the light absorbing layer has a thin film thickness, when the first layer is etched, the light absorbing layer, which is the mask, is also etched, so it is difficult to form the first layer into a desired form. As a result, this causes a reduction in yield and defects in semiconductor devices. However, when a layer having a light-transmitting property is formed over the light absorbing layer, the layer having a light-transmitting property or the light absorbing layer which have been processed by laser beam irradiation can be used as a mask. Because the film thickness of the layer having a light-transmitting property can be freely determined, the layer having a light-transmitting property can be made to function as a mask for processing the first layer. Therefore, by using the layer having a light-transmitting property which has been processed by laser beam irradiation as a mask, the yield can be increased.

Further, a laser irradiation apparatus having an electrooptic element may be used to selectively irradiate the light absorbing layer with a laser beam. The electrooptic element can control the location and the area which the laser beam selectively irradiates in accordance with data designed using a CAD (computer-aided design) device. Therefore, the light absorbing layer can be selectively irradiated with a laser beam without using a photomask.

Another mode of the invention is a method of manufacturing a semiconductor device in which a first layer is formed over a substrate, a light absorbing layer is formed over the first layer, and a layer having a light-transmitting property is Mimed over the light absorbing layer; the light absorbing layer is selectively irradiated with a laser beam, via the layer having a light-transmitting property; a part of the layer having a light-transmitting property which is in contact with a part of the light absorbing layer which has been irradiated with the laser beam is removed, and a part of the light absorbing layer is exposed; and a part of the exposed light absorbing layer and a part of the first layer are etched to form a second layer.

Further, another mode of the invention is a method of manufacturing a semiconductor device in which a first layer is formed over a substrate, a light absorbing layer is formed over the first layer, and a layer having a light-transmitting property is formed over the light absorbing layer; the light absorbing layer is selectively irradiated with a laser beam via the layer having a light-transmitting property; a surface of a part of the light absorbing layer and a part of the layer having a light-transmitting property which have been irradiated with the laser beam are removed to expose a part of the light absorbing layer; and a part of the exposed light absorbing layer and a part of the first layer are etched to form a second layer.

Note that the second layer may be a stacked layer which includes the etched light absorbing layer and the etched first layer.

Further, yet another mode of the invention is a method of manufacturing a semiconductor device in which a first layer is formed over a substrate, a light absorbing layer is formed over the first layer, and a layer having a light-transmitting property is formed over the light absorbing layer; the light absorbing layer is selectively irradiated with a laser beam via the layer having a light-transmitting property; a part of the light absorbing layer and a part of the layer having a light-transmitting property which have been irradiated with the laser beam are removed, thereby exposing a part of the first layer; and a part of the exposed first layer is etched to form a second layer.

Note that for the etching, either wet etching or dry etching can be used.

Further, after the second layer is formed, the layer having a light-transmitting property may be removed. Furthermore, after the layer having a light-transmitting property is removed, the light absorbing layer may also be removed.

Further, the laser beam is emitted from a laser irradiation apparatus having an electrooptic element. Through a control device, the electrooptic element controls the region and the area which are selectively irradiated by the laser beam. Further, the laser beam can be a rectangular shape or a linear shape, or the shape used for the laser beam can be determined freely, as appropriate.

Note that in the invention, a display device refers to a device which employs a display element; that is, to an image display device. Further, a module in which a connector, for example an FPC (flexible printed circuit), TAB (tape automated bonding) tape, or a TCP (tape carrier package), is fitted to a display panel; a module in which a printed wiring board is provided at an end of TAB tape or a TCP; and a module in which an IC (integrated circuit) or a CPU is directly mounted on a display element by a COG (chip on glass) method, are all covered by the term 'display device'.

When the light absorbing layer is irradiated with the laser beam via the layer having a light-transmitting property, the light absorbing layer and the layer having a light-transmitting property can be freely processed. Further, at least the processed layer having a light-transmitting property can be used as a mask for processing a thin film.

Further, using the laser irradiation apparatus having the electrooptic element which can selectively control the region which is irradiated with the laser beam, the light absorbing layer can be selectively irradiated with the laser beam via the layer having a light-transmitting property in accordance with data designed using a CAD (computer-aided design) device.

Therefore, by etching a thin film using the layer having a light-transmitting property and the light absorbing layer which serve as a mask and which are formed by laser beam irradiation in which the irradiation region is controlled by an electrooptic element, a layer having a desired shape can be formed in a predetermined location.

Further, by irradiating the light absorbing layer with a laser beam having a beam spot with a large area, such as a linear laser beam, a rectangular laser beam, a planar laser beam, or a laser beam with another desired shape, a plurality of regions can be irradiated with the laser beam in a short amount of time. Therefore, semiconductor devices can be manufactured with high mass productivity.

Therefore, a thin film can be processed into a desired form without using a resist or a photomask, which are necessary in conventional photolithography techniques. Note that since a photomask is not used, time loss due to photomask replacement can be reduced, and high-mix, low-volume production is possible. Further, because a resist and a developing solution for the resist are not used, a large amount of chemical solution and water is not required. Furthermore, a semiconductor film can be processed without impurity elements being mixed in with the semiconductor film due to application of the resist. Therefore, compared to processes using conventional photolithography techniques, large-scale simplification of processing and reduction in cost of processing is possible.

Thus, by using the invention, thin film processing in the manufacture of semiconductor devices can be performed with good precision using a simple process. Further, semiconductor devices can be manufactured at low cost with high throughput and a high yield.

DETAILED DESCRIPTION OF THE INVENTION

Figure 1A:
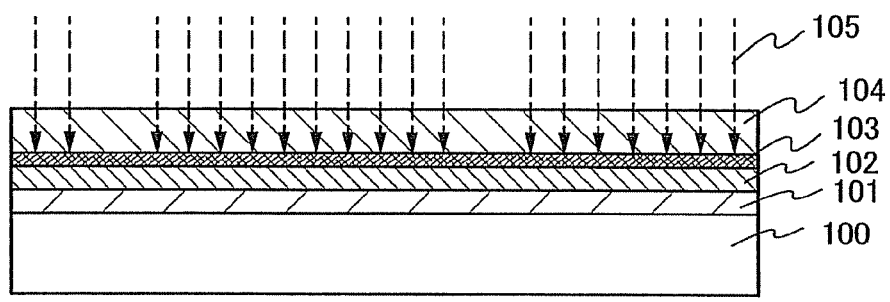
FIGS. 1A to 1E are cross-sections illustrating a method of manufacturing a semiconductor device of the invention.

Hereinafter, best modes for carrying out the invention will be described with reference to the accompanying drawings. However, the invention can be carried out in many different modes, and those skilled in the art will readily appreciate that a variety of modifications can be made to the modes and their details without departing from the spirit and scope of the invention. Accordingly, the invention should not be construed as being limited to the description of the embodiment modes. Further, like reference numerals are used to indicate like parts throughout the drawings, and detailed description thereof is omitted.

Embodiment Mode 1

In this embodiment mode, a laser ablation patterning process (LAPP) in which a thin film is processed using a laser beam without using a photolithography process will be described. FIGS. 1A to 1E, FIGS. 3A to 3E, and FIGS. 5A to 5E are cross-sections showing a process in which a layer with a desired shape is selectively formed over a substrate. FIGS. 2A to 2E, FIGS. 4A to 4E, and FIGS. 6A to 6E show electrooptic elements of a laser irradiation apparatus and top views of FIGS. 1A to 1E, FIGS. 3A to 3E, and FIGS. 5A to 5E. This embodiment mode will be described with reference to a mode in which a wiring is formed.

As shown in FIG. 1A, a first layer 101 which serves as a base film is formed over one side of a substrate 100, a second layer 102 is formed over the first layer 101, a light absorbing layer 103 is formed over the second layer 102, and a layer 104 having a light-transmitting property is formed over the light absorbing layer 103.

As the substrate 100, a glass substrate, a plastic substrate, a metal substrate, a ceramic substrate, or the like can be used, as appropriate. Further, a printed circuit board or an FPC can be used. In a case where the substrate 100 is a glass substrate or a plastic substrate, a large-area substrate such as a substrate that is 320×400 mm, 370×470 mm, 550×650 mm, 600×720 mm, 680×880 mm, 1000×1200 mm, 1100×1250 mm, or 1150×1300 mm can be used.

The first layer 101 which serves as a base film does not necessarily have to be provided. However, it is preferable to provide the first layer 101, because it has a function of preventing the substrate 100 from being etched when the second layer 102 is etched subsequently. The first layer 101 may be formed by using a suitable material as appropriate. Representative examples of materials that may be used for the first layer 101 are silicon oxide, silicon nitride, silicon oxynitride, aluminum nitride, and the like.

The second layer 102 may be formed to suit the location of an electrode, a pixel electrode, a wiring, an antenna, a semiconductor layer, an insulating layer, a partition wall or a phosphor of a plasma display, or the like which will be manufactured, using a conductive material; a semiconductor material, or an insulating material as appropriate. Note that the second layer 102 may be a single layer or a stacked layer.

The light absorbing layer 103 is formed using a material which will absorb a laser beam 105 that irradiation is performed with subsequently. The material which absorbs the laser beam 105 is formed using a material having a band gap energy that is lower than the energy of the laser beam 105. Further, preferably a material having a lower boiling point or a lower sublimation point than the melting point of the second layer 102 is used for the light absorbing layer 103. When such a material is used, the laser beam 105 can be absorbed and a part of the layer 104 having a light-transmitting property which is in contact with the light absorbing layer 103 can be removed using energy of the laser beam 105, without melting the second layer 102.

For the light absorbing layer which can be sublimated or evaporated by energy of the laser beam 105, preferably a material with a low sublimation point of about 100 to 2000°

C. is used. Further, a material with a boiling point of 1000 to 2700° C. and a thermal conductivity of 0.1 to 100 W/mK can be used.

As the light absorbing layer, a conductive material, a semiconductor material, or an insulating material can be used as suitable. As a conductive material, any one of the elements titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir), silver (Ag), gold (Au), platinum (Pt), cadmium (Cd), zinc (Zn), silicon (Si), germanium (Ge), zirconium (Zr), and barium (Ba) can be used. Further, the light absorbing layer can be formed as a single layer or a stacked layer which includes an alloy material, a nitrogen compound, or the like which has one of the above-mentioned elements as its main constituent. Further, a conductive material having a light-transmitting property, such as indium oxide which contains tungsten oxide, indium zinc oxide which contains tungsten oxide, indium oxide which contains titanium oxide, indium tin oxide which contains titanium oxide, indium tin oxide (ITO), indium zinc oxide, or indium tin oxide to which silicon oxide has been added can be used.

As an insulating material, a single layer of an oxygen compound, a carbon compound, or a halogen compound of one of the above-mentioned elements can be used. Further, a stacked layer including such a compound can be used. Representatively, zinc oxide, aluminum nitride, zinc sulfide, silicon nitride, silicon oxide, mercury sulfide, aluminum chloride, or the like may be used. Further, an insulating film in which particles capable of absorbing light are dispersed (representatively, a silicon oxide film in which silicon microcrystals are dispersed) can be used. Further, an organic resin such as a polyimide, a polyamide, BCB (benzocyclobutene), or an acrylic can be used. Further, a siloxane, a polysilazane, or the like can be used. Further, an insulating layer in which a pigment is dissolved or dispersed in an organic resin, a siloxane, a polysilazane, or the like can be used.

As a semiconductor material, silicon, germanium, or the like can be used. Further, a film which has any one of the following states can be used: an amorphous semiconductor, a semi-amorphous semiconductor in which an amorphous state and a crystalline state are mixed (also referred to as an SAS), a microcrystalline semiconductor in which crystal grains of 0.5 to 20 nm can be observed in an amorphous semiconductor, and a crystalline semiconductor. Further, an acceptor element or a donor element, such as phosphorus, arsenic, or boron, may be included in the semiconductor material.

Further, the light absorbing layer 103 is preferably formed using a material which can absorb the laser beam 105 with which it is irradiated subsequently, and which enables a part of the light absorbing layer 103 or a part of a layer which is in contact with the light absorbing layer 103 to be physically detached, due to the release of gas that is within the light absorbing layer 103, or sublimation, evaporation, or the like of the absorbing layer 103, which is caused by energy of the laser beam 105. When such a material is used, the layer 104 having a light-transmitting property which is over the light absorbing layer 103 can be easily removed.

As a light absorbing layer which may be used as the light absorbing layer 103 which can release gas that is within itself by utilizing energy of the laser beam 105, a layer formed of a material containing at least one of hydrogen and a rare gas element may be used. Representatively, a semiconductor layer containing hydrogen, a conductive layer containing a rare gas or hydrogen, an insulating layer containing a rare gas or hydrogen, or the like may be used. In such a case, as gas within the light absorbing layer 103 is released, physical detachment of a part of the light absorbing layer 103 occurs. Therefore, the layer 104 having a light-transmitting property which is over the light absorbing layer 103 can be easily removed.

As a light absorbing layer which can be sublimated by energy of the laser beam 105, a material having a low sublimation point of about 100 to 2000° C. is preferable. Further, a material with a melting point of 1500 to 3500° C. and a thermal conductivity of 0.1 to 100 W/mK can be used. As a light absorbing layer capable of sublimation, a material with a low sublimation point of about 100 to 2000° C. may be used. Representative examples of such a material are aluminum nitride, zinc oxide, zinc sulfide, silicon nitride, mercury sulfide, aluminum chloride, and the like. As a material with a boiling point of 1000 to 2700° C. and a thermal conductivity of 0.1 to 100 W/mK, germanium (Ge), silicon oxide, chromium (Cr), titanium (Ti), or the like may be used.

As a method of forming the light absorbing layer 103, an application method, an electroplating method, a PVD (physical vapor deposition) method, or a CVD (chemical vapor deposition) method is used.

For the layer 104 having a light-transmitting property, a material through which the laser beam 105 which is used for irradiation subsequently can be transmitted, and which has a low etch rate compared to the second layer 102 which is processed subsequently is selected as appropriate. As a material through which the laser beam 105 can be transmitted, a material having a band gap energy which is larger than the energy of the laser beam is used.

In a case where the second layer 102 is a conductive layer or a semiconductor layer, the layer 104 having a light-transmitting property is preferably formed from an insulating layer. Representatively, a silicon nitride film, a silicon oxide film, a silicon oxynitride film, aluminum nitride, or the like may be used.

Next, the light absorbing layer 103 is irradiated with the laser beam 105 through the layer 104 having a light-transmitting property.

As the laser beam 105, a laser beam which can be transmitted through the layer 104 having a light-transmitting property and which has an energy which is absorbed by the light absorbing layer 103 is selected as appropriate. Representatively, a laser beam in the ultraviolet region, the visible region, or the infrared region is selected as appropriate for irradiation.

A laser irradiation apparatus which is used for the invention will now be described. Using data designed by a CAD device, the laser irradiation apparatus used in the invention can control the area that is irradiated with the laser beam and the location that is irradiated with the laser beam. When such a laser irradiation apparatus is used, irradiation with a laser beam can be performed selectively without using a photomask.

Figure 15:
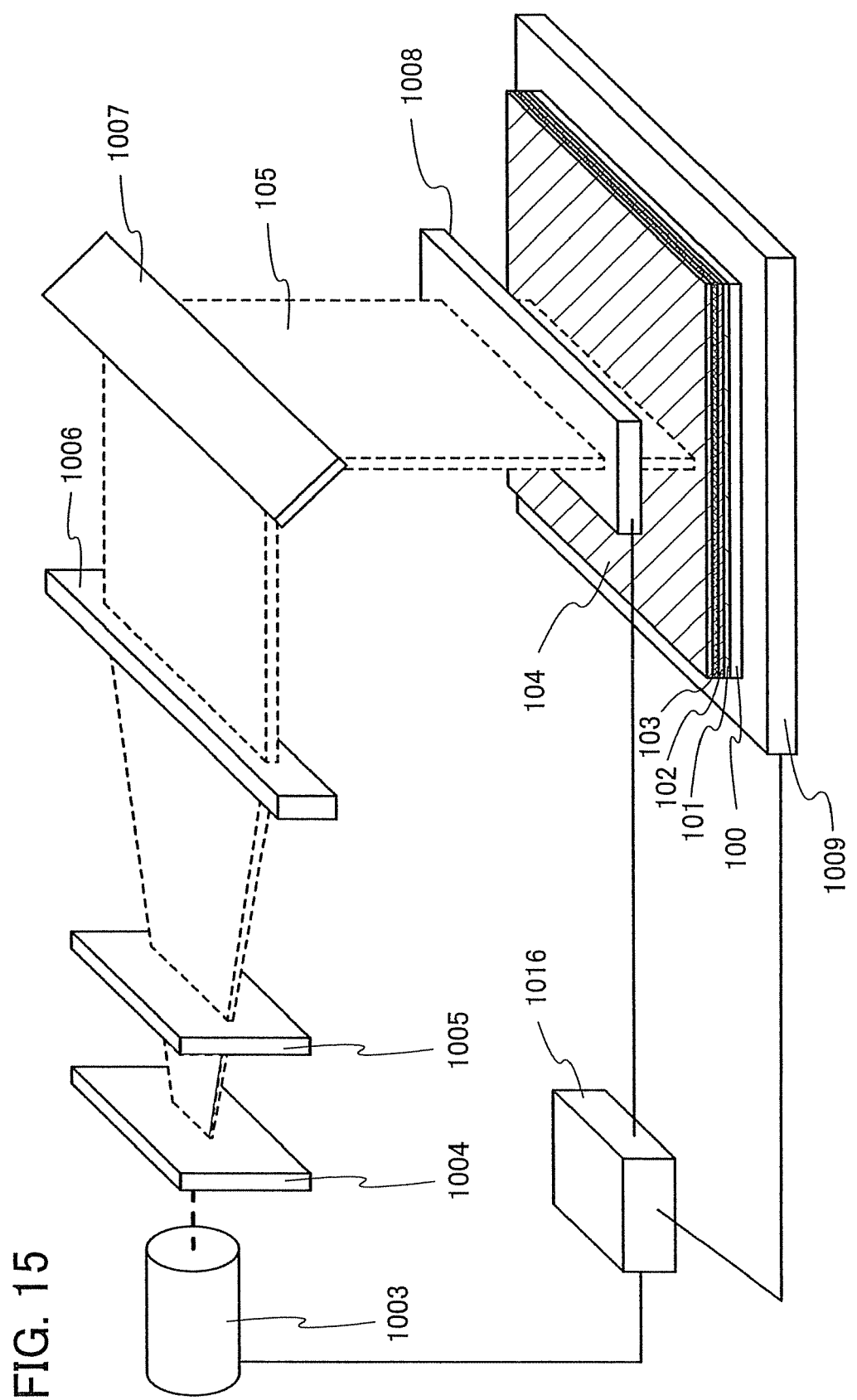
FIG. 15 is a perspective view illustrating a laser irradiation apparatus which can be applied to the invention.

A representative example of such a laser irradiation apparatus will be described with reference to FIG. 15. FIG. 15 is a perspective view of an example of a manufacturing apparatus of the invention. A laser beam which is emitted is output from a laser oscillator 1003 (a YAG laser device, an excimer laser device, or the like), and passes through a first optical system 1004 for making the beam shape rectangular, a second optical system 1005 for shaping, and a third optical system 1006 for collimating the laser beam. The optical path of the laser beam is then bent to a vertical direction by a reflecting mirror 1007. Subsequently, the laser beam is passed through an electrooptic element 1008 which selectively adjusts the area and location of the laser beam which the light absorbing layer light absorbing layer 103 is irradiated with, and the laser beam is then irradiated onto the surface which is to be irradiated.

As the laser oscillator 1003, one or a plurality of lasers selected from among the following can be used: a gas laser, such as an Ar laser, a Kr laser, or an excimer laser (KrF, ArF, XeCl); a laser whose medium is single-crystalline YAG, $YVO_4$, forsterite ($Mg_2SiO_4$), $YAlO_3$, or $GdVO_4$, doped with one or a plurality of Nd, Yb, Cr, Ti, Ho, Er, Tm, and Ta, or polycrystalline (ceramic) YAG, $Y_2O_3$, $YVO_4$, $YAlO_3$, or $GdVO_4$, doped with one or a plurality of Nd, Yb, Cr, Ti, Ho, Er, Tm, and Ta; a semiconductor laser oscillator, such as GaN, GaAs, GaAlAs, or InGaAsP; a glass laser, a ruby laser, an alexandrite laser, a Ti:sapphire laser, a copper vapor laser, and a gold vapor laser. When a solid-state laser, whose laser medium is a solid, is used, there are advantages in that maintenance-free conditions can be maintained for a long time, and output is comparatively stable.

Further, for the laser beam 105, a continuous wave laser beam or a pulsed laser beam can be applied as appropriate. For the pulsed laser beam, generally a frequency band of several tens of Hz to several kHz is used. However, a pulsed laser having a repetition rate which is much higher than that, of 10 MHz or more, may also be used; and a pulsed laser having a pulse width with a frequency band in the picosecond range or the femtosecond ($10^{-15}$ second) range may also be used. In particular, when a laser beam emitted from a pulsed laser which is oscillated with a pulse width of one femtosecond to 10 picoseconds is used, a high-intensity laser beam can be obtained, and a nonlinear optical effect (multiphoton absorption) occurs. Therefore, the layer formed with a material having a light-transmitting property which has a band gap energy which is larger than the energy of the laser beam can also be removed by the energy of the laser beam.

A representative example of a control device 1016 is a computer, which includes a memory portion (a RAM, a ROM, or the like) which stores design data of a semiconductor device and a microprocessor which includes a CPU and the like. When an electric signal based on CAD data for designing the semiconductor device is input from the control device 1016 to the electrooptic element 1008, the location and area of a laser beam which is irradiated onto the substrate 100 is controlled by the electrooptic element 1008. Further, in a case where a stage 1009, on which a substrate to be processed is fixed, is moved, by synchronizing the emission timing of the laser oscillator 1003, the electric signal that is input to the electrooptic element 1008, and the speed of movement of the stage 1009, the irradiation location of the laser beam and area of the laser beam can be controlled.

When the electric signal based on CAD data for designing the semiconductor device is input to the electrooptic element 1008, the electrooptic element 1008 functions as an optical shutter or an optical reflector and as an adjustable mask. By using the control device 1016 to change the electric signal which is input to the electrooptic element 1008 which functions as an optical shutter, the area and location of the laser beam can be changed. That is, the area of and location in the thin film which is processed can be selectively changed. Therefore, the shape of the laser beam can be linear, rectangular, or another desired shape, and irradiation with a laser beam with a complex shape can also be performed.

As the electrooptic element 1008, an element which can selectively adjust an area of optical penetration may be used. For example, an element having a liquid crystal material or an electrochromic material may be used. Further, an element which can selectively adjust optical reflection may be used. For example, a digital micromirror device (also referred to as a DMD) may be used. A DMD is a kind of spatial light modulator. It is a device in which a plurality of small mirrors, referred to as micromirrors, which rotate on a fixed axis in accordance with an electrostatic field effect, are disposed in matrix form over a semiconductor substrate formed of Si or the like. Alternatively, a PLZT element, which is an optical element which modulates a transmitted beam by using an electrooptic effect, can be used as an electrooptic element. Note that a PLZT element is a device that is an oxide ceramic which contains lead, lanthanum, zircon, and titanium, and it takes the name PLZT from the first letter of the chemical symbols of each of those chemicals. A PLZT element is a transparent ceramic through which light can be transmitted. However, when a voltage is applied to a PLZT element, the direction in which the light is polarized can be changed, and by combining a PLZT with a light polarizer, an optical shutter is formed. Note that the electrooptic element 1008 is a device that can withstand having a laser beam being passed through it.

Regarding the electrooptic element 1008, the region which a beam can pass through can be made to coincide with that of the substrate which is to be processed. In a case where for the electrooptic element 1008, the region which a beam can pass through coincides with that of the substrate which is to be processed, the substrate to be processed and the electrooptic element 1008 are aligned with each other, and the laser beam is scanned with both of their positions fixed. Note that in such a case, for processing a thin film one time, an electric signal is input to the electrooptic element 1008 once.

In order to achieve a reduction in size of the manufacturing apparatus, the electrooptic element 1008 may have a long, narrow rectangular shape such that at least a rectangular beam can be transmitted through it or be reflected by it. For example, in a case where a long and narrow DMD is used, the number of micromirrors which control an angle of reflection can be reduced. Therefore, modulating speed can be increased. Further, in a case where an electrooptic element which employs long, thin liquid crystals is used, the number of scanning lines and signal lines is reduced and driving speed can be increased. Therefore, a similar effect as in the case of a long and narrow DMD can be obtained. Further, when an electrooptic element with a long, narrow rectangular shape is used, for processing a thin film one time, an electric signal which is input to the electrooptic element 1008 is changed a plurality of times. When the electric signal which is input to the electrooptic element sequentially is changed so that it is synchronized with scanning of the rectangular beam, thin films are processed in succession.

Further, the shape of a spot of the laser beam 105 which is irradiated onto the irradiation surface is preferably rectangular or linear. Specifically, a rectangular shape with a short side of 1 to 5 mm and a long side of 10 to 50 mm is preferable. In a case where a laser beam spot which has little aberration is desired, the shape of the spot may be a square which is 5×5 mm to 50×50 mm. Further, in a case where a substrate with a large area is used, in order to reduce processing time, a long side of the laser beam spot is preferably 20 to 100 cm. Furthermore, the electrooptic element 1008 may be controlled such that the area per shot is the aforementioned size, and inside that area, irradiation is performed with a laser beam having a spot with a complex shape. For example, irradiation can be performed with a laser beam having a spot which has a shape similar to that of a wiring.

Further, laser beams with rectangular shapes and linear shapes may be overlapped and a laser beam with a complex spot shape may be used.

Further, a plurality of the laser oscillator 1003 and the optical systems shown in FIG. 15 may be provided so that a substrate with a large area is processed in a short time. Specifically, a plurality of electrooptic elements may be provided over the stage 1009, and laser beams may be emitted from laser oscillators which correspond to each of them, and the processing area of a single substrate may be divided among the laser beams.

Further, instead of a stage which holds the substrate, the substrate may be moved by using a method in which gas is blown and the substrate 100 is floated. As the size of a large-area substrate, sizes of 590×670 mm, 600×720 mm, 650×830 mm, 680×880 mm, 730×920 mm, and the like are used in production lines. In a case where a glass substrate with a side exceeding one meter is used, preferably a conveying method which can relieve a warp caused by the tare weight of the substrate, for example, a method in which gas is blown and the substrate is floated, is used to move the substrate.

Further, instead of a stage which holds a substrate placed on its side, a holder which holds a substrate which is standing upright may be used. When irradiation with a laser beam is performed on a substrate that is standing upright, debris can be removed from the substrate.

Further, a plurality of optical systems may be provided in the optical path between the laser oscillator 1003 and the substrate 100, and more detailed processing may be performed. Representatively, when projection is reduced using a stepper system which includes an electrooptic element and an optical system for reduction, the area and position of the laser beam can be processed in detail. Further, same-size projection using a mirror projection system may be performed.

Further, it is preferable to provide a means of position alignment which is electrically connected to the control device. Concerning irradiation position alignment, laser irradiation can be performed with high precision by providing an image pickup device such as a CCD camera and performing laser irradiation based on data obtained from the image pickup device. Further, with this manufacturing apparatus, a laser beam can be irradiated onto a desired position and a position marker can be formed.

Further, in a case where dust is caused by the laser beam irradiation, preferably the manufacturing apparatus is further provided with a blowing means for ensuring that dust does not adhere to a substrate surface which is to be processed, or a dust vacuuming means. Dust can be prevented from adhering to the substrate surface by blowing or vacuuming dust while performing laser beam irradiation.

Note that FIG. 15 is an example, and there is no particular limitation on the positional relationship of the optical systems and the electrooptic element disposed in the optical path of the laser beam. For example, when the laser oscillator 1003 is disposed over the substrate 100 and the laser beam emitted from the laser oscillator 1003 is disposed such that it is emitted in a direction perpendicular to the substrate surface, it is not necessary to use a reflecting mirror. Further, each optical system may employ a condenser lens, a beam expander, a homogenizer, a polarizer, or the like, and these may be combined. Further, as each optical system, slits may be combined.

By scanning the laser beam or moving the substrate, as appropriate, the irradiation region of the laser beam can be moved two-dimensionally over the surface to be irradiated, and thereby a wide area of a substrate can be irradiated. Here, scanning is performed by a moving means (not shown in the drawing) which moves the substrate stage 1009, which is holding the substrate, in an XY direction.

The control device 1016 is preferably connected such that it can also control the moving means which moves the substrate stage 1009 in the XY direction. Further, the control device 1016 is preferably connected such that it can also control the laser oscillator 1003. Furthermore, the control device 1016 is preferably connected to a position alignment system for recognizing position markers.

Figure 2A:
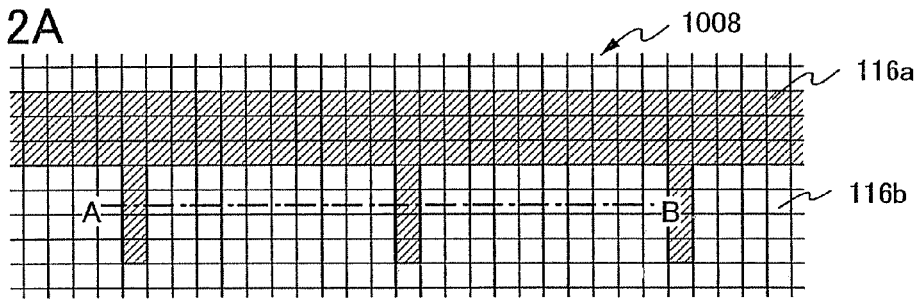
FIGS. 2A to 2E are top views illustrating a method of manufacturing a semiconductor device of the invention.

FIG. 2A shows a top view of part of an electrooptic element 1008 for irradiating with a laser beam such as the laser beam 105 shown in FIG. 1A. A mode in which the electrooptic element 1008 is made to function as an optical shutter is shown. The electrooptic element 1008 shown in FIG. 2A is provided with a laser beam blocking region 116a and a laser beam transmission region 116b.

Using the electrooptic element 1008, the light absorbing layer 103 is selectively irradiated with the laser beam 105. The laser beam 105 can have an energy density sufficient for the release of gas which is in the light absorbing layer 103 or for sublimation or evaporation of the light absorbing layer, or the like. Representatively, the laser beam 105 can have an energy density within a range of 1 $\mu J/cm^2$ to 100 $J/cm^2$. The laser beam 105 with a sufficiently high energy density is absorbed by the light absorbing layer 103. At this time, the light absorbing layer 103 is rapidly heated locally by energy of the absorbed laser beam, and sublimates or evaporates. Due to expansion in volume which accompanies this sublimation or evaporation, a part of the layer 104 having a light-transmitting property is physically detached and scatters. Thus, as shown in FIG. 1B, an etched light absorbing layer 113 and an etched layer 114 having a light-transmitting property can be formed over the second layer 102.

Figure 1B:
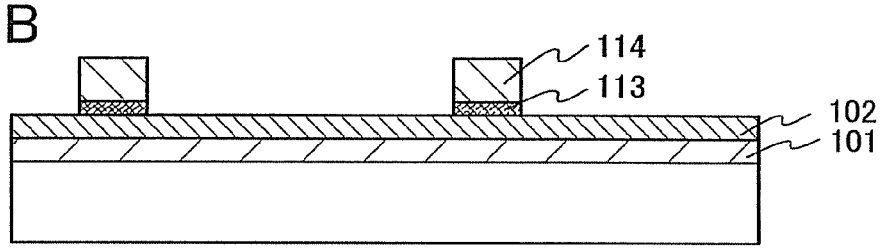
Figure 2B:
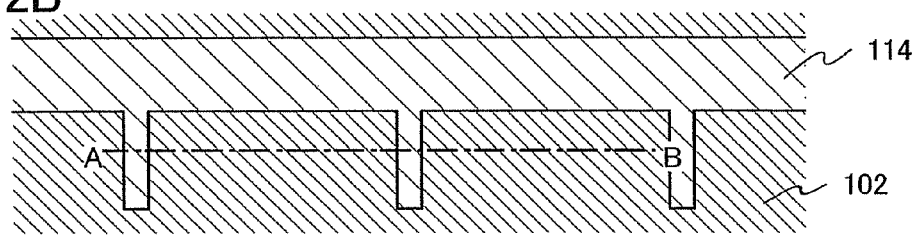

As a result, as shown in FIG. 1B, due to sublimation or evaporation of the light absorbing layer 103, parts of the light absorbing layer and the layer having a light-transmitting property which have been irradiated with the laser beam are removed. Note that a top view of FIG. 1B is shown in FIG. 2B.

Irradiation with the laser beam 105 can be performed under atmospheric pressure or under reduced pressure. When the irradiation is performed under reduced pressure, collection of debris, which is caused when the layer 104 having a light-transmitting property is removed, is facilitated. Therefore, debris can be prevented from remaining over the substrate.

Further, the light absorbing layer 103 may be irradiated with the laser beam while heating the substrate 100. In this case too, removal of the layer having a light-transmitting property is facilitated.

Through the above steps, without using a photolithography technique, a mask can be selectively formed over a substrate, using part of a layer having a light-transmitting property and part of a light absorbing layer, by irradiating the light absorbing layer with a laser beam.

Figure 1C:
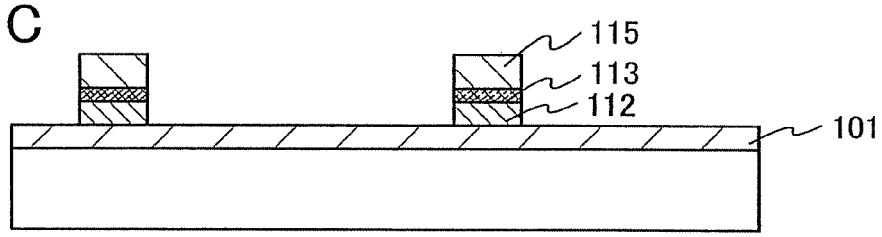
Figure 2C:
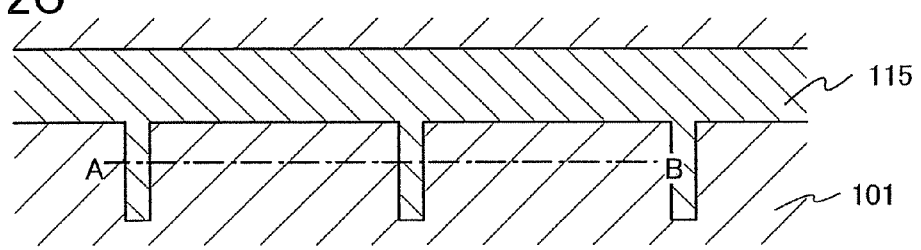

Next, as shown in FIG. 1C, the second layer 102 is etched to form a second layer 112, using the etched light absorbing layer 113 and the etched layer 114 having a light-transmitting property as masks. As a method of etching the second layer 102, dry etching, wet etching, or the like can be used as suitable. Note that at this time, the layer 114 having a light-transmitting property which serves as a mask is also etched slightly. The etched layer having a light-transmitting property is indicated by reference numeral 115. Note that a top view of FIG. 1C is shown in FIG. 2C.

Figure 1D:
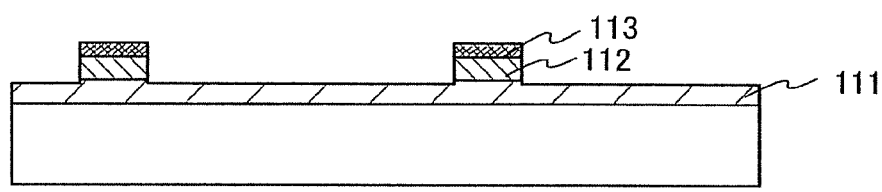

Next, as shown in FIG. 1D, the layer 115 having a light-transmitting property which serves as a mask is removed. As a method of removing the layer 115 having a light-transmitting property, dry etching or wet etching can be used. In this case, when there is a large difference in etching rate between the first layer 101 and the layer 115 having a light-transmitting property; representatively, when the etching rate of the first layer 101 is slower, the film thicknesses of the first layer 101 and the layer 115 having a light-transmitting property may be decided as appropriate.

Figure 2D:
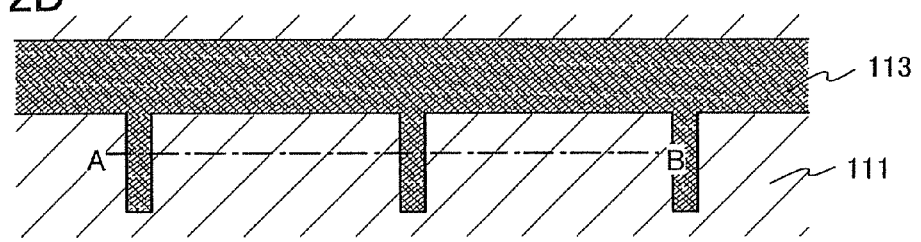

Meanwhile, when the difference in etching rate between the first layer 101 and the layer 115 having a light-transmitting property is small, preferably the film thickness of the first layer 101 is greater than that of the layer 115 having a light-transmitting property. As a result, when the layer 115 having a light-transmitting property is etched, etching of the substrate 100 as well as the first layer 101 can be avoided. At this time, the first layer 101 is also slightly etched. The etched first layer is indicated by reference numeral 111. Note that a top view of FIG. 1D is shown in FIG. 2D.

Through the above-described steps, a stacked layer including the second layer 112 and the light absorbing layer 113 can be formed with a predetermined shape in a predetermined location.

Figure 1E:
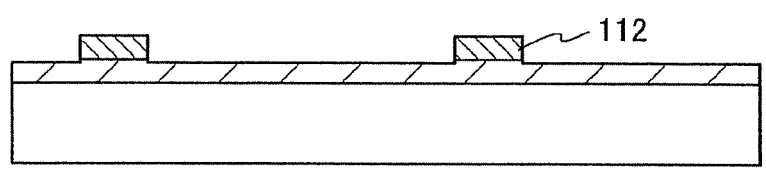
Figure 2E:
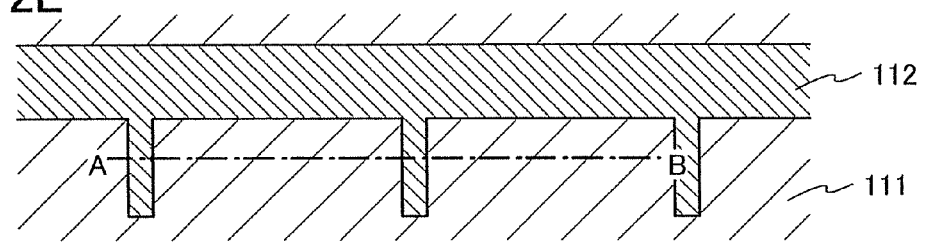

Further, as shown in FIG. 1E, the light absorbing layer 113 may be etched and the second layer 112 may be exposed. Note that a top view of FIG. 1E is shown in FIG. 2E.

Through the above-described steps, a layer with a desired shape can be selectively formed over a substrate without using a photomask or a resist. Further, a semiconductor device can be manufactured at low cost.

Embodiment Mode 2

In this embodiment mode, a process for forming a layer having a desired shape which differs to that in Embodiment Mode 1 will be described with reference to FIGS. 3A to 3E and FIGS. 4A to 4E. In this embodiment mode, the process for removing a light absorbing layer by laser beam differs to that in Embodiment Mode 1.

Figure 3A:
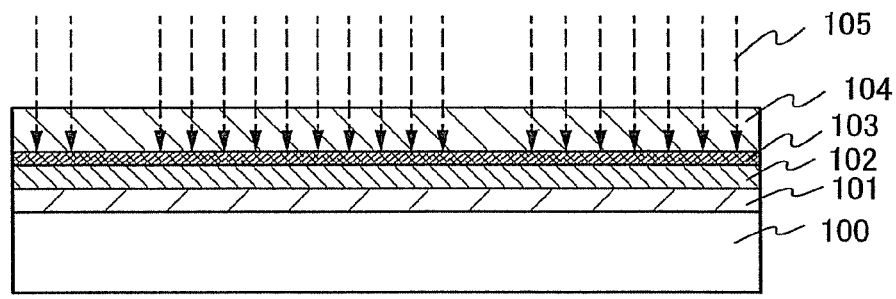
FIGS. 3A to 3E are cross-sections illustrating a method of manufacturing a semiconductor device of the invention.

As shown in FIG. 3A, similarly to in Embodiment Mode 1, the first layer 101 is formed over the substrate 100, the second layer 102 is formed over the first layer 101, the light absorbing layer 103 is formed over the second layer 102, and the layer 104 having a light-transmitting property is formed over the light absorbing layer 103.

In this embodiment mode, preferably the difference in etching rate between the light absorbing layer 103 and the layer 104 having a light-transmitting property is large. Representatively, preferably the etching rate of the light absorbing layer 103 is faster than the etching rate of the layer 104 having a light-transmitting property. Further, preferably the film thickness of the layer 104 having a light-transmitting property is thinner than that of the light absorbing layer 103. As a result, subsequent to irradiating with a laser beam and forming the layer having a light-transmitting property which serves as a mask, the light absorbing layer can be etched.

Figure 4A:
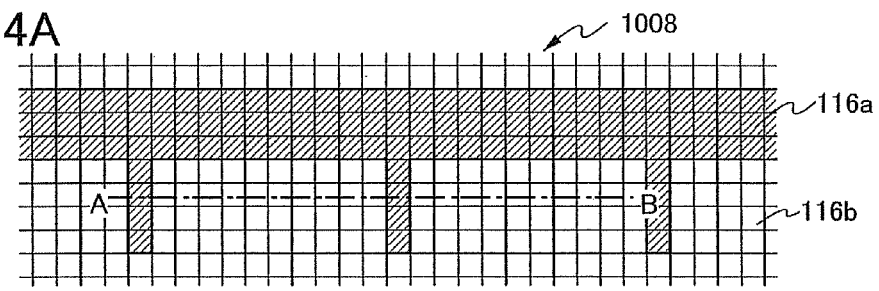
FIGS. 4A to 4E are top views illustrating a method of manufacturing a semiconductor device of the invention.

Next, using the laser irradiation apparatus described in Embodiment Mode 1, the light absorbing layer 103 is irradiated with the laser beam 105 through the layer 104 having a light-transmitting property. Further, FIG. 4A shows a top view of part of the electrooptic element 1008 for irradiating with a laser beam such as the laser beam 105 shown in FIG. 3A. Note that the electrooptic element 1008 shown in FIG. 4A is provided with the laser beam blocking region 116a and the laser beam transmission region 116b.

Figure 3B:
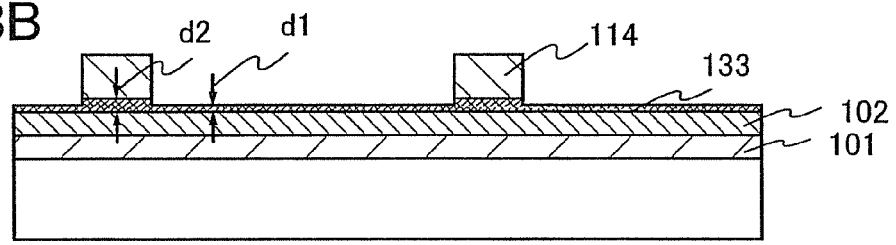

As a result, as shown in FIG. 3B, a part of the layer having a light-transmitting property and a surface of a part of the light absorbing layer which have been irradiated with the laser beam are removed. Here, part of the light absorbing layer 103 in the region which has been irradiated with the laser beam 105 remains. Note that the partially remaining light absorbing layer is indicated by reference numeral 133. That is, in a cross-sectional structure of the light absorbing layer 133, if the film thickness of the region which has been irradiated with the laser beam is d1 and the film thickness of the region which has not been irradiated with the laser beam is d2, then d1<d2 and d1>0.

Figure 4B:
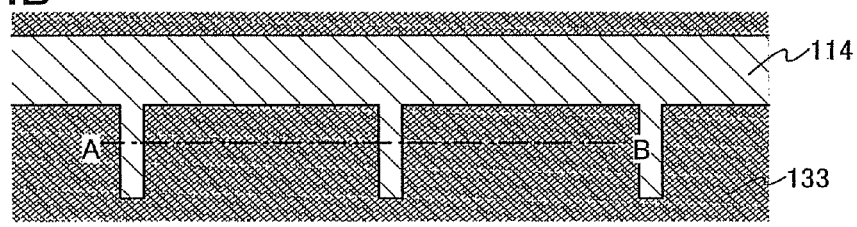

Therefore, this embodiment mode differs from Embodiment Mode 1 in that the second layer 102 is not exposed. As shown in the top view of FIG. 3B which is shown in FIG. 4B, looking at a top surface, the layer 114 having a light-transmitting property and the light absorbing layer 133 are exposed.

Figure 3C:
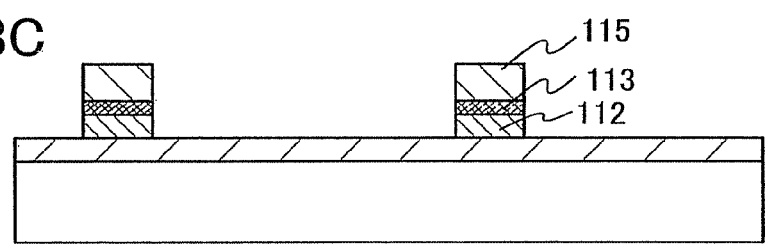
Figure 4C:
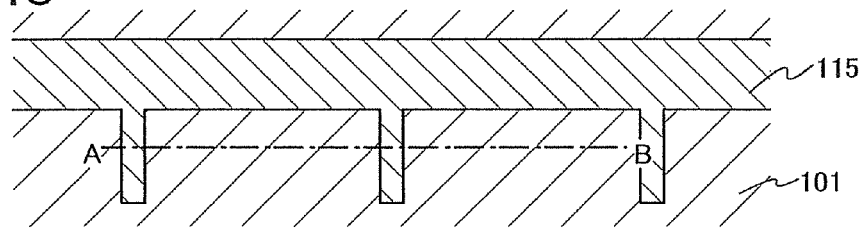

Next, as shown in FIG. 3C, similarly to in Embodiment Mode 1, the light absorbing layer 133 and the second layer 102 are etched, using the layer 114 having a light-transmitting property as a mask. At this time, the layer 114 having a light-transmitting property which serves as a mask is also slightly etched. The etched layer having a light-transmitting property is indicated by reference numeral 115. Note that a top view of FIG. 3C is shown in FIG. 4C. Subsequently, the layer 115 having a light-transmitting property which serves as a mask is removed. At that time, the first layer 101 is also slightly etched. The etched first layer is indicated by reference numeral 111.

Figure 3D:
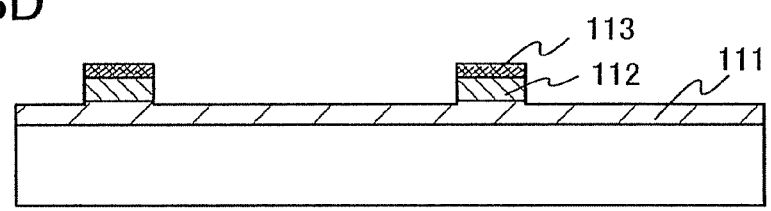
Figure 4D:
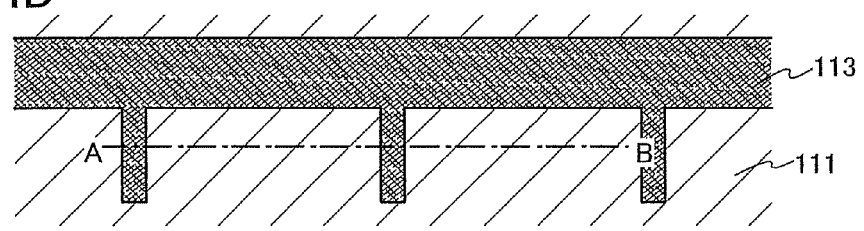

Subsequently, similarly to in Embodiment Mode 1, a stacked layer including the second layer 112 and the light absorbing layer 113 can be formed, as shown in FIG. 3D. Note that a top view of FIG. 3D is shown in FIG. 4D.

Figure 3E:
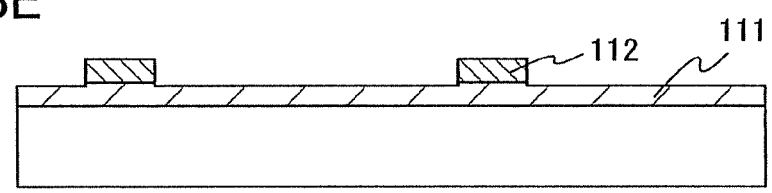
Figure 4E:
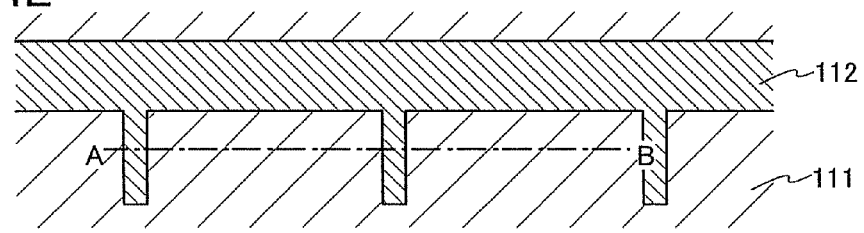

Further, similarly to in Embodiment Mode 1, the light absorbing layer 113 may be etched to expose the second layer 112, as shown in FIG. 3E. Note that a top view of FIG. 3E is shown in FIG. 4E.

Through the above-described steps, a layer with a desired shape can be selectively formed over a substrate without using a photomask or a resist. Further, a semiconductor device can be manufactured at low cost.

Embodiment Mode 3

In this embodiment mode, a process for forming a layer having a desired shape which differs to that in Embodiment Mode 1 will be described with reference to FIGS. 5A to 5E and FIGS. 6A to 6E. In this embodiment mode, the process for removing a light absorbing layer differs to those in Embodiment Modes 1 and 2.

Figure 5A:
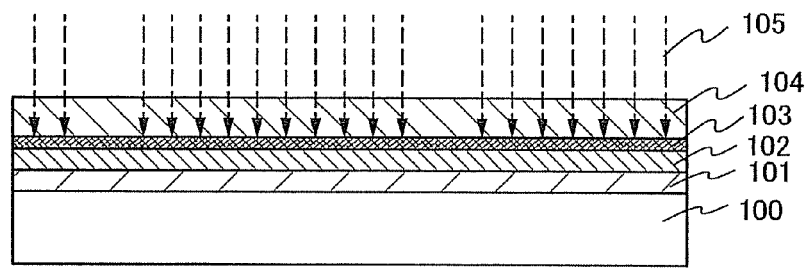
FIGS. 5A to 5E are cross-sections illustrating a method of manufacturing a semiconductor device of the invention.

As shown in FIG. 5A, similarly to in Embodiment Mode 1, the first layer 101 is formed over the substrate 100, the second layer 102 is formed over the first layer 101, the light absorbing layer 103 is formed over the second layer 102, and the layer 104 having a light-transmitting property is formed over the light absorbing layer 103.

In this embodiment mode, preferably the etching rate of the light absorbing layer 103 and the second layer 102 differs substantially to that of the layer 104 having a light-transmitting property. Representatively, preferably the etching rate of the light absorbing layer 103 and the second layer 102 is faster than that of the layer 104 having a light-transmitting property.

Figure 6A:
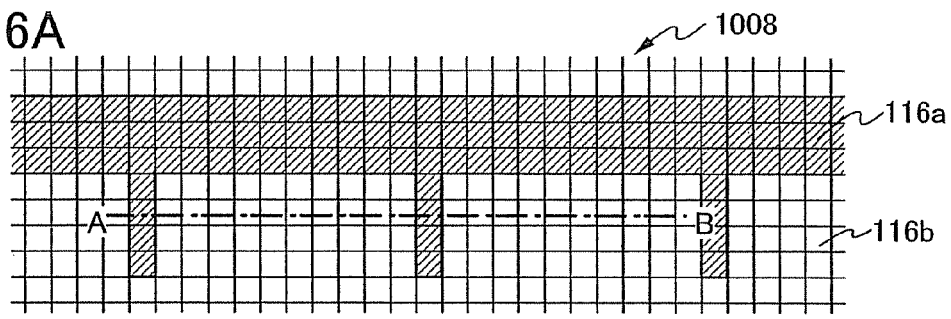
FIGS. 6A to 6E are top views illustrating a method of manufacturing a semiconductor device of the invention.

Next, using the laser irradiation apparatus described in Embodiment Mode 1, the light absorbing layer 103 is irradiated with the laser beam 105 through the layer 104 having a light-transmitting property. Further, FIG. 6A shows a top view of part of the electrooptic element 1008 for irradiating with a laser beam such as the laser beam 105 shown in FIG. 5A. Note that the electrooptic element 1008 shown in FIG. 6A is provided with the laser beam blocking region 116a and the laser beam transmission region 116b.

Figure 5B:
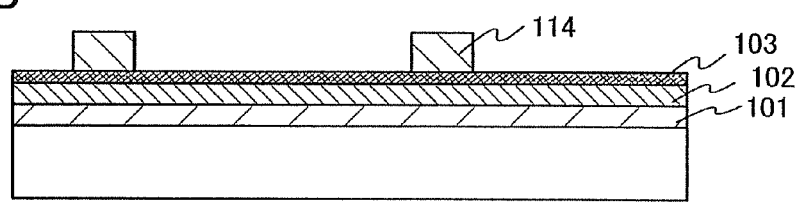

As a result, as shown in FIG. 5B, a part of the layer 104 having a light-transmitting property which has been irradiated with the laser beam 105 is removed. Note that this embodiment mode differs from Embodiment Modes 1 and 2 in that the light absorbing layer 103 in the region which has been irradiated with the laser beam 105 is not removed. This is because due to the release of gas from the surface of the light absorbing layer or heating of the light absorbing layer, the layer having a light-transmitting property physically detaches and scatters.

Figure 6B:
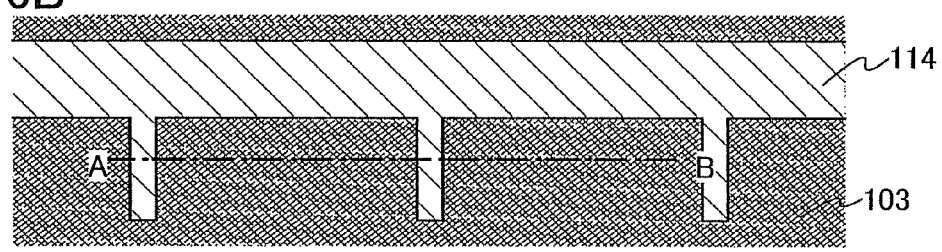

Therefore, this embodiment mode differs from Embodiment Mode 1 in that the second layer 102 is not exposed. As shown in the top view of FIG. 5B which is shown in FIG. 6B, looking at a top surface, the layer 114 having a light-transmitting property and the light absorbing layer 103 are exposed.

Figure 5C:
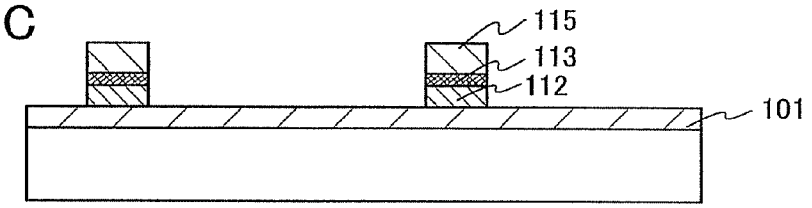
Figure 6C:
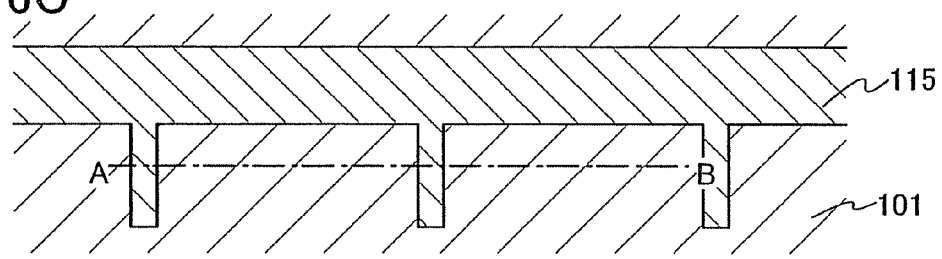

Next, as shown in FIG. 5C, the light absorbing layer 103 and the second layer 102 are etched, using the layer 114 having a light-transmitting property as a mask. At this time, the layer 114 having a light-transmitting property which serves as a mask is also slightly etched. The etched layer having a light-transmitting property is indicated by reference numeral 115. Note that a top view of FIG. 5C is shown in FIG. 6C. Subsequently, the layer 115 having a light-transmitting property which serves as a mask is removed. At that time, the first layer 101 is also slightly etched. The etched first layer is indicated by reference numeral 111.

Figure 5D:
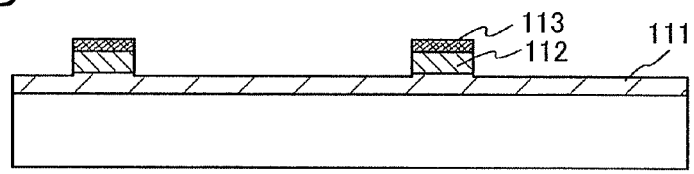
Figure 6D:
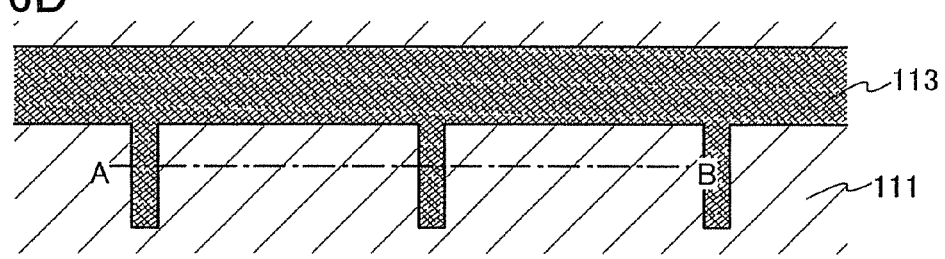

Subsequently, similarly to in Embodiment Mode 1, a stacked layer including the second layer 112 and the light absorbing layer 113 can be formed, as shown in FIG. 5D. Note that a top view of FIG. 5D is shown in FIG. 6D.

Figure 5E:
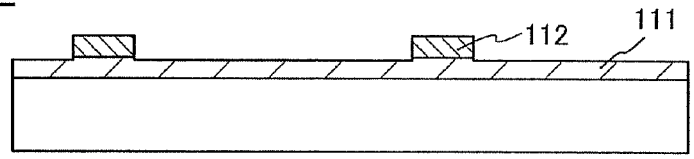
Figure 6E:
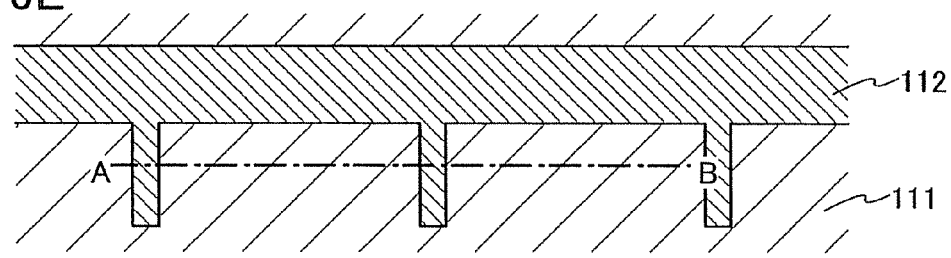

Further, similarly to in Embodiment Mode 1, the light absorbing layer 113 may be etched to expose the second layer 112, as shown in FIG. 5E. Note that a top view of FIG. 5E is shown in FIG. 6E.

Figure 7A:
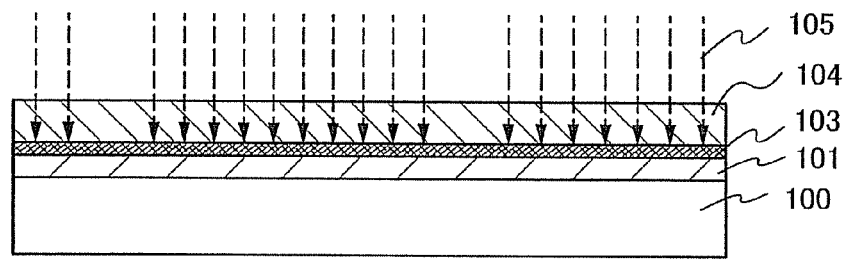
FIGS. 7A to 7D are cross-sections illustrating a method of manufacturing a semiconductor device of the invention.
Figure 7B:
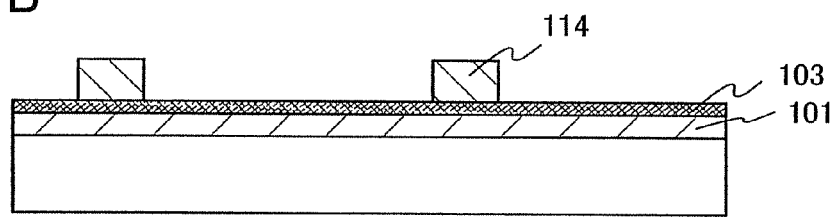
Figure 7C:
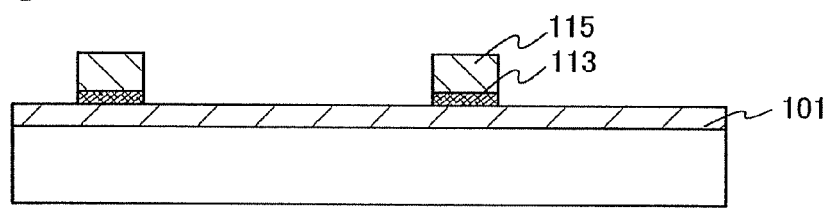
Figure 7D:
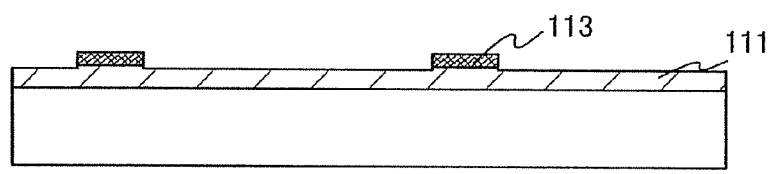

Further, as shown in FIG. 7A, the light absorbing layer 103 may be formed over the first layer 101, the layer 104 having a light-transmitting property may be formed over the light absorbing layer 103, and the above-described process may be performed. In that case, as shown in FIG. 7B, the layer 114 having a light-transmitting property which serves as a mask can be formed over the light absorbing layer 103. Further, as shown in FIG. 7C, the light absorbing layer 103 can be etched using the layer 114 having a light-transmitting property as a mask. That is, a light absorbing layer 113 which is processed into a predetermined shape can be formed. At this time, the layer 114 having a light-transmitting property which serves as a mask is also etched slightly. The etched layer having a light-transmitting property is indicated by reference numeral 115. Further, as shown in FIG. 7D, the layer 115 having a light-transmitting property which serves as a mask may be removed to expose the light absorbing layer 113. At this time, the first layer 101 is also slightly etched. The etched first layer is indicated by reference numeral 111.

Through the above-described steps, a layer with a desired shape can be selectively formed over a substrate without using a photomask or a resist. Further, a semiconductor device can be manufactured at low cost.

Embodiment Mode 4

In this embodiment mode, an etching process which can be applied to any of Embodiment Modes 1 to 3 will be described with reference to FIGS. 8A to 8E. Note that although description is made with reference to Embodiment Mode 1 here, this process can be applied to Embodiment Modes 2 and 3, as appropriate.

Figure 8A:
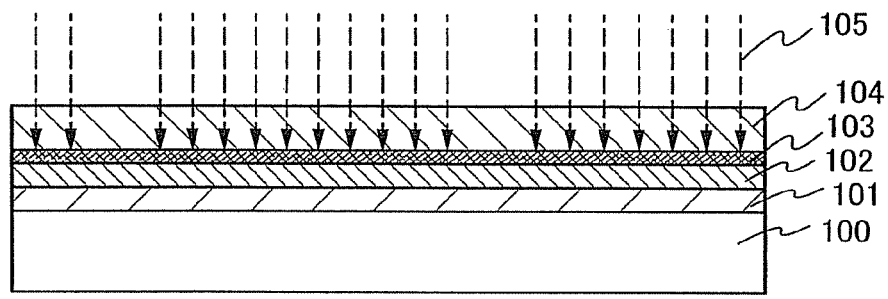
FIGS. 8A to 8E are cross-sections illustrating a method of manufacturing a semiconductor device of the invention.

As shown in FIG. 8A, similarly to in Embodiment Mode 1, the first layer 101 is formed over the substrate 100, the second layer 102 is formed over the first layer 101, the light absorbing layer 103 is formed over the second layer 102, and the layer 104 having a light-transmitting property is formed over the light absorbing layer 103.

Next, the light absorbing layer 103 is irradiated with the laser beam 105 through the layer 104 having a light-transmitting property.

Figure 8B:
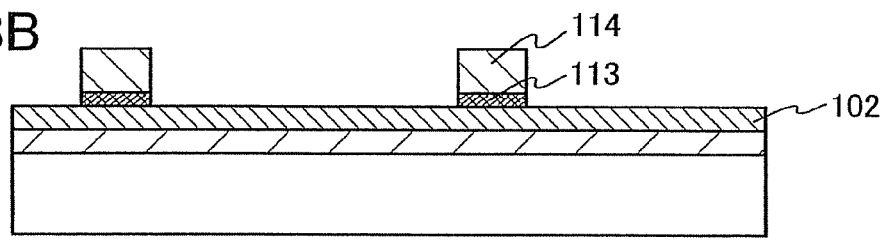

As a result, as shown in FIG. 8B, a part of the layer having a light-transmitting property and a part of the light absorbing layer which have been irradiated with the laser beam 105 are removed, and the light absorbing layer 113 and a layer 114 having a light-transmitting property which serve as a mask can be formed.

Figure 8C:
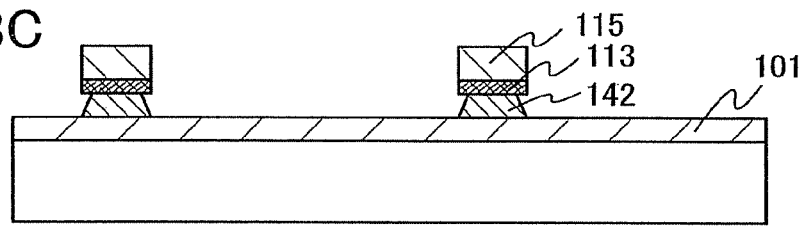

Next, as shown in FIG. 8C, the second layer 102 is etched, using the etched light absorbing layer 113 and the etched layer 114 having a light-transmitting property as a mask. Here, as a method of etching the second layer 102, wet etching is performed. Further, preferably the difference between the etching rate of the light absorbing layer 113 and the second layer 102 is large; representatively, the etching rate of the second layer 102 is faster. The second layer 102 is selectively etched isotropically. As a result, a second layer 142 with an inclined side surface and the light absorbing layer 113 which is over the second layer 142 can be formed. At this time, the layer 114 having a light-transmitting property which serves as a mask is also etched slightly. The etched layer having a light-transmitting property is indicated by reference numeral 115.

Figure 8D:
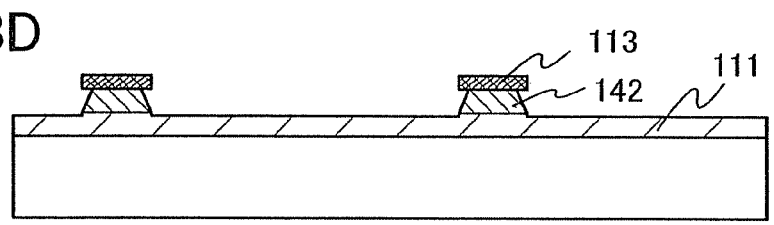

Subsequently, as shown in FIG. 8D, the layer 115 having a light-transmitting property which serves as a mask is removed. At that time, the first layer 101 is also etched slightly. The etched first layer is indicated by reference numeral 111.

Figure 8E:
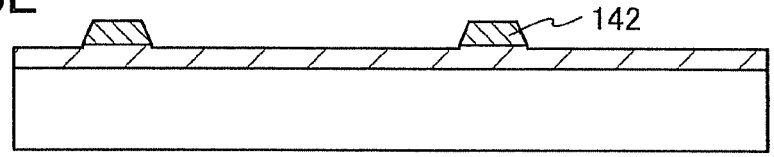

Further, similarly to in Embodiment Mode 1, the light absorbing layer 113 may be etched to form a second layer 142 with a single-layer structure, as shown in FIG. 8E.

Through the above-described steps, a layer with an inclined side surface can be formed. By using such a layer as a semiconductor layer of a top gate thin film transistor or as a gate electrode of a thin film transistor or an inverted staggered thin film transistor, coverage by a gate insulating film which is formed over the semiconductor layer or the gate electrode can be improved. As a result, leakage current in the semiconductor layer and the gate electrode can be reduced and a semiconductor device with high reliability can be manufactured.

Embodiment Mode 5

In this embodiment mode, an etching process which can be applied to Embodiment Mode 2 or 3 will be described with reference to FIGS. 9A to 9E. Note that although description is made with reference to Embodiment Mode 2 here, this process can be applied to Embodiment Mode 3 as appropriate.

Figure 9A:
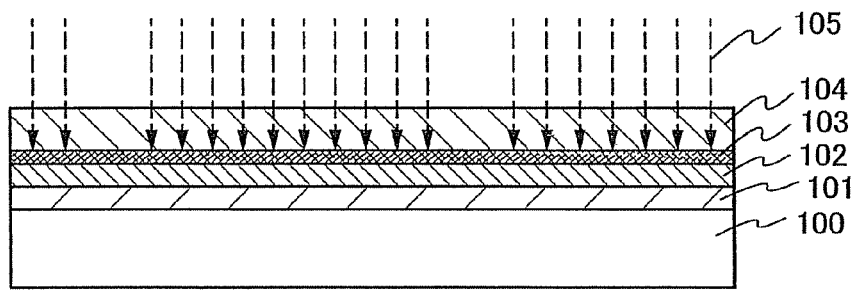
FIGS. 9A to 9E are cross-sections illustrating a method of manufacturing a semiconductor device of the invention.

As shown in FIG. 9A, similarly to in Embodiment Mode 2, the first layer 101 is formed over the substrate 100, the second layer 102 is formed over the first layer 101, the light absorbing layer 103 is formed over the second layer 102, and the layer 104 having a light-transmitting property is formed over the light absorbing layer 103.

Next, the light absorbing layer 103 is irradiated with the laser beam 105 through the layer 104 having a light-transmitting property.

Figure 9B:
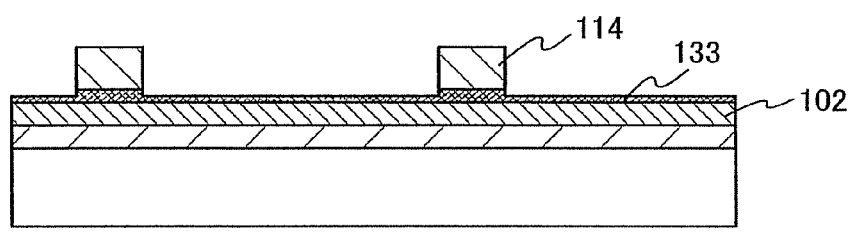

As a result, as shown in FIG. 9B, a part of the layer 104 having a light-transmitting property and a surface of a part of the light absorbing layer 103 which have been irradiated with the laser beam 105 are removed. Here, part of the light absorbing layer 103 in the region which has been irradiated by the laser beam 105 remains. Note that the partially remaining light absorbing layer is indicated by reference numeral 133. That is, in a cross-sectional structure of the light absorbing layer 133, if the film thickness of the region which has been irradiated with the laser beam is d1 and the film thickness of the region which has not been irradiated with the laser beam is d2, then d1<d2 and d1>0.

Figure 9C:
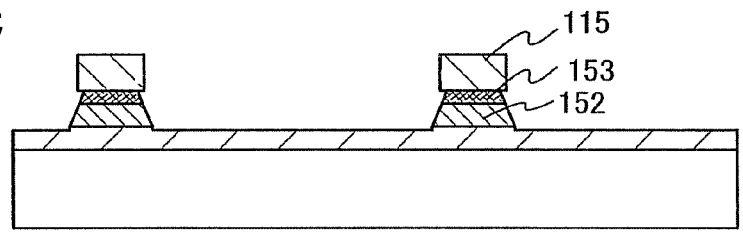

Next, the light absorbing layer 133 and the second layer 102 are wet-etched using the layer 114 having a light-transmitting property as a mask, as shown in FIG. 9C. Here, since the second layer 102 and the light absorbing layer 133 are wet-etched, they are isotropically etched. As a result, a second layer 152 with an inclined side surface and a light absorbing layer 153 with an inclined side surface which is over the second layer 152 are formed. At this time, the layer 114 having a light-transmitting property which serves as a mask is also etched slightly. The etched layer having a light-transmitting property is indicated by reference numeral 115.

Figure 9D:
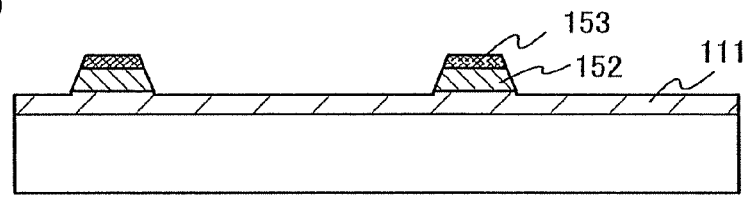

Subsequently, as shown in FIG. 9D, the layer 115 having a light-transmitting property which serves as a mask is removed. At that time, the first layer 101 is also etched slightly. The etched first layer is indicated by reference numeral 111.

Figure 9E:
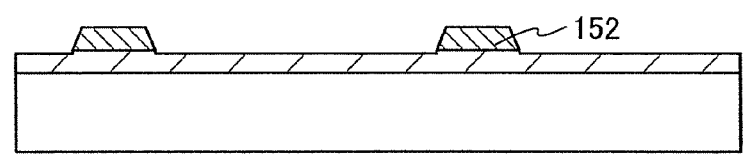

Further, similarly to in Embodiment Mode 1, the light absorbing layer 153 may be etched to form a second layer 152 with a single-layer structure, as shown in FIG. 9E.

Through the above-described steps, a layer with an inclined side surface can be formed. By using such a layer as a semiconductor layer of a top gate thin film transistor or as a gate electrode of a thin film transistor or an inverted staggered thin film transistor, coverage by a gate insulating film which is formed over the semiconductor layer or the gate electrode can be improved. As a result, leakage current in the semiconductor layer and the gate electrode can be reduced and a semiconductor device with high reliability can be manufactured.

Embodiment Mode 6

In this embodiment mode, a method of manufacturing a semiconductor element which employs Embodiment Mode 1 will be described with reference to FIGS. 10A to 10F and FIGS. 11A to 11E. Note that although this embodiment mode is described with reference to Embodiment Mode 1, any one of Embodiment Modes 2 to 5 can also be employed.

Here, description is made using an inverted staggered thin film transistor as a semiconductor element. Note that the semiconductor element is not limited to an inverted staggered thin film transistor, and a semiconductor element such as a staggered thin film transistor, a coplanar thin film transistor, a top gate thin film transistor, a diode, a MOS transistor, or the like can also be manufactured.

Figure 10A:
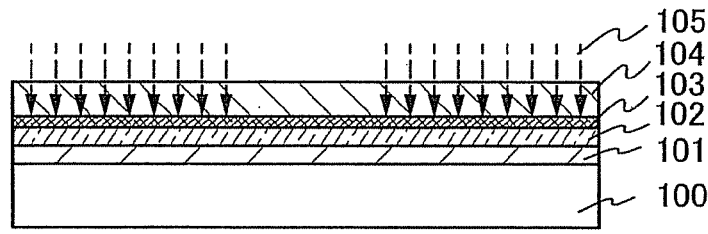
FIGS. 10A to 10F are cross-sections illustrating a method of manufacturing a semiconductor device of the invention.

As shown in FIG. 10A, over the substrate 100, the first layer 101 which serves as a base film, the second layer 102 which is subsequently used to form a gate electrode, the light absorbing layer 103, and the layer 104 having a light-transmitting property are formed.

Here, a glass substrate is used as the substrate 100. As the first layer 101, a silicon oxynitride layer with a thickness of 50 to 200 nm is formed using a plasma CVD method. As the second layer 102, a tungsten layer with a thickness of 100 to 500 nm is formed using a sputtering method. As the light absorbing layer 103, a chromium layer with a thickness of 5 to 50 nm, preferably 10 to 40 nm, is formed using a sputtering method. As the layer 104 having a light-transmitting property, a silicon nitride layer with a thickness of 50 to 400 nm is formed by a plasma CVD method.

Next, the laser irradiation apparatus described in Embodiment Mode 1 is used to irradiate the layer 104 having a light-transmitting property and the light absorbing layer 103 with the laser beam 105. Here, a fourth harmonic of a YAG laser (wavelength: 266 nm) is used as the laser beam 105. Irradiation conditions for the laser beam are as follows: output is 2 W, frequency is 15 kHz, pulse width is 10 nanoseconds, and the maximum energy of one pulse is 130 µJ.

Figure 10B:
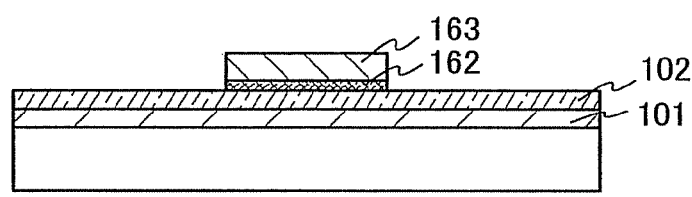

When the light absorbing layer 103 is irradiated with the laser beam 105, a part of the light absorbing layer 103 and a part of the layer 104 having a light-transmitting property are removed, and a light absorbing layer 162 and a layer 163 having a light-transmitting property which serve as a mask are formed, as shown in FIG. 10B.

Figure 10C:
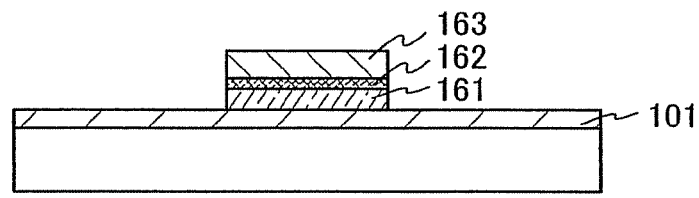

Next, using the light absorbing layer 162 and the layer 163 having a light-transmitting property which serve as a mask, the second layer 102 is etched to form a second layer 161, as shown in FIG. 10C. Here, the second layer 102 is etched using dry etching.

Figure 10D:
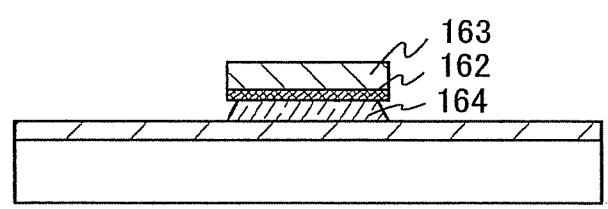
Figure 10E:
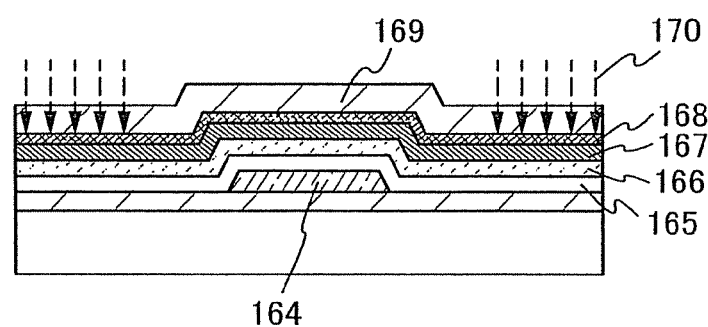

Next, using the light absorbing layer 162 and the layer 163 having a light-transmitting property as a mask, the second layer 161 is wet-etched to form a second layer 164 with an inclined side surface, as shown in FIG. 10D. Here, preferably wet etching is performed, using an etchant which selectively etches the second layer 161. Subsequently, the light absorbing layer 162 and the layer 163 having a light-transmitting property which serve as a mask are removed.

Next, as shown in FIG. 10 E, an insulating layer 165 which serves as a gate insulating film is formed over the second layer 164 which serves as a gate electrode, a semiconductor layer 166 is formed over the insulating layer 165, a semiconductor layer 167 having a conductive property is formed over the semiconductor layer 166, a light absorbing layer 168 is formed over the semiconductor layer 167 having a conductive property, and a layer 169 having a light-transmitting property is formed over the light absorbing layer 168.

As the semiconductor layer 166, a film which has any one of the following states can be used: an amorphous semiconductor, a semi-amorphous semiconductor in which an amorphous state and a crystalline state are mixed (also referred to as an SAS), a microcrystalline semiconductor in which crystal grains of 0.5 to 20 nm can be observed in an amorphous semiconductor, and a crystalline semiconductor.

The semiconductor layer 167 having a conductive property is a semiconductor layer which contains an acceptor element or a donor element, such as phosphorus, arsenic, boron, or the like.

Here, as the insulating layer 165 which serves as a gate insulating film, a silicon oxynitride layer with a thickness of 10 to 50 nm is formed using a plasma CVD method. As the semiconductor layer 166, an amorphous silicon layer with a thickness of 50 to 150 nm is formed using a plasma CVD method. As the semiconductor layer 167 having a conductive property, an amorphous silicon layer doped with phosphorus with a thickness of 50 to 150 nm is formed using a plasma CVD method. As the light absorbing layer 168, a chromium layer with a thickness of 5 to 50 nm, preferably 10 to 40 nm, is formed using a sputtering method. As the layer 169 having a light-transmitting property, a silicon nitride layer with a thickness of 50 to 400 nm is formed by a plasma CVD method.

Figure 10F:
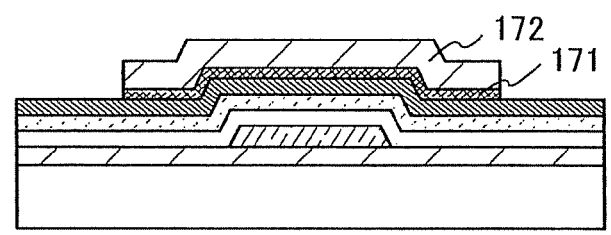

Next, the layer 169 having a light-transmitting property and the light absorbing layer 168 are irradiated with a laser beam 170 using the laser irradiation apparatus described in Embodiment Mode 1. As a result, a layer 172 having a light-transmitting property and a light absorbing layer 171 which serve as a mask are formed, as shown in FIG. 10F.

Figure 11A:
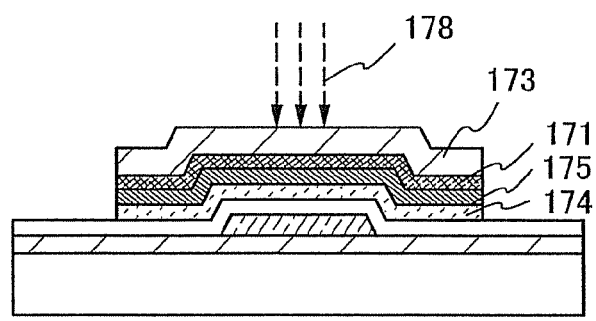
FIGS. 11A to 11E are cross-sections illustrating a method of manufacturing a semiconductor device of the invention.
Figure 11B:
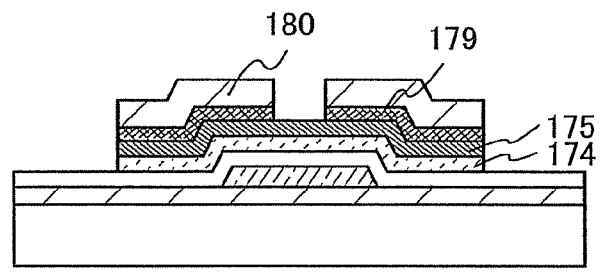

Next, using the layer 172 having a light-transmitting property and the light absorbing layer 171 as a mask, the semiconductor layer 167 having a conductive property and the semiconductor layer 166 are etched. Here, dry etching is used to etch the semiconductor layer 167 having a conductive property and the semiconductor layer 166. As a result, an etched semiconductor layer 174 and an etched semiconductor layer 175 having a conductive property can be formed, as shown in FIG. 11A. The layer 172 having a light-transmitting property which serves as a mask is also etched slightly at this time. The etched layer having a light-transmitting property is indicated by reference numeral 173. Note that the semiconductor layer 174 and the semiconductor layer 175 having a conductive property may also be formed using a photolithography process.

Next, using the laser irradiation apparatus described in Embodiment Mode 1, the layer 173 having a light-transmitting property and the light absorbing layer 171 are irradiated with a laser beam 178, and a part of the layer 173 having a light-transmitting property and a part of light absorbing layer 171 are removed. As a result, a light absorbing layer 179 and a layer 180 having a light-transmitting property which serve as a mask, such as those shown in FIG. 11B, can be formed.

Figure 11C:
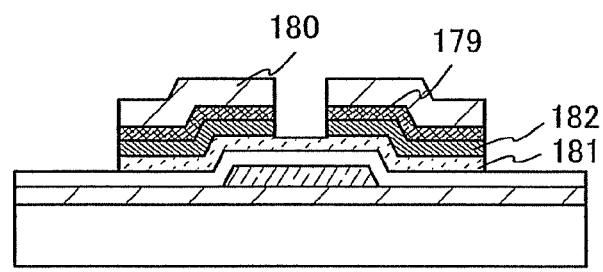

Next, using the light absorbing layer 179 and the layer 180 having a light-transmitting property as a mask, the semiconductor layer 174 and the semiconductor layer 175 having a conductive property are etched. As a result, the semiconductor layer 175 having a conductive property is divided into parts, and a semiconductor layer 182 having a conductive property which serves as a contact layer can be formed, as shown in FIG. 11C. The semiconductor layer 174 is also etched slightly at this time. The semiconductor layer whose channel portion is slightly etched is referred to as a semiconductor layer 181. Note that the semiconductor layer 181 serves as a channel region. Note also that the semiconductor layer 181 and the semiconductor layer 182 having a conductive property may also be formed using a photolithography process.

Figure 11D:
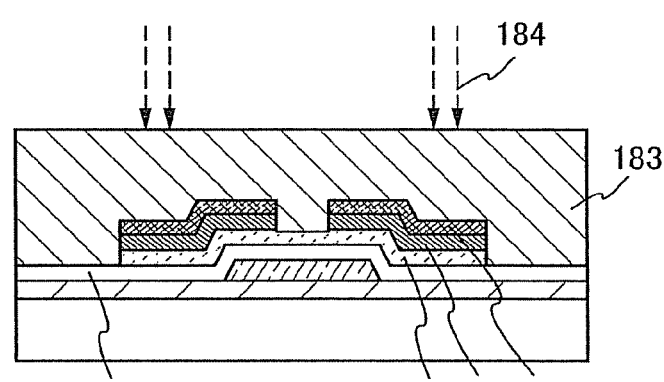

Next, after removing the layer 180 having a light-transmitting property, over the insulating layer 165 which serves as a gate insulating film, the semiconductor layer 182 having a conductive property which serves as a contact layer, the semiconductor layer 181 which serves as a channel region, and the light absorbing layer 179, an insulating layer 183 is formed, as shown in FIG. 11D.

Here, the insulating layer 183 is formed of a polyimide, by applying and baking a composition. Note that the layer 180 having a light-transmitting property is not necessarily removed.

Figure 11E:
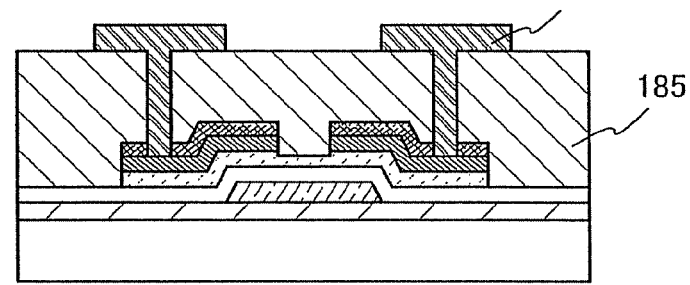

Next, using the laser irradiation apparatus described in Embodiment Mode 1, the insulating layer 183 and the light absorbing layer 179 are irradiated with a laser beam 184. As a result, a part of the insulating layer 183 and a part of the light absorbing layer 179 are removed and an opening is formed, as shown in FIG. 11E. In the opening, any one or more of the light absorbing layer 179, the semiconductor layer 182 having a conductive property, and the semiconductor layer 181 are exposed. Note that the opening formed in the insulating layer 183 may also be formed using a photolithography process.

Next, a wiring 186 is formed in the opening. Regarding a method for forming the wiring 186, it can be formed using the same materials as those which can be used to form the second layer 164 which serves as a gate electrode. Further, a droplet discharging method in which droplets of a prepared composition are discharged from a fine opening to form a layer with a predetermined shape may be used to form the wiring 186. Further, a printing method may be used to form the wiring 186. Alternatively, the wiring 186 may be formed by forming a conductive layer over the substrate by a CVD method, a PVD method, an application method, or the like, then selectively etching the conductive layer using a photolithography process. Here, a wiring which includes silver as a main constituent is formed using a droplet discharging method.

Through the above-described process steps, a thin film transistor can be formed.

Embodiment Mode 7

This embodiment mode differs to Embodiment Mode 6 in that a thin film transistor has a structure in which a wiring is contact with the thin film transistor without an interlayer insulating film being therebetween. This embodiment mode will be described with reference to FIGS. 12A to 12E.

Figure 12A:
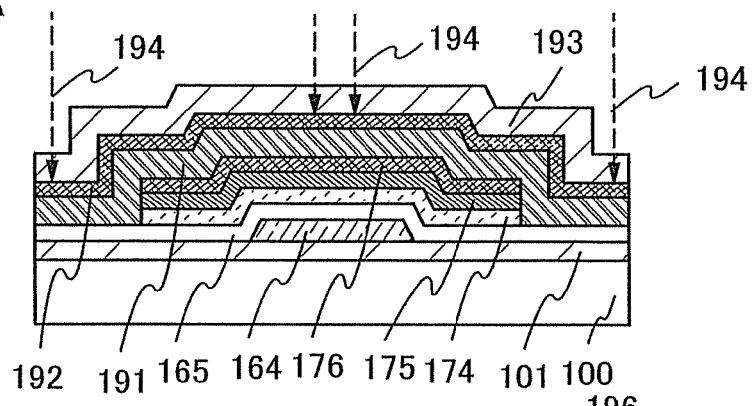
FIGS. 12A to 12E are cross-sections illustrating a method of manufacturing a semiconductor device of the invention.

Using similar process steps as in Embodiment Mode 6, the first layer 101, the second layer 164 which serves as a gate electrode, the insulating layer 165 which serves as a gate insulating film, the semiconductor layer 174, the semiconductor layer 175 having a conductive property, and a light absorbing layer 176 are formed over the substrate 100, as shown in FIG. 12A.

Next, a conductive layer 191, a light absorbing layer 192, and a layer 193 having a light-transmitting property are formed over the semiconductor layer 174, the semiconductor layer 175 having a conductive property, and the light absorbing layer 176. Here, as the conductive layer 191, an aluminum layer with a thickness of 500 to 1000 nm is fainted by a sputtering method. As the light absorbing layer 192, a chromium layer with a thickness of 5 to 50 nm, preferably 10 to 40 nm, is formed. As the layer 193 having a light-transmitting property, a silicon nitride layer with a thickness of 50 to 400 nm is formed by a plasma CVD method. Note that it is not always necessary to provide the light absorbing layer 192; it may be provided only when it is difficult to remove the conductive layer 191 by laser beam irradiation. By providing the light absorbing layer 192, formation of a layer 196 having a light-transmitting property which serves as a mask can be facilitated.

Figure 12B:
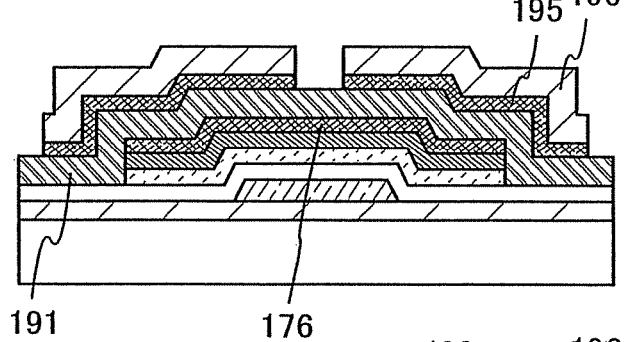

Next, using the laser irradiation apparatus described in Embodiment Mode 1, the light absorbing layer 192 and the layer 193 having a light-transmitting property are irradiated with a laser beam 194, and part of the light absorbing layer 192 and a part of the layer 193 having a light-transmitting property are removed. Thereby, a light absorbing layer 195 and the layer 196 having a light-transmitting property which serve as a mask are formed, as shown in FIG. 12B.

Figure 12C:
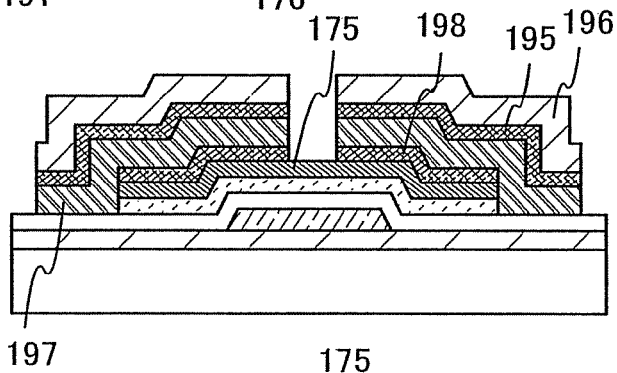

Next, using the light absorbing layer 195 and the layer 196 having a light-transmitting property as a mask, the conductive layer 191 and the light absorbing layer 176 are etched. Here, the conductive layer 191 and the light absorbing layer 176 are etched using dry etching. As a result, a wiring 197 and a light absorbing layer 198 such as those shown in FIG. 12C are formed.

Figure 12D:
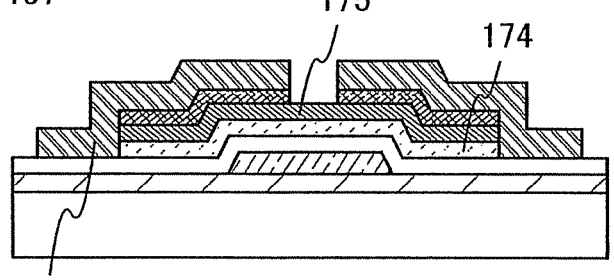
Figure 12E:
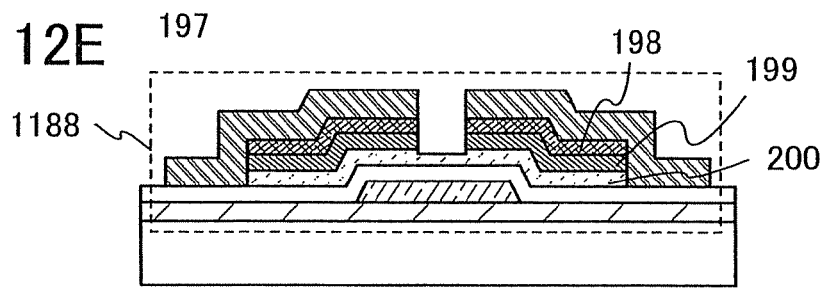

Next, as shown in FIG. 12D, the layer 196 having a light-transmitting property which serves as a mask is removed. Alternatively, the layer 196 having a light-transmitting property and the light absorbing layer 195 which serve as a mask are removed. Here, the layer 196 having a light-transmitting property and the light absorbing layer 195 which serve as a mask are removed. Note that the wiring 197 may also be formed using a photolithography process.

Next, using the wiring 197 as a mask, the semiconductor layer 175 having a conductive property and the semiconductor layer 174 are etched. As a result, a semiconductor layer 199 having a conductive property which serves as a contact layer and a semiconductor layer 200 which serves as a channel region, such as those shown in FIG. 12E, can be formed.

Through the above-described process steps, a thin film transistor 1188 can be formed.

Embodiment 1

In this embodiment, as a semiconductor device, a liquid crystal display panel is formed. Further, FIGS. 16A to 16D show cross-sections of a pixel of the liquid crystal display panel, which will be described below.

Figure 16A:
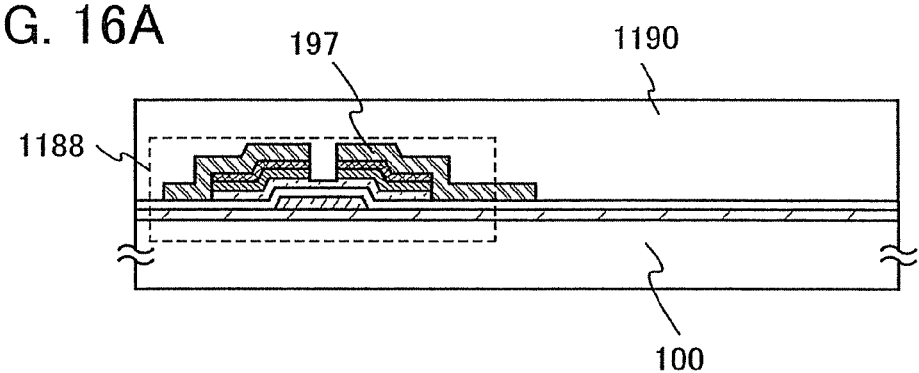
FIGS. 16A to 16D are cross-sections illustrating a method of manufacturing a semiconductor device of the invention.

As shown in FIG. 16A, the thin film transistor 1188 described in Embodiment Mode 7 and an insulating layer 1190 which covers the thin film transistor 1188 are formed over the substrate 100. Here, an insulating layer 1190 formed of a polyimide is formed by applying a composition by an application method and performing baking. Note that here, the thin film transistor described in Embodiment Mode 7 is employed as the thin film transistor 1188; however, the thin film transistor described in Embodiment Mode 6, a coplanar thin film transistor, or a top gate thin film transistor can also be used as suitable.

Next, by irradiating the wiring 197 with a laser beam, an opening is provided in a part of the insulating layer 1190, to form an insulating layer 1191 having an opening. In a case where an oxide is formed on a surface of the wiring 197 by the laser beam irradiation, the oxide formed on the surface of the wiring 197 may subsequently be removed.

Figure 16B:
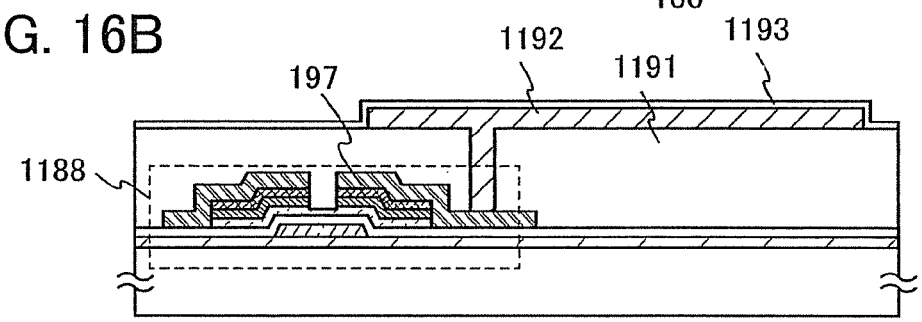

Next, as shown in FIG. 16B, a conductive layer 1192 which is connected to the wiring 197 is formed over the opening and a surface of the insulating layer 1191. Note that the conductive layer 1192 serves as a pixel electrode. Here, the conductive layer 1192 is formed using ITO by a method described in Embodiment Mode 1. When a conductive layer 1192 having a light-transmitting property is formed as a pixel electrode, subsequently a transmissive liquid crystal display panel can be manufactured. Further, when a conductive layer having a reflective property is formed as the conductive layer 1192, using Ag (silver), Au (gold), Cu (copper), W (tungsten), Al (aluminum), or the like, subsequently a reflective liquid crystal display panel can be manufactured. Further, when the above-mentioned conductive layer having a light-transmitting property and the conductive layer having a reflective property are formed in each pixel, a semi-transmissive liquid crystal display panel can be manufactured.

Note that as shown in FIG. 16B, an opening can be formed so that the wiring 197 and the conductive layer 1192 are in contact with each other at a surface of the wiring 197.

Figure 16C:
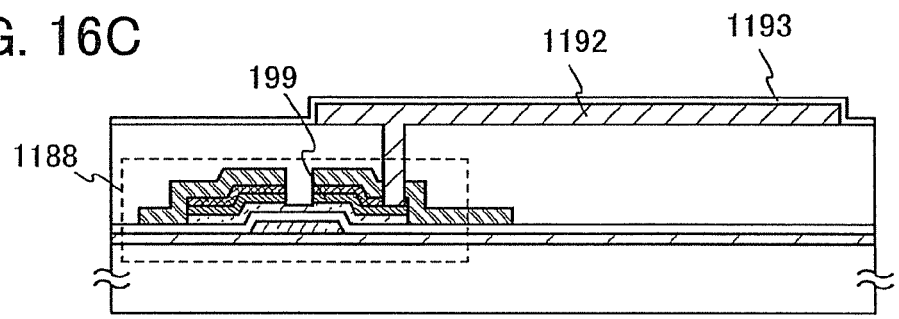
Figure 16D:
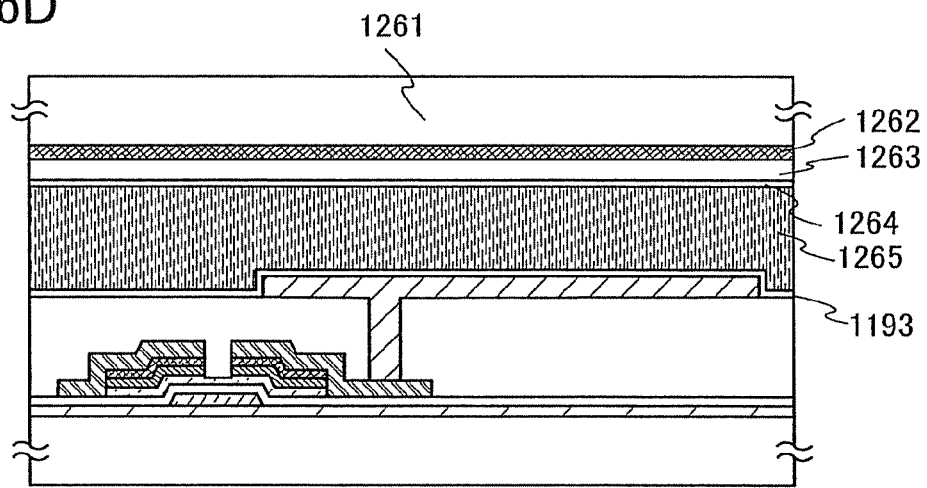

Further, as shown in FIG. 16C, an opening can be formed so that the semiconductor layer 199 having a conductive property and the conductive layer 1192 are in contact with each other at a surface of the semiconductor layer 199 having a conductive property.

In accordance with the above steps, an active matrix substrate can be formed.

Next, an insulating film is formed by a printing method or a spin coating method and rubbing is performed to form an oriented film 1193. Note that the oriented film 1193 can also be formed by an oblique deposition method.

Next, a sealant (not illustrated) having a closed-loop shape is formed by a droplet discharging method in the peripheral region of a pixel portion of a counter substrate 1261 provided with an oriented film 1264, a counter electrode 1263, and a colored layer 1262. A filler may be mixed in with the sealant. Further, the counter substrate 1261 may be provided with a color filter, a shielding film (e.g., a black matrix), or the like.

Next, a liquid crystal material is delivered dropwise by a dispensing method (a dropping method) to the inside of the closed-loop formed by the sealant. Subsequently, the counter substrate and the active matrix substrate are attached in a vacuum, and a liquid crystal layer 1265 filled with the liquid crystal material is formed by performing ultraviolet curing. Note that as a method of forming the liquid crystal layer 1265, instead of a dispensing method (a dropping method), a dipping method in which subsequent to attaching the counter substrate to the substrate the liquid crystal material is injected by employing capillarity can be used.

Subsequently, a wiring board, representatively an FPC, is attached to connecting terminal portions of a scanning line and a signal line, with a connecting conductive layer interposed therebetween. In accordance with the above steps, the liquid crystal display panel can be formed.

Note that in this embodiment, a TN mode liquid crystal display panel is described; however, the above-described process can similarly be applied to a liquid crystal display panel which employs a different method. For example, this embodiment can be applied to a liquid crystal display panel which employs a horizontal electric field method in which an electric field is applied parallel to a glass substrate to orient liquid crystals. Further, this embodiment can be applied to a VA (vertical alignment) mode liquid crystal display panel.

Figure 17:
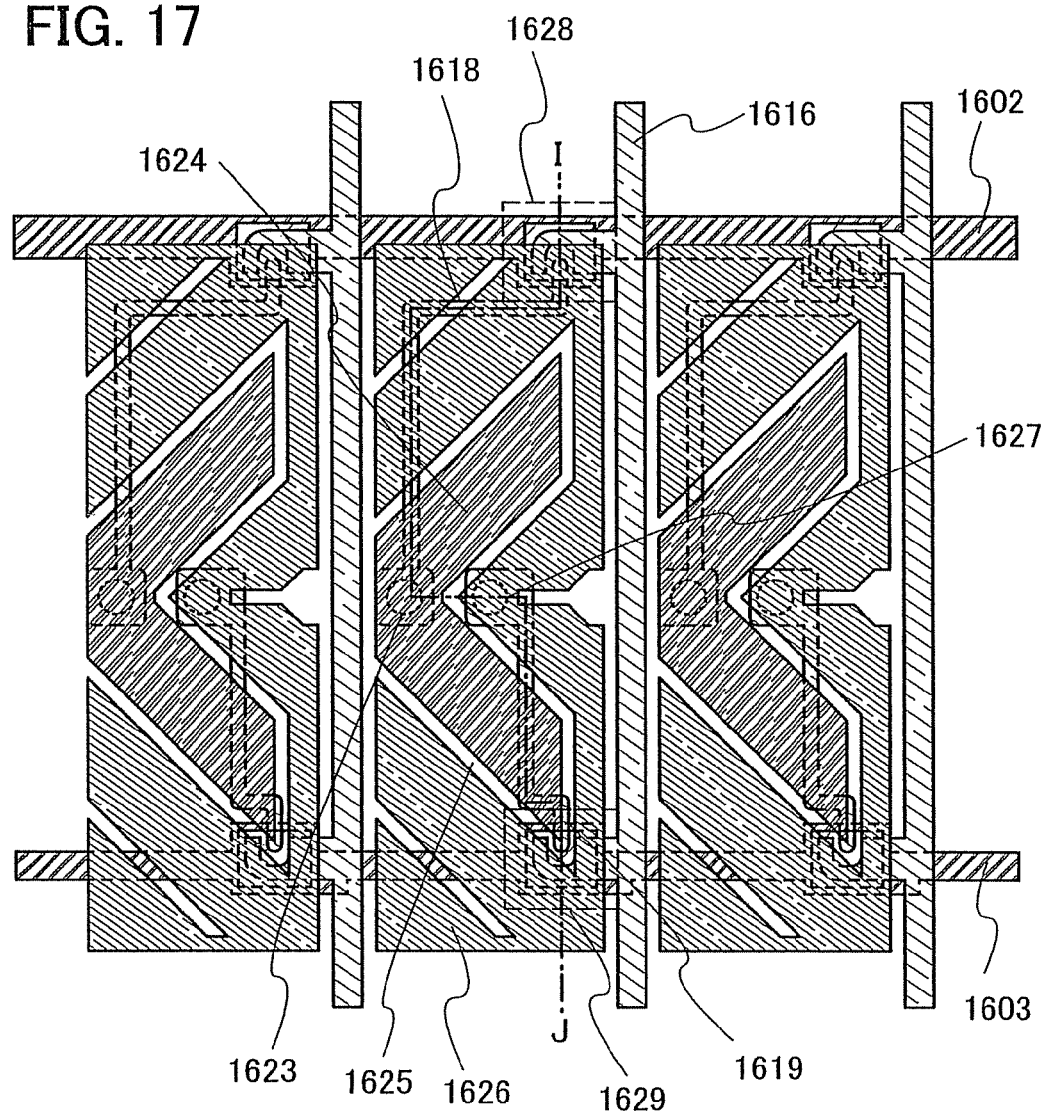
FIG. 17 is a top view illustrating a method of manufacturing a semiconductor device of the invention.
Figure 18:
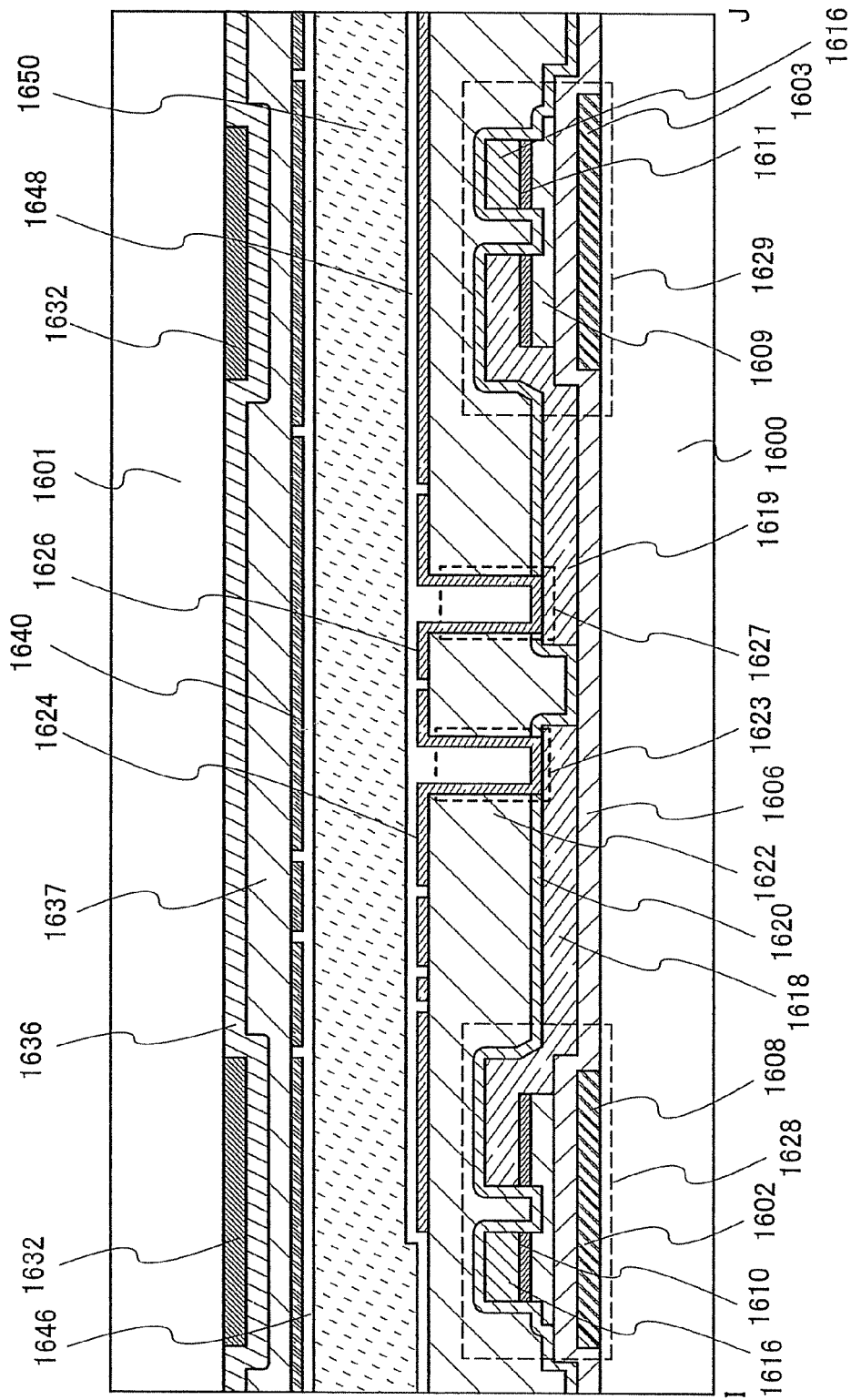
FIG. 18 is a cross-section illustrating a method of manufacturing a semiconductor device of the invention.

FIGS. 17 and 18 show a pixel configuration of a VA mode liquid crystal display panel. FIG. 17 is a plan view and FIG. 18 shows a cross-sectional structure which corresponds to the cutting-plane line I-J in FIG. 17. Description will be made below with reference to both these drawings.

In the pixel configuration, there are a plurality of pixel electrodes in one pixel, and a TFT is connected to each pixel electrode. The TFTs are formed such that they are each driven by a different gate signal. That is, a multi-domain pixel has a structure in which the signals applied to each pixel electrode are controlled separately.

A pixel electrode 1624 is connected with a TFT 1628 by a wiring 1618 via an opening (a contact hole) 1623. Further, a pixel electrode 1626 is connected with a TFT 1629 by a wiring 1619 via an opening (a contact hole) 1627. A gate wiring 1602 of the TFT 1628 is separate from a gate electrode 1603 of the TFT 1629 so that different gate signals can be applied to each of them. Meanwhile, a wiring 1616 which serves as a data line is shared by the TFT 1628 and the TFT 1629.

The pixel electrode 1624 and the pixel electrode 1626 can be manufactured in a similar manner to that described in the previous embodiment modes.

Figure 19:
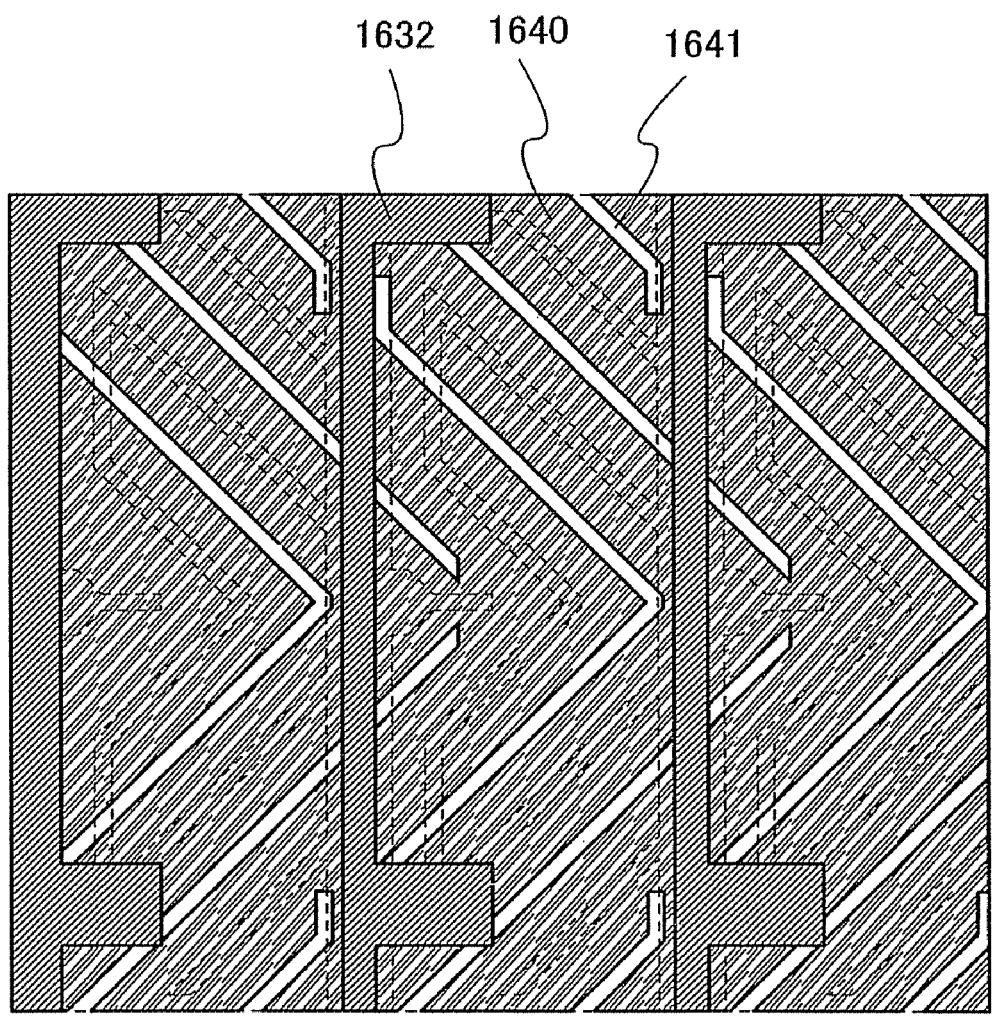
FIG. 19 is a top view illustrating a method of manufacturing a semiconductor device of the invention.

The pixel electrode 1624 has a different shape to that of the pixel electrode 1626, and is separated from the pixel electrode 1626 by a slit 1625. The pixel electrode 1626 is formed such that it surrounds an outer side of the pixel electrode 1624, which spreads out in a V-shape. Orientation of liquid crystals is controlled by using the TFT 1628 and the TFT 1629 to make the timing of voltages applied to the pixel electrode 1624 and the pixel electrode 1626 different. A light blocking layer 1632, a colored layer 1636, and a counter electrode 1640 are formed over a counter substrate 1601. Further, a planarizing film 1637 is formed between the colored layer 1636 and the counter electrode 1640 so that disorder in the orientation of the liquid crystals is prevented. FIG. 19 shows a structure of the counter substrate side. The counter electrode 1640 is shared by different pixels, and is provided with a slit 1641. By disposing the slit 1641 and the slit 1625, which is on the pixel electrode 1624 and the pixel electrode 1626 side, such that they alternately mesh, an oblique electric field can be efficiently generated and the orientation of the liquid crystals can be controlled. Accordingly, the direction in which the liquid crystals are oriented is varied according to the place; therefore, the viewing angle can be widened.

This embodiment can be freely combined with any of the previous embodiment modes as appropriate.

Note that a protective circuit for preventing electrostatic breakdown, representatively, a diode or the like, may be provided between a connecting terminal and a source wiring (or gate wiring), or in the pixel portion. In such a case, the protective circuit is manufactured in accordance with the same steps as the above-described TFT. Electrostatic discharge can be prevented by connecting a gate wiring layer of the pixel portion with a drain or source wiring layer of a diode.

According to the invention, a component included in a liquid crystal display panel, such as a wiring or the like, can be formed with a desired shape. Further, since a liquid crystal display panel can be manufactured by a simplified process without using a complex photolithography process, loss of materials is reduced and reduction in cost can also be achieved. Therefore, high-performance liquid crystal display panels with high reliability can be manufactured with a good yield.

Embodiment Mode 2

In this embodiment, as a semiconductor device, a light-emitting display panel will be described, and a method of manufacturing the light-emitting display panel will be described. FIGS. 20A to 20D show a pixel of a light-emitting display panel which will be described below.

Figure 20A:
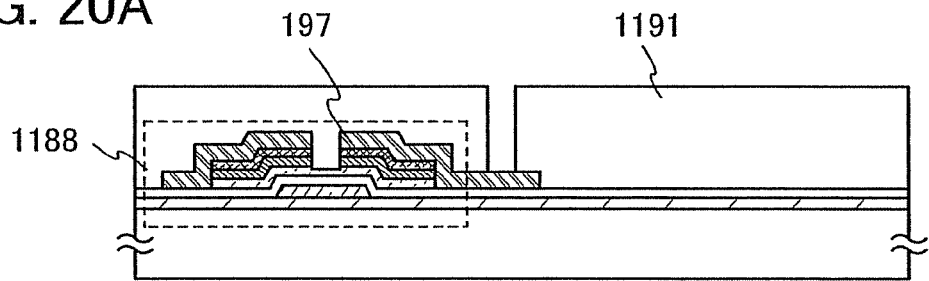
FIGS. 20A to 20D are cross-sections illustrating a method of manufacturing a semiconductor device of the invention.

Similarly to in Embodiment 1, over the substrate 100, the thin film transistor 1188 described in Embodiment Mode 7 and the insulating layer 1191 which covers the thin film transistor 1188 and has an opening are formed, as shown in FIG. 20A.

Figure 20B:
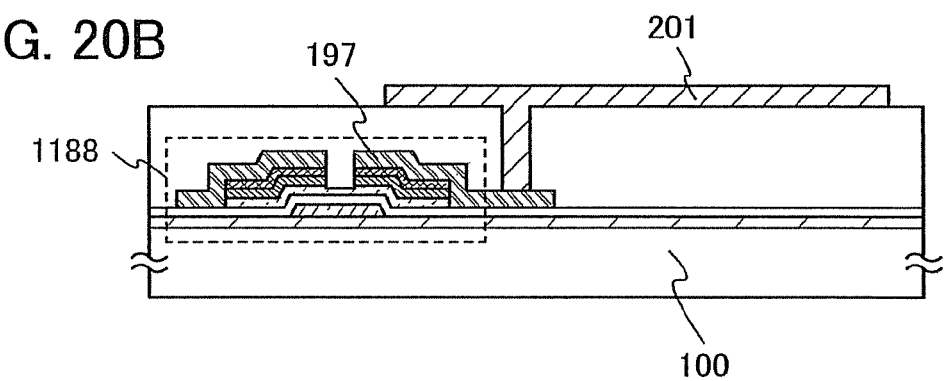

Next, similarly to in Embodiment 1, a first conductive layer 201 which is connected to the wiring 197 is formed, as shown in FIG. 20B. Note that the first conductive layer 201 serves as a pixel electrode.

Figure 20C:
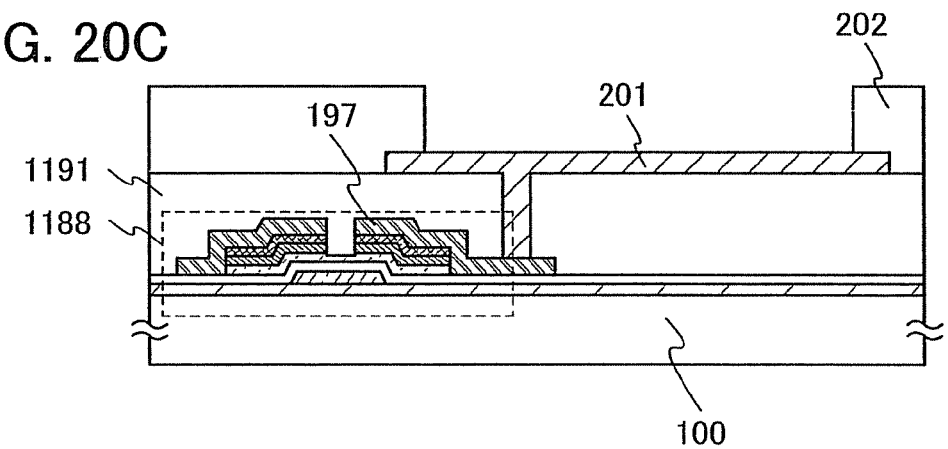

Next, an insulating layer 202 that covers an end portion of the first conductive layer 201 which serves as a pixel electrode is formed, as shown in FIG. 20C. Such an insulating layer can be formed by forming an insulating layer (not illustrated) over the insulating layer 1191 and the first conductive layer 201, and then removing a part of that insulating layer which is over the first conductive layer 201.

Figure 20D:
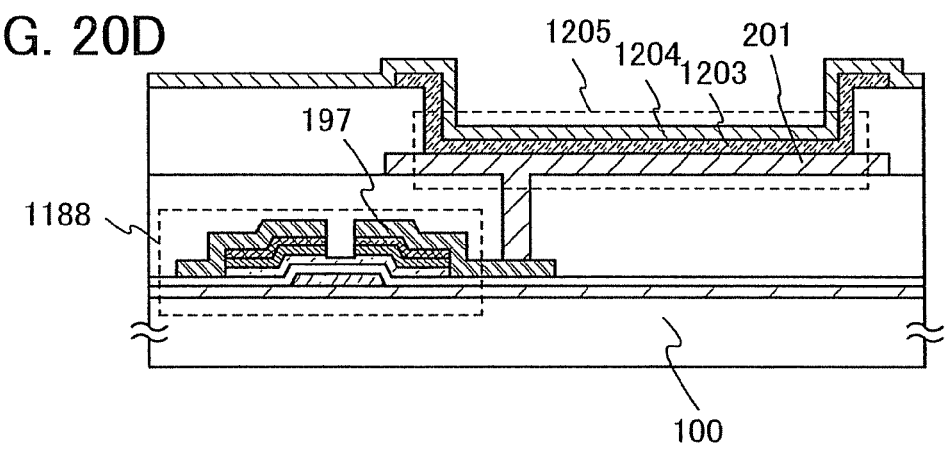

Next, as shown in FIG. 20D, a layer 1203 including a light-emitting substance is formed over an exposed portion of the first conductive layer 201 and part of the insulating layer 202, and a second conductive layer 1204 which serves as a common electrode is formed over that. In accordance with the above steps, a light-emitting element 1205 which includes the first conductive layer 201, the layer 1203 including a light-emitting substance, and the second conductive layer 1204 can be formed.

A structure of the light-emitting element 1205 will be described below.

When a layer having a function of emitting light by utilizing an organic compound (hereinafter referred to as a light-emitting layer 343) is included in the layer 1203 including a light-emitting substance, the light-emitting element 1205 functions as an organic light-emitting element.

As an organic compound with a light-emitting property, for example, 9,10-di(2-naphthyl)anthracene (abbr.: DNA); 2-tert-butyl-9,10-di(2-naphthyl)anthracene (abbr.: t-BuDNA); 4,4'-bis(2,2-diphenylvinyl)biphenyl (abbr.: DPVBi); coumarin 30; coumarin 6; coumarin 545; coumarin 545T; perylene; rubrene; periflanthene; 2,5,8,11-tetra(tert-butyl)perylene (abbr.: TBP); 9,10-diphenylanthracene (abbr.: DPA); 5,12-diphenyltetracene; 4-(dicyanomethylene)-2-methyl-6-[p-(dimethylamino)styryl]-4H-pyran (abbr.: DCM1); 4-(dicyanomethylene)-2-methyl-6-[2-(julolidine-9-yl)ethenyl]-4H-pyran (abbr.: DCM2); 4-(dicyanomethylene)-2,6-bis[p-(dimethylamino)styryl]-4H-pyran (abbr.: BisDCM); or the like may be used. Further, the following compounds capable of emitting phosphorescent light can also be used: bis[2-(4',6'-difluorophenyl)pyridinato-N,$C^{2'}$](picolinato)iridium (abbr.: FIrpic); bis{2-[3',5'-bis(trifluoromethyl)phenyl]pyridinato-N,$C^{2'}$}(picolinato)iridium (abbr.: Ir(CF$_3$ppy)$_2$(pic)); tris(2-phenylpyridinato-N,$C^{2'}$)iridium (abbr.: Ir(ppy)$_3$); (acetylacetonato)bis(2-phenylpyridinato-N,$C^{2'}$)iridium (abbr.: Ir(ppy)$_2$(acac)); (acetylacetonato)bis[2-(2'-thienyl)pyridinato-N,$C^{3'}$]iridium (abbr.: Ir(thp)$_2$(acac)); (acetylacetonato)bis(2-phenylquinolinato-N,$C^{2'}$)iridium (abbr.: Ir(pq)$_2$(acac)); (acetylacetonato)bis[2-(2'-benzothienyl)pyridinato-N,$C^3$]iridium (abbr.: Ir(btp)$_2$(acac)); and the like.

Figure 21A:
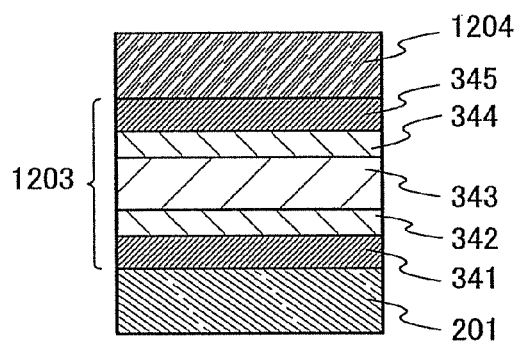
FIGS. 21A to 21E illustrate cross-sectional structures of light-emitting elements which can be applied to the invention.

Further, as shown in FIG. 21A, the light-emitting element 1205 may include the first conductive layer 201 and also the layer 1203 including a light-emitting substance and the second conductive layer 1204, which are formed over the first conductive layer 201. The layer 1203 including a light-emitting substance includes a hole-injecting layer 341 formed of a material with a hole-injecting property, a hole-transporting layer 342 formed of a material with a hole-transporting property, the light-emitting layer 343 formed of an organic compound with a light-emitting property, an electron-transporting layer 344 formed of a material with an electron-transporting property, and an electron-injecting layer 345 formed of a material with an electron-injecting property.

As the material with a hole-transporting property, phthalocyanine (abbr.: H$_2$Pc); copper phthalocyanine (abbr.: CuPc); vanadyl phthalocyanine (abbr.: VOPc); 4,4',4"-tris(N,N-diphenylamino)triphenylamine (abbr.: TDATA); 4,4',4"-tris[N-(3-methylphenyl)-N-phenylamino]triphenylamine (abbr.: MTDATA); 1,3,5-tris[N,N-di(m-tolyl)amino]benzene (abbr.: m-MTDAB); N,N'-diphenyl-N,N'-bis(3-methylphenyl)-1,1'-bisphenyl-4,4'-diamine (abbr.: TPD); 4,4'-bis[N-(1-naphthyl)-N-phenylamino]biphenyl (abbr.: NPB); 4,4'-bis{N[4-di(m-tolyl)amino]phenyl-N-phenylamino}biphenyl (abbr.: DNTPD); 4,4'-bis[N-(4-biphenylyl)-N-phenylamino]biphenyl (abbr.: BBPB); 4,4',4"-tri(N-carbazolyl)triphenylamine (abbr.: TCTA); and the like may be used. Note that the invention is not limited to these. Among the above compounds, an aromatic amine compound typified by TDATA, MTDATA, m-MTDAB, TPD, NPB, DNTPD, BBPB, TCTA, or the like is preferable as the organic compound because it easily generates holes. The substances mentioned here generally have a hole mobility of $10^{-6}$ cm$^2$/Vs or more.

As a material with a hole-injecting property, the aforementioned materials with a hole-transporting property can be used. Further, a chemically-doped conductive macromolecular compound can also be used. For example, polyethylene dioxythiophene (abbr.: PEDOT) doped with polystyrene sulfonate (abbr.: PSS); polyaniline (abbr.: PAni); or the like can also be used. Further, a thin film of an inorganic semiconductor such as molybdenum oxide, vanadium oxide, or nickel oxide, or an ultrathin film of an inorganic insulator such as aluminum oxide is also effective.

Here, a material with an electron-transporting property may be a material including a metal complex with a quinoline skeleton or a benzoquinoline skeleton, or the like such as the following: tris(8-quinolinolato)aluminum (abbr.: Alq$_3$), tris(4-methyl-8-quinolinolato)aluminum (abbr.: Almq$_3$), bis(10- hydroxybenzo[h]-quinolinato)beryllium (abbr.: BeBq$_2$), bis(2-methyl-8-quinolinolato)-4-phenylphenolato-aluminum (abbr.: BAlq), or the like. Further, a metal complex having an oxazole ligand or a thiazole ligand, or the like can also be used, such as bis[2-(2-hydroxyphenyl)benzoxazolato]zinc (abbr.: Zn(BOX)$_2$), or bis[2-(2-hydroxyphenyl)benzothiazolato]zinc (abbr.: Zn(BTZ)$_2$). As an alternative to a metal complex, 2-(4-biphenylyl)-5-(4-tert-butylphenyl)-1,3,4-oxadiazole (abbr.: PBD), 1,3-bis[5-(p-tert-butylphenyl)-1,3,4-oxadiazole-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like can be used. The substances mentioned here generally have an electron mobility of $10^{-6}$ cm$^2$/Vs or more.

As a material with an electron-injecting property, the aforementioned materials with an electron-transporting property may be used. Further, an ultrathin film of an insulator such as the following is often used: a halide of an alkali metal, such as lithium fluoride or cesium fluoride; a halide of an alkaline-earth metal, such as calcium chloride; or an oxide of an alkali metal, such as lithium oxide. Further, an alkali metal complex such as lithium acetyl acetonate (abbr.: Li(acac)) or 8-quinolinolato-lithium (abbr.: Liq) is also effective. Furthermore, a material mixed by, for example, co-evaporating an aforementioned material with an electron-transporting property and a metal with a low work function such as Mg, Li, or Cs can also be used.

Figure 21B:
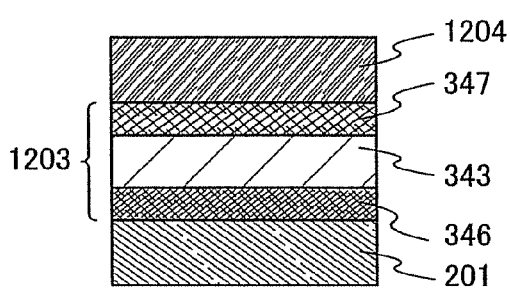

As shown in FIG. 21B, the light-emitting element 1205 may be formed by the first conductive layer 201, the layer 1203 including a light-emitting substance, and the second conductive layer 1204. The layer 1203 including a light-emitting substance includes a hole-transporting layer 346 formed of an organic compound with a light emitting property and an inorganic compound having an electron-accepting property with respect to the organic compound with a light emitting property; the light-emitting layer 343 formed of an organic compound with a light-emitting property; and an electron-transporting layer 347 formed of an organic compound with a light emitting property and an inorganic compound having an electron-donating property with respect to the organic compound with a light-emitting property.

As the organic compound for the hole-transporting layer 346 formed of the organic compound with a light-emitting property and the inorganic compound having an electron-accepting property with respect to the organic compound with a light-emitting property, an aforementioned organic compound with a hole-transporting property may be used as appropriate. Further, the inorganic compound may be any kind of inorganic compound as long as it can easily accept electrons from the organic compound. As the inorganic compound, various metal oxides or metal nitrides can be used. In particular, an oxide of a transition metal belonging to any of Group 4 to Group 12 in the periodic table is preferable because it is likely to exhibit electron-accepting properties. Specifically, titanium oxide, zirconium oxide, vanadium oxide, molybdenum oxide, tungsten oxide, rhenium oxide, ruthenium oxide, zinc oxide, or the like can be used. Among these metal oxides, oxides of transition metals belonging to any of Group 4 to Group 8 in the periodic table are preferable because many of them easily accept electrons. In particular, vanadium oxide, molybdenum oxide, tungsten oxide, and rhenium oxide are preferable because they can be formed by vacuum evaporation and are easy to handle.

As the organic compound for the electron-transporting layer 347 formed of the organic compound with a light-emitting property and the inorganic compound having an electron-donating property with respect to the organic compound with a light-emitting property, an aforementioned organic compound with an electron-transporting property may be used as appropriate. Further, the inorganic compound may be any kind of inorganic compound as long as it can easily donate electrons to the organic compound. As the inorganic compound, various metal oxides or metal nitrides can be used. In particular, an oxide of an alkali metal, an oxide of an alkaline-earth metal, an oxide of a rare-earth metal, a nitride of an alkali metal, a nitride of an alkaline-earth metal, and a nitride of a rare-earth metal are preferable because they are likely to exhibit an electron-donating property. Specifically, lithium oxide, strontium oxide, barium oxide, erbium oxide, lithium nitride, magnesium nitride, calcium nitride, yttrium nitride, lanthanum nitride, and the like are preferable. In particular, lithium oxide, barium oxide, lithium nitride, magnesium nitride, and calcium nitride are preferable because they can be formed by vacuum evaporation and are easy to handle.

The electron-transporting layer 347 and the hole-transporting layer 346 which are each formed of an organic compound with a light-emitting property and an inorganic compound are superior in electron injecting/transporting properties. Therefore, various materials can be used for the first conductive layer 201 and the second conductive layer 1204 without limiting their work functions very much at all. Moreover, the drive voltage can be reduced.

Further, the light-emitting element 1205 functions as an inorganic light-emitting element by having a layer which uses an inorganic compound and which has a light-emitting function (this layer is hereinafter referred to as a light-emitting layer 349) as the layer 1203 including a light-emitting substance. Inorganic light-emitting elements are classified as dispersion-type inorganic light-emitting elements or thin-film inorganic light-emitting elements, depending on their structure. They differ from one another in that the former include a light emitting layer in which particles of a light emitting material are dispersed in a binder and the latter include a light emitting layer formed of a thin film of a light-emitting material. However, they share the fact that they both require electrons accelerated by a high electric field. Further, mechanisms for obtaining light emission include donor-acceptor recombination light emission, which utilizes a donor level and an acceptor level, and localized light emission, which utilizes a core electron transition of a metal ion. In many cases, dispersion-type inorganic light-emitting elements utilize donor-acceptor recombination light emission, while thin-film inorganic light-emitting elements utilize localized light emission. A structure of an inorganic light-emitting element is described below.

A light-emitting material that can be used in this embodiment includes a host material and an impurity element which serves as a light-emitting center. By varying the impurity element that is included, various colors of light emission can be obtained. Various methods can be used to manufacture the light-emitting material, such as a solid phase method or a liquid phase method (e.g., a coprecipitation method) can be used. Further, a liquid phase method, such as a spray pyrolysis method, a double decomposition method, a method which employs a pyrolytic reaction of a precursor, a reverse micelle method, a method in which one or more of the above methods is combined with high-temperature baking, a freeze-drying method, or the like can be used.

In the solid phase method, the host material and an impurity element or a compound containing an impurity element are weighed, mixed in a mortar, and reacted by being heated and baked in an electric furnace. Thereby, the impurity element is included in the host material. Baking temperature is preferably 700 to 1500° C. This is because if the temperature is too low, the solid phase reaction will not proceed, and if the temperature is too high, the host material will decompose. The materials may be baked in powdered form. However, it is preferable to bake the materials in pellet form. Baking at a relatively high temperature is necessary in the solid phase method. However, due to its simplicity, this method has high productivity and is suitable for mass production.

The liquid phase method (e.g., a coprecipitation method) is a method in which the host material or a compound containing the host material, and an impurity element or a compound containing an impurity element, are reacted in a solution, dried, and then baked. Particles of the light-emitting material are distributed uniformly, and the reaction can proceed even if the particles are small and the baking temperature is low.

As a host material for the light-emitting material of the inorganic light-emitting element, a sulfide, an oxide, or a nitride can be used. As a sulfide, zinc sulfide, cadmium sulfide, calcium sulfide, yttrium sulfide, gallium sulfide, strontium sulfide, barium sulfide, or the like can be used, for example. Further, as an oxide, zinc oxide, yttrium oxide, or the like can be used, for example. Moreover, as a nitride, aluminum nitride (AlN), gallium nitride, indium nitride, or the like can be used, for example. Further, zinc selenide, zinc telluride, or the like can also be used. A ternary mixed crystal such as calcium gallium sulfide, strontium gallium sulfide, or barium gallium sulfide may also be used.

As a light-emitting center for localized light emission, manganese (Mn), copper (Cu), samarium (Sm), terbium (Tb), erbium (Er), thulium (Tm), europium (Eu), cerium (Ce), praseodymium (Pr), or the like can be used. Further, as charge compensation, a halogen element such as fluorine (F) or chlorine (Cl) may be added.

Meanwhile, as a light-emitting center for donor-acceptor recombination light emission, a light-emitting material that includes a first impurity element which forms a donor level and a second impurity element which forms an acceptor level can be used. As the first impurity element, fluorine (F), chlorine (Cl), aluminum (Al), or the like can be used, for example. As the second impurity element, copper (Cu), silver (Ag), or the like can be used, for example.

In the case of using a solid phase method to synthesize a light-emitting material for donor-acceptor recombination light emission, the host material, the first impurity element or a compound containing the first impurity element, and the second impurity element or a compound containing the second impurity element are weighed, mixed in a mortar, then heated and baked in an electric furnace. As the host material, any of the above-mentioned host materials can be used. As the first impurity element, fluorine (F), chlorine (Cl), or the like can be used, for example. As the compound containing the first impurity element, aluminum sulfide or the like can be used, for example. As the second impurity element, copper (Cu), silver (Ag), or the like can be used, for example. As the compound containing the second impurity element, copper sulfide, silver sulfide, or the like can be used, for example. Baking temperature is preferably 700 to 1500° C. This is because if the temperature is too low, the solid phase reaction will not proceed, and if the temperature is too high, the host material will decompose. Baking may be conducted with the materials in powdered form; however, it is preferable to conduct baking with the materials in pellet form.

Further, in the case of employing a solid phase reaction, a compound including the first impurity element and the second impurity element may be used. In such a case, since the impurity elements diffuse readily and the solid phase reaction proceeds readily, a uniform light-emitting material can be obtained. Further, since an unnecessary impurity element does not enter the light-emitting material, a light-emitting material with high purity can be obtained. As a compound including the first impurity element and the second impurity element, for example, copper chloride, silver chloride, or the like can be used.

Note that the concentration of the impurity elements in the host material may be 0.01 to 10 atomic percent, and is preferably in the range of 0.05 to 5 atomic percent.

Figure 21C:
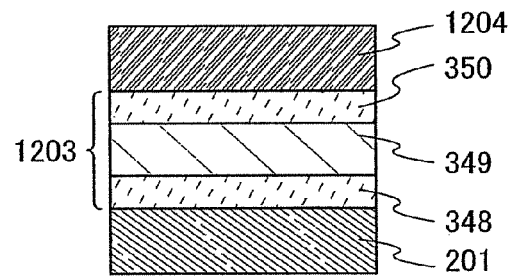

FIG. 21C shows a cross-section of an inorganic light-emitting element in which the layer 1203 including a light-emitting substance is formed by a first insulating layer 348, a light emitting layer 349, and a second insulating layer 350.

In the case of a thin film inorganic light-emitting element, the light emitting layer 349 is a layer which includes an above-mentioned light-emitting material. As a method for forming the light emitting layer 349, resistive heating evaporation, a vacuum evaporation method such as an electron-beam evaporation (EB evaporation) method, a physical vapor deposition (PVD) method such as a sputtering method, a chemical vapor deposition (CVD) method such as a metalorganic CVD method or a low-pressure hydride transport CVD method, an atomic layer epitaxy (ALE) method, or the like can be used.

There is no particular limitation on the materials used for the first insulating layer 348 and the second insulating layer 350; however, preferably they have a high withstand voltage and form a dense film. In addition, preferably the material of the insulating layers has a high dielectric constant. For example, silicon oxide, yttrium oxide, aluminum oxide, hafnium oxide, tantalum oxide, barium titanate, strontium titanate, lead titanate, silicon nitride, zirconium oxide, or the like, or a mixed film or a stacked film containing two or more of these materials can be used. The first insulating layer 348 and the second insulating layer 350 can be formed by sputtering, an evaporation method, CVD, or the like. There is no particular limitation on the thickness of the first insulating layer 348 and the second insulating layer 350, but preferably it is in the range of 10 to 1000 nm. Note that a light emitting element of this embodiment mode does not necessarily require hot electrons, and therefore has the advantages that a thin film can be formed and drive voltage can be reduced. Film thickness is preferably less than or equal to 500 nm, more preferably less than or equal to 100 nm.

Although not illustrated, a buffer layer may be provided between the light-emitting layer 349 and the insulating layers 348 and 350, or between the light-emitting layer 349 and the first conductive layer 201 and the second conductive layer 1204. The buffer layer facilitates carrier injection and suppresses mixture of the layers. There is no particular limitation on the material of the buffer layer. However, for example, zinc sulfide, selenium sulfide, cadmium sulfide, strontium sulfide, barium sulfide, copper sulfide, lithium fluoride, calcium fluoride, barium fluoride, magnesium fluoride, or the like, which are host materials for the light-emitting layer, can be used.

Figure 21D:
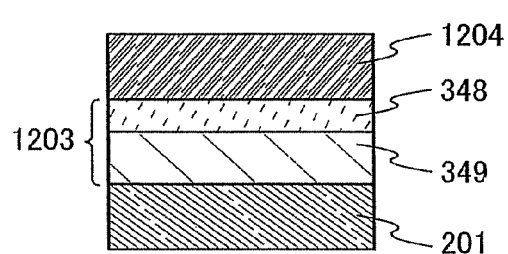

Further, as shown in FIG. 21D, the layer 1203 including a light-emitting substance may be formed by the light-emitting layer 349 and the first insulating layer 348. FIG. 21D shows a mode where the first insulating layer 348 is provided between the second conductive layer 1204 and the light-emitting layer 349 in this case. Note that the first insulating layer 348 may be provided between the first conductive layer 201 and the light-emitting layer 349.

Further, the layer 1203 including a light-emitting substance may be formed by only the light-emitting layer 349. In other words, the light-emitting element 1205 may be formed by the first conductive layer 201, the light-emitting layer 349, and the second conductive layer 1204.

In the case of a dispersion-type inorganic light-emitting element, a layer containing a light-emitting substance which is the form of a film is formed by dispersing particles of light-emitting material in a binder. When particles with a desired size cannot be satisfactorily obtained satisfactorily by a method of manufacturing the light-emitting material, the material may be processed into particles by being crushed in a mortar or the like. A binder refers to a material for fixing the dispersed particles of light-emitting material in place and maintaining the shape of the layer containing a light-emitting substance. The light-emitting material is dispersed evenly throughout the layer containing a light-emitting substance and fixed in place by the binder.

In the case of the dispersion-type inorganic light-emitting element, the layer containing a light-emitting substance can be formed by a droplet discharging method that can selectively form the layer containing the light-emitting substance, a printing method (such as screen printing or offset printing), a coating method such as a spin coating method, a dipping method, a dispenser method, or the like. There is no particular limitation on the thickness of the layer. However, it is preferably in the range of 10 to 1000 nm. Further, the proportion of the light-emitting material in the layer containing a light-emitting substance, which includes the light-emitting material and the binder, is preferably in the range of 50 to 80 wt %, inclusive.

Figure 21E:
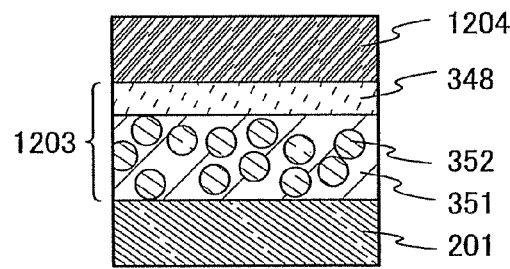

An element shown in FIG. 21E has the first conductive layer 201, the layer 1203 including a light-emitting substance, and the second conductive layer 1204. The layer 1203 including a light-emitting substance is formed by the insulating layer 348 and a light-emitting layer in which a light-emitting material 352 is dispersed in a binder 351. Note that FIG. 21E shows a structure in which the insulating layer 348 is in contact with the second conductive layer 1204; however, a structure in which the insulating layer 348 is in contact with the first conductive layer 201 may also be used. Further, insulating layers may be formed in contact with each of the first conductive layer 201 and the second conductive layer 1204 in the element. Furthermore, the element does not have to include an insulating layer which is in contact with the first conductive layer 201 or the second conductive layer 1204.

As a binder which can be used in this embodiment, an organic material or an inorganic material can be used. A mixed material containing an organic material and an inorganic material may also be used. As an organic material, a polymer with a relatively high dielectric constant, such as a cyanoethyl cellulose resin, or a resin such as polyethylene, polypropylene, a polystyrene resin, a silicone resin, an epoxy resin, or vinylidene fluoride can be used. Further, a siloxane resin or a heat-resistant macromolecular material such as aromatic polyamide or polybenzimidazole may also be used. A siloxane resin is a resin which includes a Si—O—Si bond. Siloxane is a material which has a backbone formed of bonds between silicon (Si) and oxygen (O). As a substituent, an organic group containing at least hydrogen (for example, an alkyl group or an aryl group) can be used. Alternatively, a fluoro group may be used as a substituent. Further alternatively, both a fluoro group and an organic group containing at least hydrogen may be used as a substituent. Further, the following resin materials may also be used: a vinyl resin such as polyvinyl alcohol or polyvinylbutyral, a phenol resin, a novolac resin, an acrylic resin, a melamine resin, a urethane resin, an oxazole resin (e.g., polybenzoxazole), or the like. Further, a photocurable resin can be used. Fine particles with a high dielectric constant, such as particles of barium titanate or strontium titanate, can be mixed with these resins as appropriate to adjust the dielectric constant.

Further, the inorganic material used for the binder can be formed using silicon oxide, silicon nitride, silicon containing oxygen and nitrogen, aluminum nitride, aluminum containing oxygen and nitrogen, aluminum oxide, titanium oxide, barium titanate, strontium titanate, lead titanate, potassium niobate, lead niobate, tantalum oxide, barium tantalate, lithium tantalate, yttrium oxide, zirconium oxide, zinc sulfide, or other substances containing an inorganic material. By including an inorganic material with a high dielectric constant in the organic material (by doping or the like), the dielectric constant of the layer containing a light-emitting substance, which includes the light-emitting material and the binder, can be further controlled, and the dielectric constant can be further increased.

In the manufacturing process, the light-emitting material is dispersed in a solution containing a binder. As a solvent for the solution containing a binder that can be used in this embodiment, a solvent in which the binder material dissolves and which can form a solution with a viscosity that is suitable for the method of forming the light-emitting layer (the various wet processes) and for a desired film thickness may be selected appropriately. An organic solvent or the like can be used. For example, when a siloxane resin is used as the binder, propylene glycolmonomethyl ether, propylene glycolmonomethyl ether acetate (also called PGMEA), 3-methoxy-3-methyl-1-butanol (also called MMB), or the like can be used as the solvent.

In the inorganic light-emitting element, light emission is obtained when a voltage is applied between a pair of electrodes which sandwich the layer containing a light-emitting substance, and the element can be operated by either direct current drive or alternating current drive.

Here, for a light-emitting element which exhibits a red color, an ITO layer containing silicon oxide with a film thickness of 125 nm is formed as the first conductive layer 201 which serves as a first pixel electrode. Further, the layer 1203 including a light-emitting substance is formed by stacking 50 nm of DNTPD, 10 nm of NPB, 30 nm of NPB to which bis[2,3-bis(4-fluorophenyl)quinoxalinato]iridium(acetylacetonate) (abbr.: Ir(Fdpq)$_2$(acac)) is added, 30 nm of Alq$_3$, and 1 nm of lithium fluoride. As the second conductive layer 1204 which serves as a second pixel electrode, an Al layer with a thickness of 200 nm is formed.

Further, for a light-emitting element which exhibits a green color, an ITO layer containing silicon oxide with a film thickness of 125 nm is formed as the first conductive layer 201 which serves as a first pixel electrode. Further, the layer 1203 including a light-emitting substance is formed by stacking 50 nm of DNTPD, 10 nm of NPB, 40 nm of Alq$_3$ to which coumarin 545T (C545T) is added, 30 nm of Alq$_3$, and 1 nm of lithium fluoride. As the second conductive layer 1204 which serves as a second pixel electrode, an Al layer with a thickness of 200 nm is formed.

Further, for a light-emitting element which exhibits a blue color, an ITO layer containing silicon oxide with a film thickness of 125 nm is formed as the first conductive layer 201 which serves as a first pixel electrode. Further, the layer 1203 including a light-emitting substance is formed by stacking 50 nm of DNTPD, 10 nm of NPB, 30 nm of 9-[4-(N-carbazolyl)]phenyl-10-phenylanthracene (abbr.: CzPA) to which 2,5,8,11-tetra(tert-butyl)perylene (abbr.: TBP) is added, 30 nm of Alq$_3$, and 1 nm of lithium fluoride. As the second conductive layer 1204 which serves as a second pixel electrode, an Al layer with a thickness of 200 nm is formed.

Next, preferably a protective film is formed over the second conductive layer 1204.

Subsequently, a wiring board, representatively an FPC, is attached to connecting terminal portions of a scanning line and a signal line, with a connecting conductive layer interposed therebetween. In accordance with the above steps, the light-emitting display panel can be formed.

Note that a protective circuit for preventing electrostatic breakdown, representatively, a diode or the like, may be provided between a connecting terminal and a source wiring (or gate wiring), or in the pixel portion.

Figure 22A:
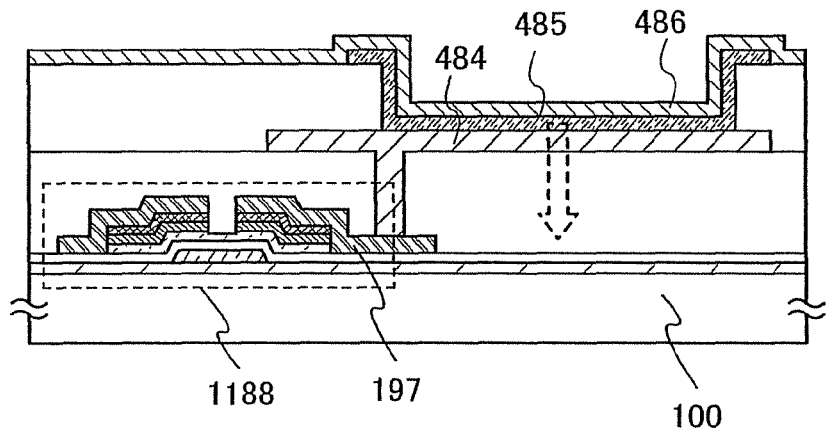
FIGS. 22A to 22C illustrate cross-sectional structures of light-emitting elements which can be applied to the invention.

Here, the case where light is emitted to the substrate 100 side, that is, the case of bottom emission, in light-emitting display panels which include the light-emitting elements shown in FIGS. 21A and 21B, is described with reference to FIG. 22A. In such a case, a conductive layer 484 having a light-transmitting property, a layer 485 including a light-emitting substance, and a conductive layer 486 having a light-blocking property or a reflective property are stacked sequentially such that they are in contact with the wiring 197, so that they are electrically connected to the thin film transistor 1188. It is necessary that the substrate 100 through which light is transmitted has a light-transmitting property with respect to at least light in the visible region.

Figure 22B:
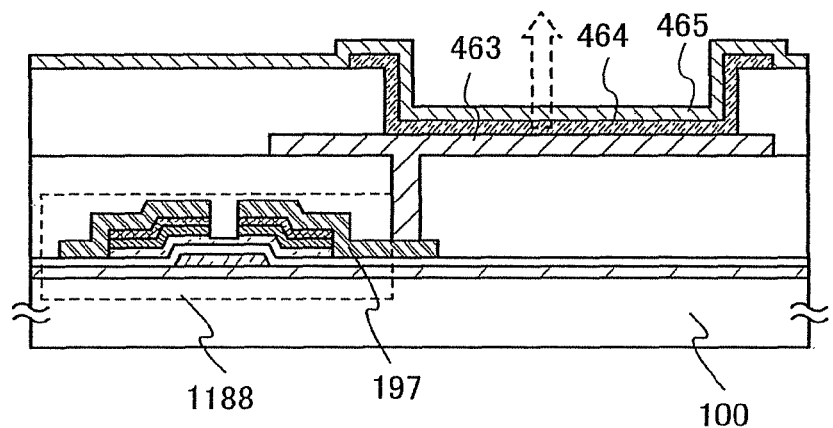

Next, the case where light is emitted to the side opposite to the substrate 100, that is, the case of top emission, is described with reference to FIG. 22B. The thin film transistor 1188 can be formed in a similar manner to the above-described thin film transistor. A wiring 197 which is electrically connected to the thin film transistor 1188 is in contact with a conductive layer 463 having a light-blocking property or a reflective property so that the wiring 197 and the conductive layer 463 having a light-blocking property or a reflective property are electrically connected to each other. The conductive layer 463 having a light-blocking property or a reflective property, a layer 464 including a light-emitting substance, and a conductive layer 465 having a light-transmitting property are sequentially stacked. The conductive layer 463 is a metal layer having a light-blocking property or a reflective property, and light emitted from a light-emitting element is emitted to above the light-emitting element, as shown by an arrow. Note that a conductive layer having a light-transmitting property may be formed over the conductive layer 463 having a light-blocking property or a reflective property. Light emitted from the light-emitting element is emitted out through the conductive layer 465 having a light-transmitting property.

Figure 22C:
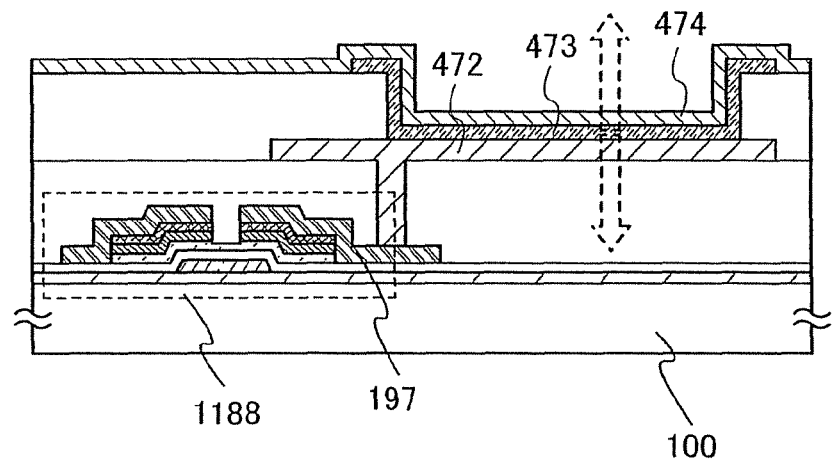

Next, the case where light is emitted to both the substrate 100 side and the side opposite to the substrate 100, that is, the case of dual emission, is described with reference to FIG. 22C. A first conductive layer 472 having a light-transmitting property is electrically connected to the wiring 197 which is electrically connected to a semiconductor layer of the thin film transistor 1188. The first conductive layer 472 having a light-transmitting property, a layer 473 including a light-emitting substance, and a second conductive layer 474 having a light-transmitting property are sequentially stacked. At this time, dual emission is realized when both the first conductive layer 472 having a light-transmitting property and the second conductive layer 474 having a light-transmitting property are formed of a material having a light-transmitting property with respect to at least visible light or are formed with a thickness such that light can be transmitted through them. In such a case, it is necessary that an insulating layer and the substrate 100 through which light is transmitted also have a light-transmitting property with respect to at least light in the visible region.

A pixel circuit of a light-emitting display panel having a light-emitting element shown in FIGS. 21A and 21B and an operational configuration of the pixel circuit will now be described with reference to FIGS. 13A to 13C. For a display device using a digital video signal, operational configurations of a light-emitting display panel include an operational configuration in which video signals input to a pixel are regulated by a voltage, and an operational configuration in which video signals input to a pixel are regulated by a current. Concerning operational configurations in which video signals are regulated by a voltage, there is an operational configuration in which voltage applied to a light emitting element is constant (CVCV), and an operational configuration in which current applied to a light emitting element is constant (CVCC). Further, concerning operational configurations in which video signals are regulated by a current, there is an operational configuration in which voltage applied to a light emitting element is constant (CCCV), and an operational configuration in which current applied to a light emitting element is constant (CCCC). In this embodiment, a pixel which employs CVCV operation is described with reference to FIGS. 13A and 13B. Further, a pixel which employs CVCC operation is described with reference to FIG. 13C.

Figure 13A:
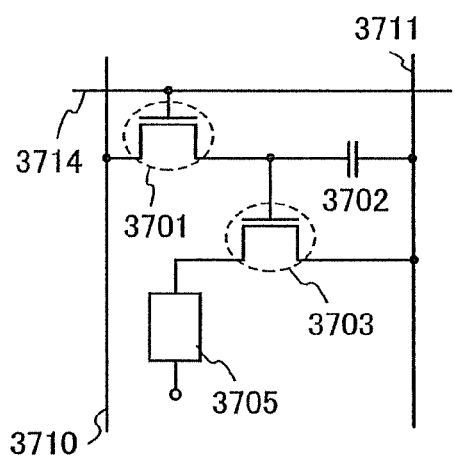
FIGS. 13A to 13C are equivalent circuit diagrams of a light emitting element which can be applied to the invention.
Figure 13B:
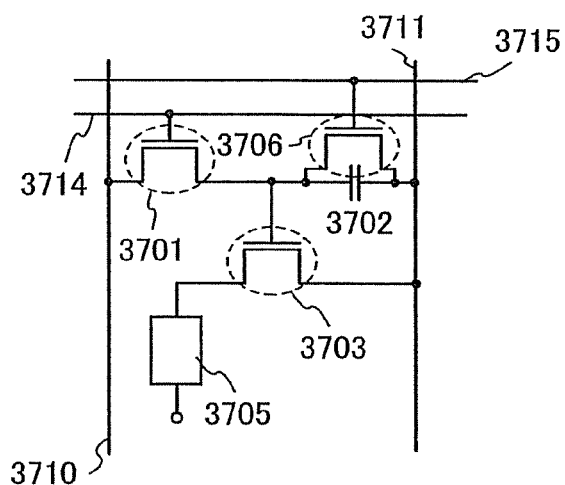
Figure 13C:
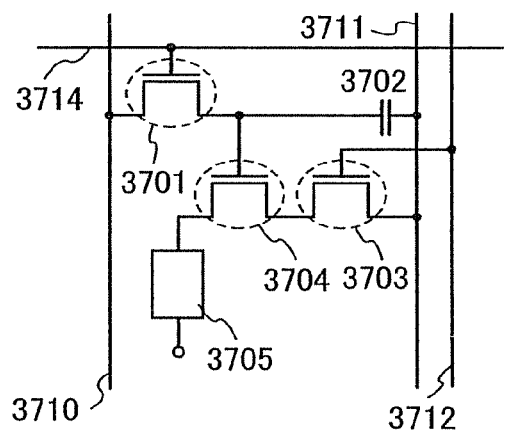

In pixels shown in FIGS. 13A and 13B, a signal line 3710 and a power supply line 3711 are disposed in a column direction, and a scanning line 3714 is disposed in a row direction. Further, the pixels include a switching TFT 3701, a driving TFT 3703, a capacitor 3702, and a light emitting element 3705.

Note that when the switching TFT 3701 and the driving TFT 3703 are on, they operate in a linear region. Further, the driving TFT 3703 has a function of controlling whether or not a voltage is applied to the light-emitting element 3705. In terms of the manufacturing process, it is preferable that the switching TFT 3701 and the driving TFT 3703 have the same type of conductivity. Further, for the driving TFT 3703, not only an enhancement-type TN but also a depletion-type TFT may be used. Further, the ratio (W/L) of the channel width W to the channel length L of the driving TFT 3703 may vary according to the mobility of the TFT; however, it is preferably in the range of from 1 to 1000. The larger the ratio W/L, the more electrical characteristics of the TFT improve.

In the pixels shown in FIGS. 13A and 13B, the switching TFT 3701 controls input of video signals to the pixel. When the switching TFT 3701 is turned on, a video signal is input inside the pixel. Then, a voltage of the video signal is stored in the capacitor 3702.

In FIG. 13A, in a case where the power supply line 3711 is $V_{ss}$ and a common electrode of the light-emitting element 3705 is $V_{dd}$, the common electrode of the light-emitting element is an anode and an electrode which is connected to the driving TFT 3703 is a cathode. In this case, unevenness in luminance caused by variations in characteristics of the driving TFTs 3703 can be suppressed.

In FIG. 13A, in a case where the power supply line 3711 is $V_{dd}$ and the common electrode of the light-emitting element 3705 is $V_{ss}$, the common electrode of the light-emitting element is a cathode and the electrode which is connected to the driving TFT 3703 is an anode. In this case, when a video signal with a voltage higher than $V_{dd}$ is input to the signal line 3710, the voltage of the video signal is stored in the capacitor 3702 and the driving TFT 3703 operates in a linear region. Therefore, unevenness in luminance caused by variations in TFTs can be ameliorated.

The pixel shown in FIG. 13B has the same pixel configuration as that shown in FIG. 13A except that in FIG. 13B, a TFT 3706 and a scanning line 3715 are added.

The TFT 3706 is turned on and off by the newly disposed scanning line 3715. When the TFT 3706 is turned on, the charge stored in the capacitor 3702 is discharged, and the driving TFT 3703 is turned off. In other words, by disposing the TFT 3706, the flow of current to the light-emitting element 3705 can be forcibly terminated. Therefore, the TFT 3706 can be referred to as an erasing TFT. Accordingly, in the structure in FIG. 13B, a lighting period can be started at the same time as a writing period is started or immediately after a writing period is started, without waiting for signals to be written to all the pixels. Therefore, the duty ratio of light emission can be improved.

In a pixel having the above-described operational configuration, the amount of current of the light-emitting element 3705 can be determined by the driving TFT 3703 which operates in a linear region. By employing the above-described configurations, variation in characteristics of TFTs can be controlled, and unevenness in luminance of a light-emitting element which is caused by variation in TFT characteristics can be ameliorated. Thus, a display device with improved image quality can be provided.

Next, a pixel which employs CVCC operation will be described with reference to FIG. 13C. A pixel shown in FIG. 13C has the pixel configuration shown in FIG. 13A with a power supply line 3712 and a current control TFT 3704 additionally provided. Note that in the pixel shown in FIG. 13C, a gate electrode of the driving TFT 3703 is connected to the power supply line 3712 which is disposed in a column direction; however, it may be connected to a power supply line 3712 which is disposed in a row direction instead.

Note that the switching TFT 3701 operates in a linear region, and the driving TFT 3703 operates in a saturation region. Further, the driving TFT 3703 has a function of controlling the amount of current which flows to the light-emitting element light-emitting element 3705, and the current control TFT 3704 operates in a saturation region and has a function of controlling the supply of current to the light-emitting element 3705.

Note that the pixels shown in FIGS. 13A and 13B can employ CVCC operation. Further, in a pixel having the operational configuration shown in FIG. 13C, $V_{dd}$ and $V_{ss}$ can be changed as appropriate in accordance with the direction in which current of the light-emitting element flows, similarly to the pixels shown in FIGS. 13A and 13B.

In a pixel having the above-described configuration, since the current control TFT 3704 operates in the linear region, slight changes in the $V_{gs}$ of the current control TFT 3704 do not affect the amount of current of the light-emitting element 3705. In short, the amount of current of the light-emitting element 3705 can be determined by the driving TFT 3703 which operates in a saturation region. By employing the above-described configuration, unevenness in luminance of a light-emitting element which is caused by variation in TFT characteristics can be ameliorated. Thus, a display device with improved image quality can be provided.

Particularly in the case of forming a thin film transistor having an amorphous semiconductor or the like, it is preferable to enlarge the area of a semiconductor film of a driving TFT, because by doing so variation in TFTs can be reduced. Further, since the number of TFTs in the pixels shown in FIGS. 13A and 13B is small, an aperture ratio can be increased.

Note that although a configuration which includes the capacitor 3702 is shown, the invention is not limited to this, and in a case where gate capacitance or the like can be used for the capacitance which stores the video signal, the capacitor 3702 does not have to be provided.

Further, in a case where a semiconductor layer of the thin film transistor is formed as an amorphous semiconductor film, the threshold value tends to shift easily. Therefore, preferably a circuit which corrects the threshold value is provided in the pixel or on the periphery of the pixel.

An active matrix light-emitting display device such as this is advantageous in that when the pixel density is increased, since a TFT is provided in each pixel, low voltage drive is possible. Meanwhile, a passive matrix light-emitting device can also be formed. In a passive matrix light-emitting device, a TFT is not provided in each pixel. Therefore, an high aperture ratio is high.

Further, in a display device of the invention, there is no particular limitation on the driving method of the screen display. For example, a dot-sequential driving method, a line-sequential driving method, a plane sequential driving method, or the like may be used. Representatively, a line-sequential driving method is used, and a time-division gray scale driving method or an area gray scale driving method may be used as appropriate. Further, an image signal input to a source line of the display device may be an analog signal or a digital signal, and a driver circuit or the like may be designed as appropriate in accordance with the image signal.

As described above, various pixel circuits can be employed.

According to this embodiment, a component included in a light-emitting display panel, such as a wiring or the like, can be formed with a desired shape. Further, since a light-emitting display panel can be manufactured by a simplified process without using a complex photolithography process step, loss of materials is reduced and reduction in cost can also be achieved. Therefore, high-performance light-emitting display devices with high reliability can be manufactured with a good yield.

Embodiment 3

In this embodiment, a representative example of an electrophoretic display panel will be described, with reference to FIG. 23 and FIGS. 24A to 24D. An electrophoretic element refers to an element in which a microcapsule containing black and white particles which are charged positively and negatively is disposed between a first conductive layer and a second conductive layer, and display is performed by generating a potential difference between the first conductive layer and the second conductive layer so that the black and white particles move between electrodes.

Figure 23:
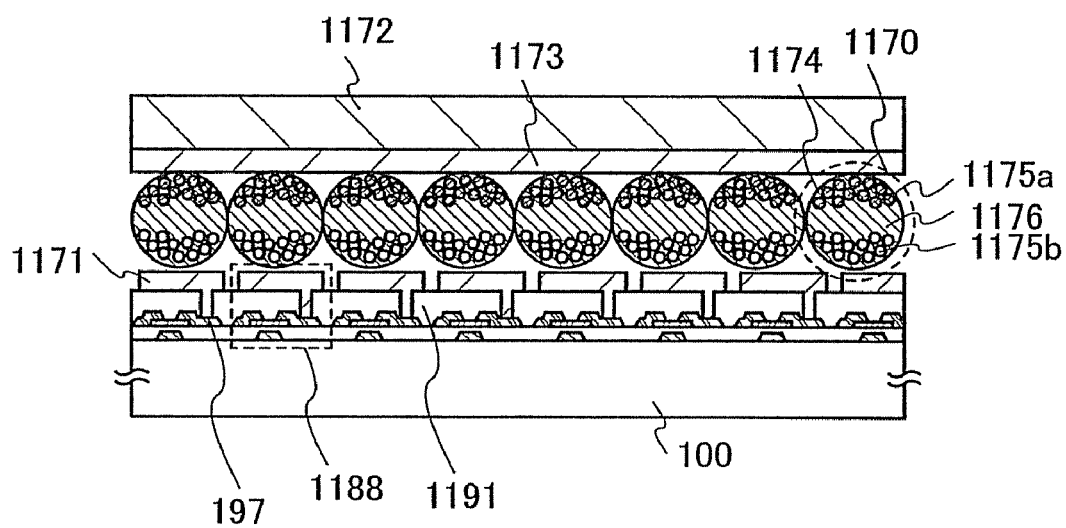
FIG. 23 is a cross-section illustrating a method of manufacturing a semiconductor device of the invention.

Similarly to in Embodiment 1, over the substrate 100, the thin film transistor 1188 described in Embodiment Mode 7 and the insulating layer 1191 which covers the thin film transistor 1188 and has an opening are formed, as shown in FIG. 23.

Next, a first conductive layer 1171 which connects to the wiring 197 is formed, as in Embodiment 1. Note that the first conductive layer 1171 functions as a pixel electrode. Here, the first conductive layer 1171 is formed using aluminum by a method described in a previous embodiment.

Further, a second conductive layer 1173 is formed over a substrate 1172. Here, the second conductive layer 1173 is formed using ITO by a method described in a previous embodiment.

Next, the substrate 100 and the substrate 1172 are attached to each other by a sealant. At this time, microcapsules 1170 are dispersed between the first conductive layer 1171 and the second conductive layer 1173, and thus, an electrophoretic element is formed between the substrate 100 and the substrate 1172. The electrophoretic element includes the first conductive layer 1171, microcapsules 1170, and the second conductive layer 1173. Further, the microcapsules 1170 are fixed between the first conductive layer 1171 and the second conductive layer 1173 using a binder.

Figure 24A:
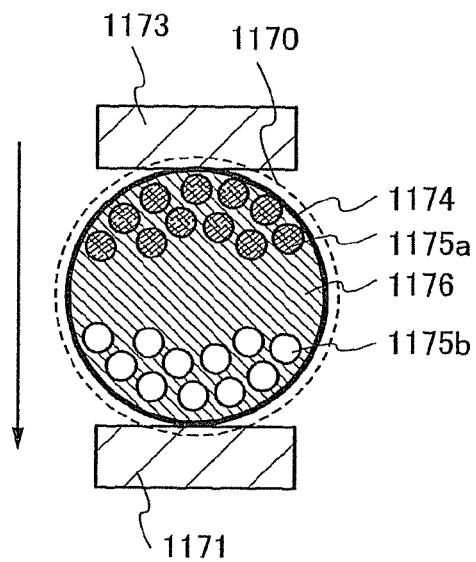
FIGS. 24A to 24D illustrate cross-sectional structures of electrophoretic elements which can be applied to the invention.
Figure 24B:
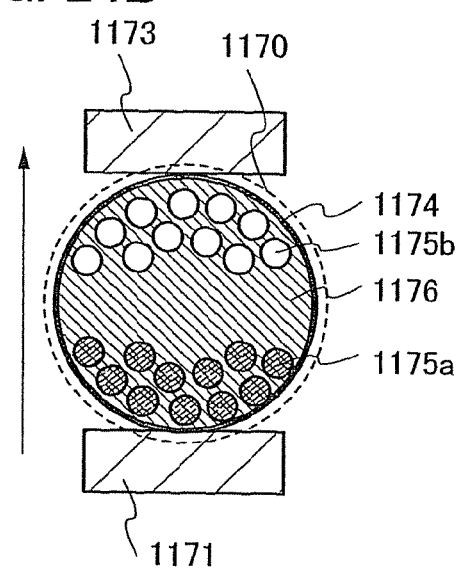
Figure 24C:
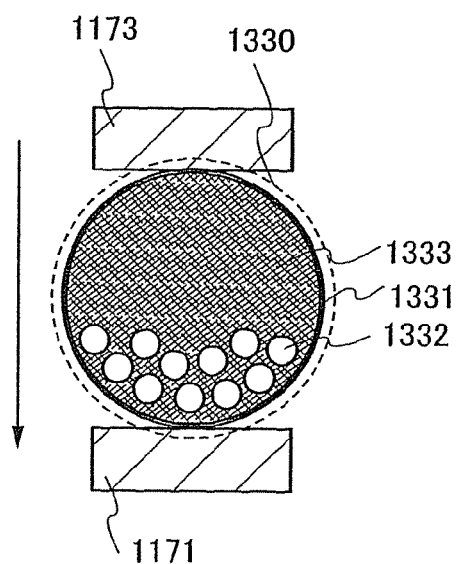
Figure 24D:
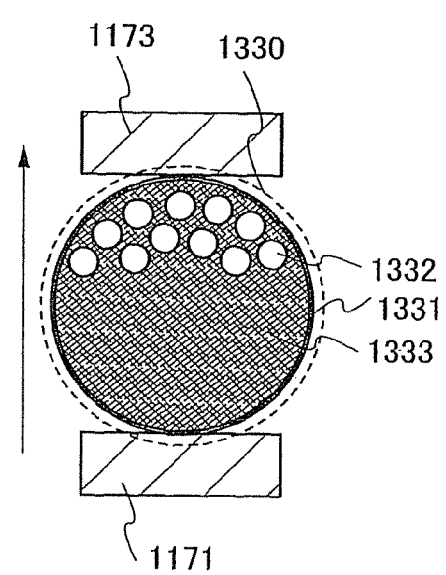

Structures of the microcapsule are shown in FIGS. 24A to 24D. As shown in FIGS. 24A and 24B, the microcapsule 1170 is a fine transparent container 1174 in which a transparent dispersion medium 1176, charged black particles 1175a, and charged white particles 1175b are sealed. Note that blue particles, red particles, green particles, yellow particles, blue-green particles, or reddish-violet particles may be used instead of the black particles 1175a. Further, as shown in FIGS. 24C and 24D, a microcapsule 1330 which is a fine transparent container 1331 in which a colored dispersion medium 1333 and white particles 1332 are sealed may be used. Note that the colored dispersion medium 1333 may be colored black, blue, red, green, yellow, blue-green, or reddish-violet. Further, when a microcapsule in which blue particles are dispersed, a microcapsule in which red particles are dispersed, and a microcapsule in which green particles are dispersed are each provided in one pixel, color display can be performed. When a microcapsule in which yellow particles are dispersed, a microcapsule in which blue-green particles are dispersed, and a microcapsule in which reddish violet particles are dispersed are each provided in one pixel, color display can be performed. Further, when a microcapsule in which white particles or black particles are dispersed in a blue dispersion medium, a microcapsule in which white particles or black particles are dispersed in a red dispersion medium, and a microcapsule in which white particles or black particles are dispersed in a green dispersion medium are each provided in one pixel, color display can be performed. Further, when a microcapsule in which white particles or black particles are dispersed in a yellow dispersion medium, a microcapsule in which white particles or black particles are dispersed in a blue-green dispersion medium, and a microcapsule in which white particles or black particles are dispersed in a reddish violet dispersion medium are each provided in one pixel, color display can be performed.

A display method which employs an electrophoretic element is shown. Specifically, FIGS. 24A and 24B show a display method of the microcapsule 1170 having particles of two different colors. Here, white particles and black particles are used as the particles of two different colors, and a microcapsule having a transparent dispersion medium is shown. Note that regarding the particles of two different colors, instead of the black particles, particles of a different color may be used.

In the microcapsule 1170, the black particles 1175a are charged positively and the white particles 1175b are charged negatively, and a voltage is applied to the first conductive layer 1171 and the second conductive layer 1173. Here, as shown by an arrow, when an electric field is generated in a direction going from the second conductive layer to the first conductive layer, the black particles 1175a migrate to the second conductive layer 1173 side, and the white particles 1175b migrate to the first conductive layer 1171 side, as shown in FIG. 24A. As a result, when the microcapsule is seen from the first conductive layer 1171 side, white is observed, and when the microcapsule is seen from the second conductive layer 1173 side, black is observed.

Meanwhile, when a voltage is applied in a direction going from the first conductive layer 1171 to the second conductive layer 1173, as shown by an arrow in FIG. 24B, the black particles 1175a migrate to the first conductive layer 1171 side and the white particles 1175b migrate to the second conductive layer 1173 side, as shown in FIG. 24B. As a result, when the microcapsule is seen from the first conductive layer 1171 side, black is observed, and when the microcapsule is seen from the second conductive layer 1173 side, white is observed.

Next, a display method of the microcapsule 1330 which has the white particles and the colored dispersion medium is described. Although an example in which a dispersion medium is colored black is described here, a dispersion medium which is colored another color can be used similarly.

In the microcapsule 1330, the white particles 1332 are charged negatively, and a voltage is applied to the first conductive layer 1171 and the second conductive layer 1173. As shown by the arrow in FIG. 24C, when an electric field is generated in a direction going from the second conductive layer to the first conductive layer here, the white particles 1175b migrate to the first conductive layer 1171 side, as shown in FIG. 24C. As a result, when the microcapsule is seen from the first conductive layer 1171 side, white is observed, and when the microcapsule is seen from the second conductive layer 1173 side, black is observed.

Meanwhile, when an electric field is generated in a direction going from the first conductive layer to the second conductive layer, as shown by the arrow in FIG. 24D, the white particles 1175b migrate to the second conductive layer 1173 side, as shown in FIG. 24D. As a result, when the microcapsule is seen from the first conductive layer 1171 side, black is observed, and when the microcapsule is seen from the second conductive layer 1173 side, white is observed.

Although description is made with reference to an electrophoretic element here, a display device which employs a twisted ball display method may be used instead of the electrophoretic element. A twisted ball display method refers to a method in which spherical particles which are each colored both white and black are disposed between a first conductive layer and a second conductive layer, and display is performed by generating a potential difference between the first conductive layer and the second conductive layer and thereby controlling the orientation of the spherical particles.

Further, an MIM (metal-insulator-metal), a diode, or the like can be used as a switching element instead of a thin film transistor.

A display device having an electrophoretic element and a display device which employs a twisted ball display method maintain a state similar to that of when a voltage is applied for a long while even after the power is turned off. Therefore, the state of display can be maintained even after the power is turned off. Accordingly, low power consumption is possible.

According to this embodiment, a component included in an electrophoretic display panel, such as a wiring or the like, can be formed with a desired shape. Further, since a semiconductor device having an electrophoretic element can be manufactured by a simplified process without using a complex photolithography process step, there is little loss of material and reduction in cost can also be achieved. Therefore, high-performance semiconductor devices having an electrophoretic element that have high reliability can be manufactured with a good yield.

Embodiment 4

Below, an example of a display panel (a light-emitting display panel, a liquid crystal display panel, or an electrophoretic display panel) manufactured in accordance with any of Embodiments 1 to 3, in which a semiconductor layer is formed using an amorphous semiconductor or semi-amorphous silicon (SAS), and a driver circuit on a scanning line side is formed over a substrate, will be described.

Figure 25:
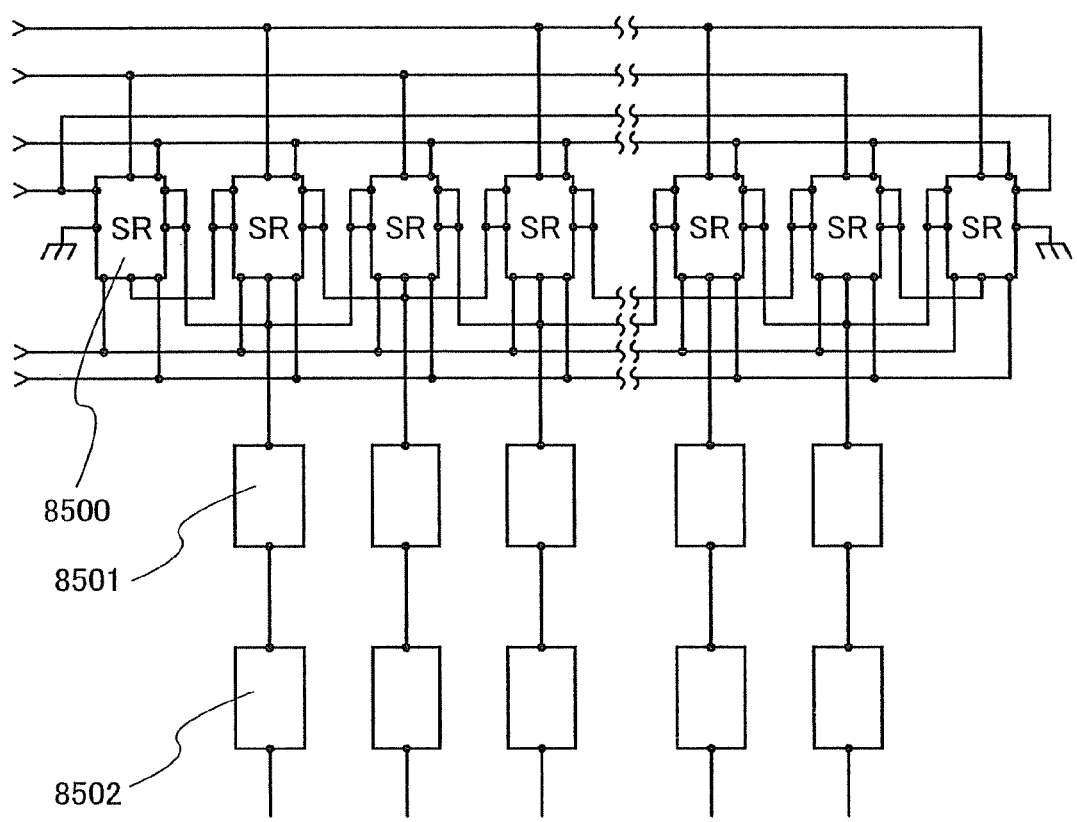
FIG. 25 illustrates a circuit configuration for a case where a scanning line side driver circuit in a display panel of the invention is formed using TFTs.

FIG. 25 is a block diagram of a scanning line driver circuit formed using an n-channel TFT which uses an SAS with an electron field-effect mobility of 1 to 15 cm$^2$/V·sec.

In FIG. 25, a block 8500 corresponds to a pulse output circuit which outputs sampling pulses for one stage. A shift register includes n number of pulse output circuits. Reference numeral 8501 denotes a buffer circuit and a pixel 8502 is connected to the buffer circuit.

Figure 26:
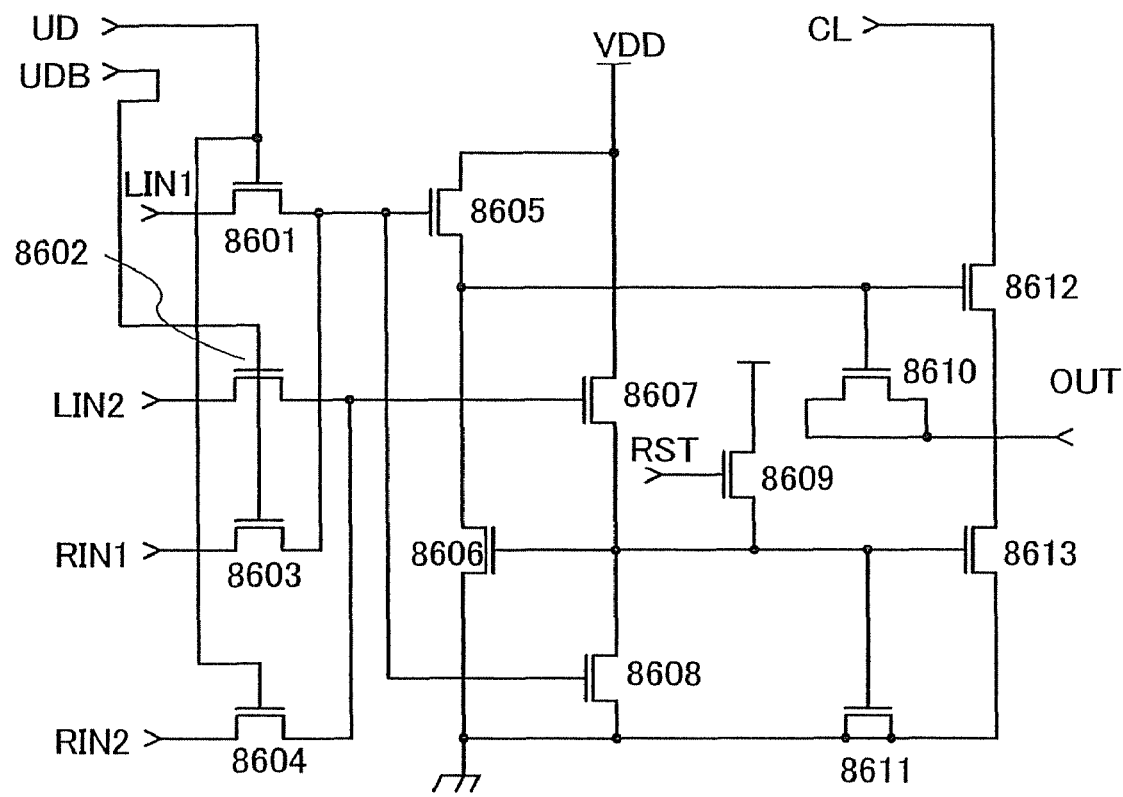
FIG. 26 illustrates a circuit configuration for a case where a scanning line side driver circuit (shift register circuit) in a display panel of the invention is formed using TFTs.

FIG. 26 shows a specific configuration of the pulse output circuit 8500, where the circuit includes n-channel TFTs 8601 to 8613. In this case, the size of the TFTs may be determined taking operational characteristics of the n-channel TFTs which use an SAS into account. For example, when the channel length is 8 μm, the channel width can be in the range of 10 to 80 μm.

Figure 27:
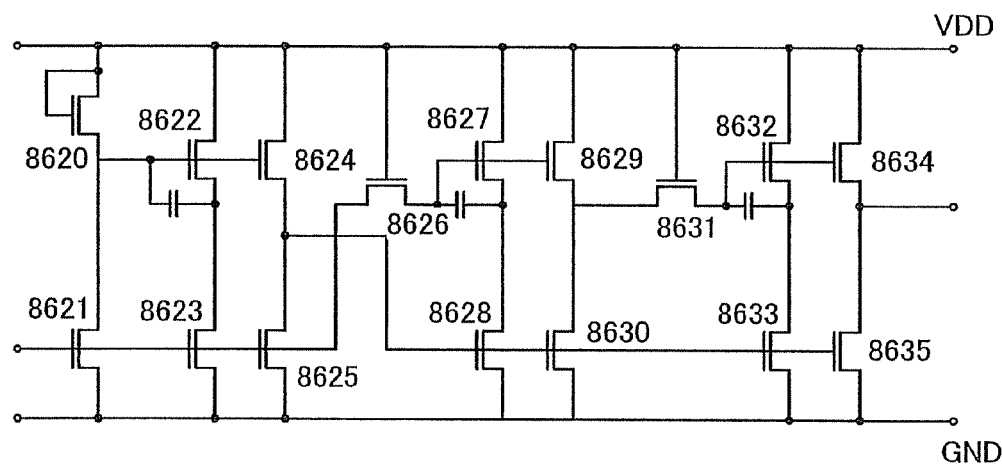
FIG. 27 illustrates a circuit configuration for a case where a scanning line side driver circuit (buffer circuit) in a display panel of the invention is formed using TFTs.

Further, a specific configuration of the buffer circuit 8501 is shown in FIG. 27. The buffer circuit also includes n-channel TFTs 8620 to 8635. In this case, the size of the TFTs may be determined taking operational characteristics of the n-channel TFTs which use an SAS into account. For example, when the channel length is 10 μm, the channel width may be in the range of 10 to 1800 μm.

In order to realize such a circuit, it is necessary for TFTs to be connected to one another with wirings.

As described above, a driver circuit can be incorporated into a display panel.

Below, mounting of a driver circuit onto a display panel described in a previous embodiment will be described, with reference to FIG. 28.

Figure 28A:
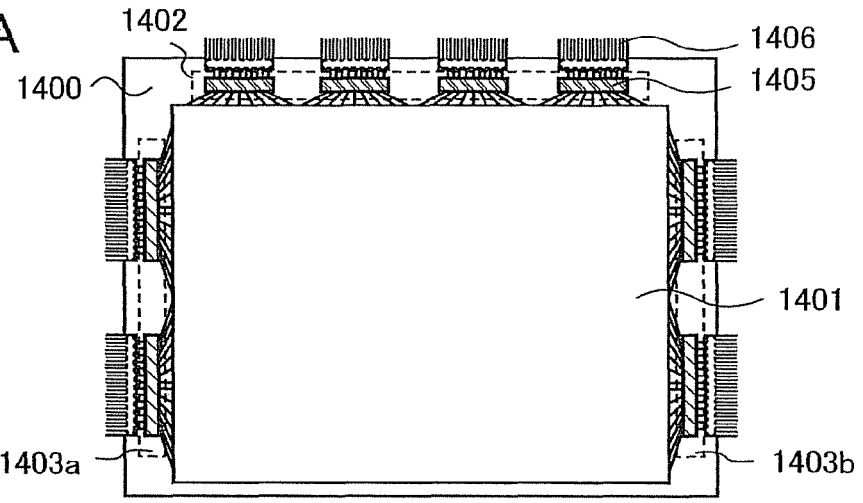
FIGS. 28A to 28C are top views illustrating semiconductor devices of the invention.

As shown in FIG. 28A, source line driver circuits 1402 and gate line driver circuits 1403a and 1403b are mounted on the periphery of a pixel portion 1401. In FIG. 28A, IC chips 1405 which include the source line driver circuit 1402, the gate line driver circuits 1403a and 1403b, and the like are mounted on a substrate 1400 by a known mounting method, such as a method using an anisotropic conductive adhesive or an anisotropic conductive film, a COG method, a wire bonding method, a reflow treatment using a solder bump, or the like. Here, the IC chip 1405 is mounted by a COG method, and is connected to an external circuit through an FPC 1406.

Note that one or more of the source line driver circuits 1402, for example, an analog switch, may be formed over the substrate, and meanwhile the rest of the source line driver circuits 1402 may be mounted onto the substrate using an IC chip.

Figure 28B:
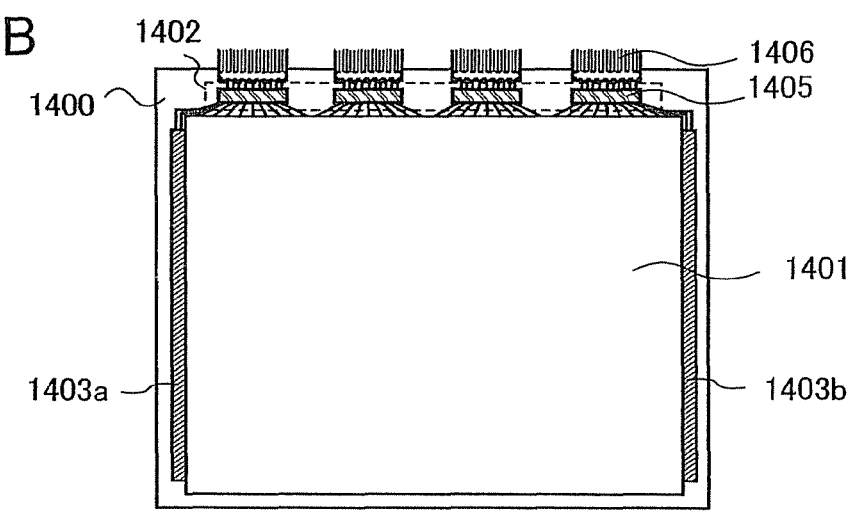

Further, as shown in FIG. 28B, in the case of forming a TFT using an SAS or a crystalline semiconductor, sometimes the pixel portion 1401, the gate line driver circuits 1403a and 1403b, and the like are formed over a substrate, and meanwhile the source line driver circuits 1402 and the like are mounted onto the substrate using IC chips. In FIG. 28B, IC chips 1405 which include the source line driver circuits 1402 are mounted onto the substrate 1400 by a COG method. The IC chips are then connected with an external circuit through the FPC 1406.

Note that one or more of the source line driver circuits 1402, for example, an analog switch, may be formed over the substrate, and meanwhile the rest of the source line driver circuits 1402 may be mounted onto the substrate using an IC chip.

Figure 28C:
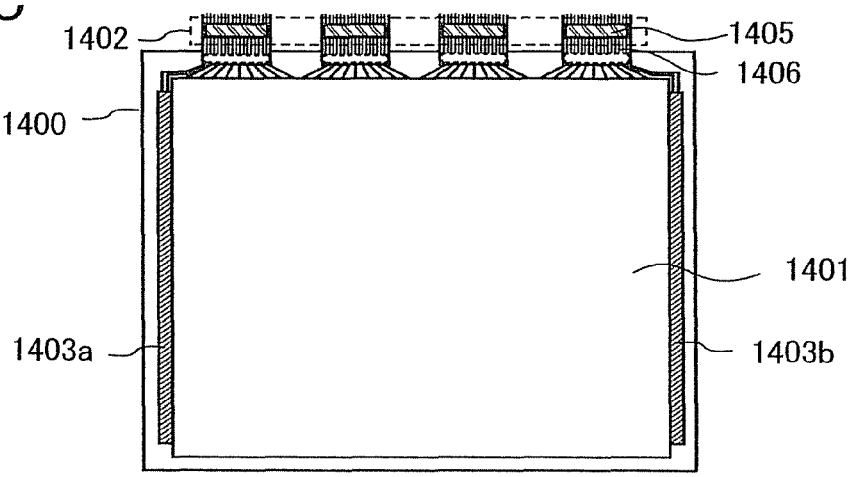

Further, as shown in FIG. 28C, in some cases, the source line driver circuits 1402 and the like are mounted by a TAB method instead of a COG method. The IC chips are then connected with an external circuit through the FPC 1406. In FIG. 28C, the source line driver circuits have been mounted by a TAB method; however, the gate line driver circuits may be mounted by a TAB method.

When IC chips are mounted by a TAB method, the pixel portion can occupy a large area of the substrate, and therefore a frame can be made narrower.

Instead of employing an IC chip formed using a silicon wafer, an IC (hereinafter referred to as a driver IC) in which circuits are formed over a glass substrate may be provided. Because IC chips are formed using a circular silicon wafer, the shape of a mother substrate is limited. Meanwhile, a driver IC has a mother substrate made of glass and the shape of the mother substrate is not limited. Therefore, productivity can be improved. Accordingly, the shape and size of a driver IC can be freely determined. For example, when driver ICs with a long side of 15 to 80 mm are formed, the number of ICs which are necessary can be reduced, compared to a case where IC chips are mounted. As a result, the number of connecting terminals can be reduced and productive yield can be improved.

A driver IC can be formed using a TFT having a crystalline semiconductor layer formed over a substrate, and the crystalline semiconductor layer may be formed by continuous wave laser beam irradiation. A semiconductor layer obtained by continuous wave laser beam irradiation has few crystal defects and large crystal grains. Accordingly, a TFT having such a semiconductor layer has good mobility and response speed and is capable of high speed driving, and is therefore suitable for a driver IC.

Figure 29:
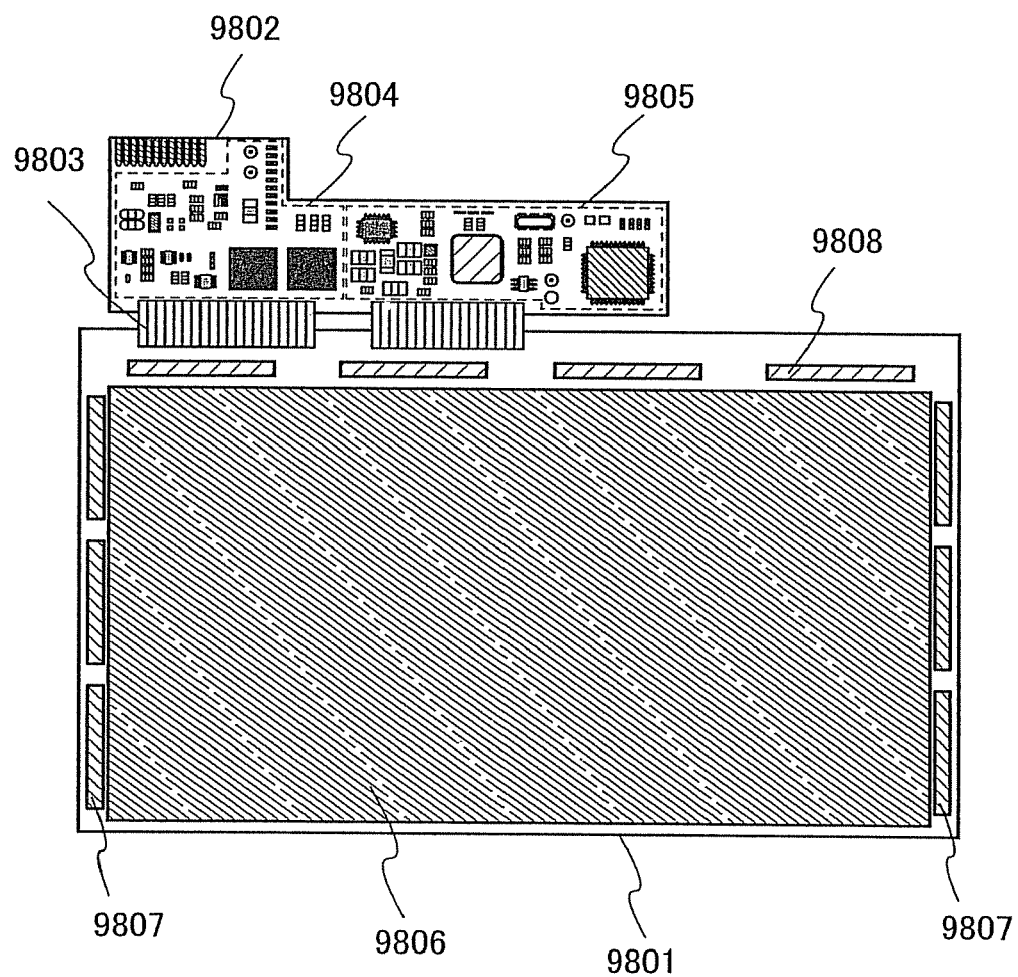
FIG. 29 is a top view of illustrating a semiconductor device of the invention.

A module having a display panel described in a previous embodiment will now be described, with reference to FIG. 29. FIG. 29 shows a module having a display panel 9801 and a circuit substrate 9802. Over the circuit substrate 9802, a control circuit 9804, a signal dividing circuit 9805, and the like are formed, for example. Further, the display panel 9801 and the circuit substrate 9802 are connected by a connection wiring 9803. As the display panel 9801, a liquid crystal display panel, a light-emitting display panel, or an electrophoretic display panel, such as those described in Embodiments 1 to 3, or the like can be used as appropriate.

The display panel 9801 includes a pixel portion 9806 in which a light-emitting element is provided in each pixel, a scanning line driver circuit 9807, and a signal line driver circuit 9808 which supplies a video signal to a selected pixel. The configuration of the pixel portion 9806 is similar to that in Embodiments 1 to 3. Further, the scanning line driver circuit 9807 and the signal line driver circuit 9808 are formed using IC chips which are mounted over the substrate using a method such as a mounting method which employs an anisotropic conductive adhesive or an anisotropic conductive film, a COG method, a wire bonding method, a reflow treatment which employs a solder bump, or the like.

According, to this embodiment, modules having a display panel can be formed with a good yield.

Embodiment 5

Examples which can be given of electronic appliances having a semiconductor device described in a previous embodiment mode or embodiment include television devices (also referred to as simply televisions, or as television receivers), digital cameras, digital video cameras, portable telephone devices (also referred to as simply portable telephones, or mobile phones), portable information terminals such as PDAs, portable game machines, monitors for computers, computers, sound reproducing devices, such as car audio devices, image reproducing devices equipped with a recording medium, such as home-use game machines, or the like. Specific examples of these are described with reference to FIGS. 30A to 30F.

Figure 30A:
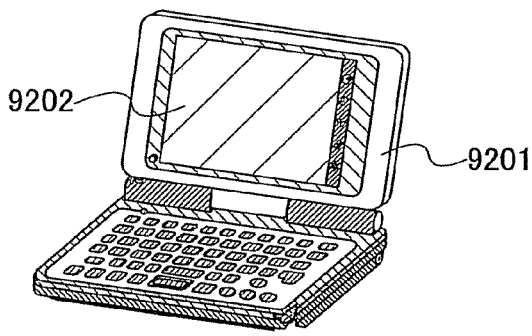
FIGS. 30A to 30F are perspective views illustrating electronic devices which employ a semiconductor device of the invention.

A portable information terminal shown in FIG. 30A includes a main body 9201, a display portion 9202, and the like. By employing a semiconductor device described in a preceding embodiment mode in the display portion 9202, a portable information terminal can be provided at a low price.

Figure 30B:
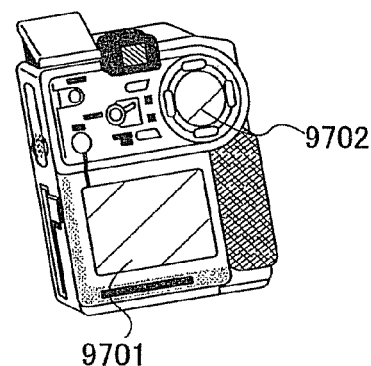

A digital video camera shown in FIG. 30B includes a display portion 9701, a display portion 9702, and the like. By employing a semiconductor device described in a preceding embodiment mode or embodiment in the display portion 9701, a digital video camera can be provided at a low price.

Figure 30C:
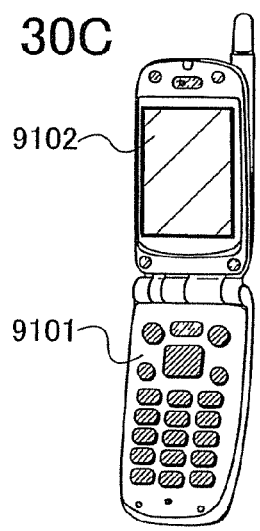

A portable terminal shown in FIG. 30C includes a main body 9101, a display portion 9102, and the like. By employing a semiconductor device described in a preceding embodiment mode or embodiment in the display portion 9102, a portable terminal can be provided at a low price.

Figure 30D:
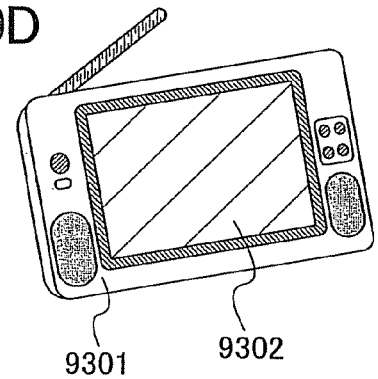

A portable television device shown in FIG. 30D includes a main body 9301, a display portion 9302, and the like. By employing a semiconductor device described in a preceding embodiment mode or embodiment in the display portion 9302, a portable television device can be provided at a low price. Such a television device can be applied to a wide range of television devices, from small-sized devices that are mounted on portable terminals such as portable phones to medium-sized devices that are portable and large-sized devices (for example, 40 inches or more).

Figure 30E:
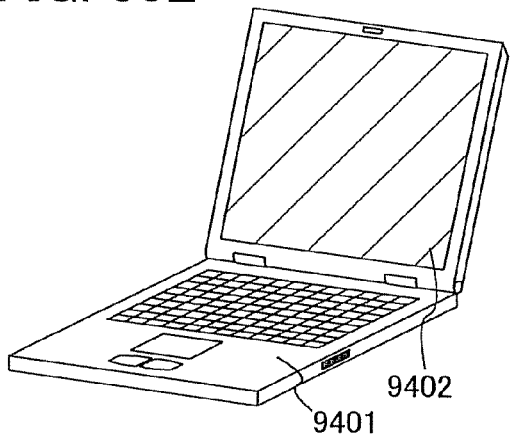

A portable computer shown in FIG. 30E includes a main body 9401, a display portion 9402, and the like. By employing a semiconductor device described in a preceding embodiment mode or embodiment in the display portion 9402, a portable computer can be provided at a low price.

Figure 30F:
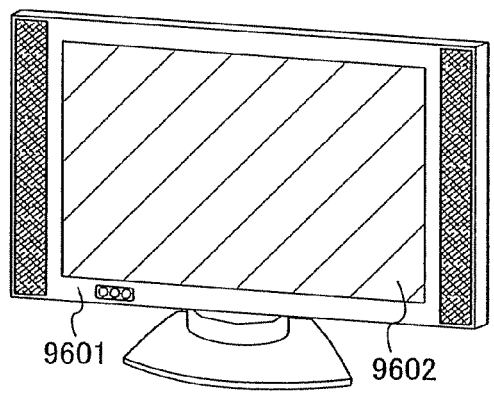

A television device shown in FIG. 30F includes a main body 9601, a display portion 9602, and the like. By employing a semiconductor device described in a preceding embodiment mode or embodiment in the display portion 9602, a television device can be provided at a low price.

A structure of the television device will now be described, with reference to FIG. 14.

Figure 14:
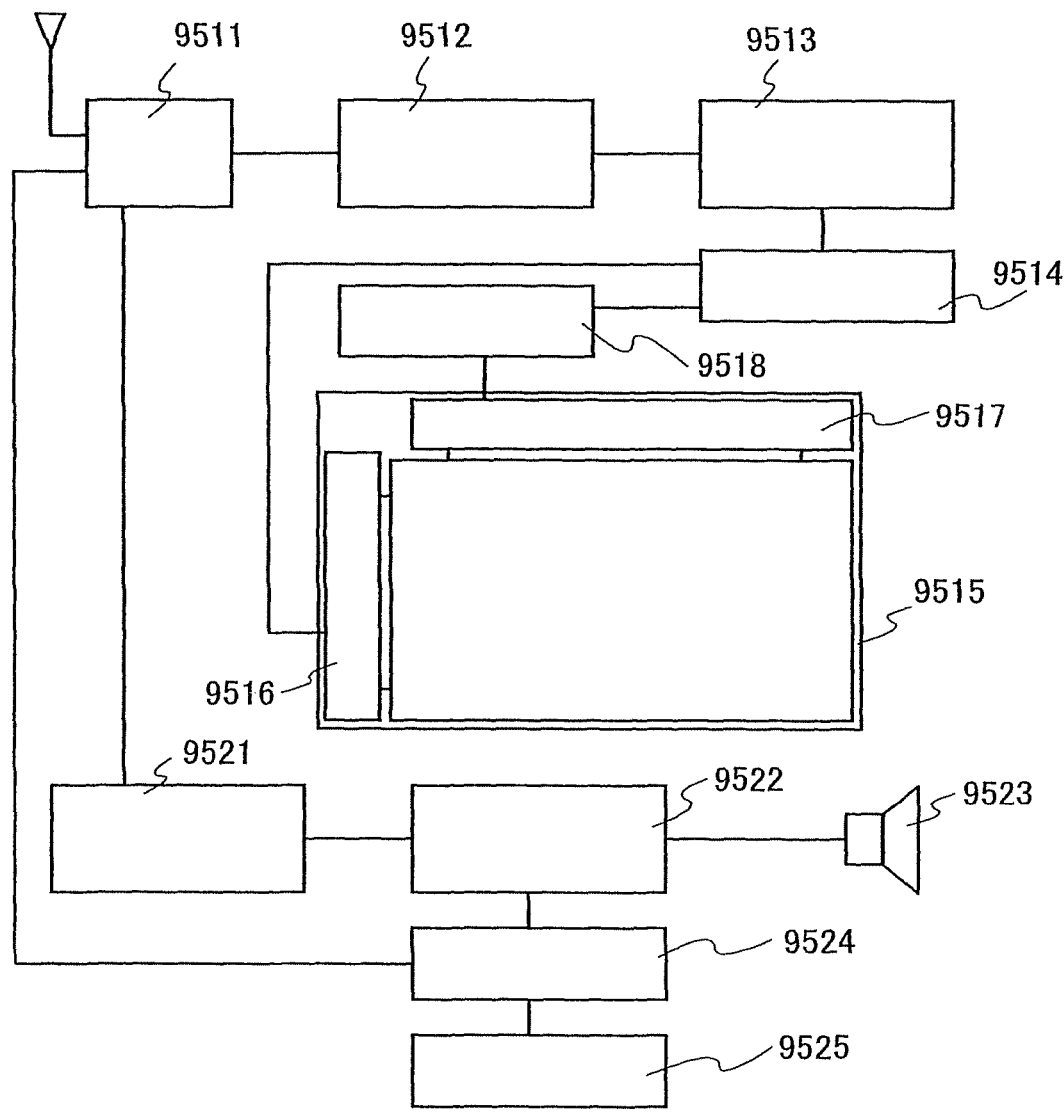
FIG. 14 illustrates an electronic device which employs a semiconductor device of the invention.

FIG. 14 is a block diagram showing the main structure of the television device. A tuner 9511 receives an image signal and an audio signal. The image signal is processed through an image detection circuit 9512, an image signal processing circuit 9513 which converts the signal outputted from the image detection circuit 9512 into a color signal corresponding to red, green, or blue, and a control circuit 9514 for converting the image signal in accordance with input specifications of a driver IC. The control circuit 9514 outputs signals to a scanning line driver circuit 9516 and a signal line driver circuit 9517 of a display panel 9515. In a case where digital driving is used, a signal dividing circuit 9518 may be provided on a signal line side so that the inputted digital signal is divided into m number of signals to be supplied.

Of the signals received by the tuner 9511, the audio signal is sent to an audio detection circuit 9521 and its output is supplied to a speaker 9523 through an audio signal processing circuit 9522. The control circuit 9524 receives control information such as a receiving station (a receiving frequency) and sound volume from an input portion 9525, and sends signals to the tuner 9511 and the audio signal processing circuit 9522.

By forming the television device so as to include the display panel 9515, the television device can have low power consumption.

The present invention is not limited to television receivers, and can be applied to various uses, for example to display mediums, particularly ones with a large area, such as an information display board at a railway station, an airport, or the like, or an advertisement display board on the street, as well as to monitors of personal computers.

The present application is based on Japanese priority application No. 2006-229093 filed on Aug. 25, 2006 with the Japanese Patent Office, the entire contents of which are hereby incorporated by reference.

What is claimed is:

1. A method of manufacturing a semiconductor device comprising:
    forming a first layer over a substrate;
    forming a second layer over the first layer, wherein the second layer has a first region and a second region;
    forming a third layer over the second layer, wherein the third layer has a third region over and in contact with the first region and a fourth region over and in contact with the second region;
    selectively removing the third region, by selectively irradiating the first region with a laser beam via the third region, using an electrooptic element as an adjustable mask; and
    selectively etching the first region and the first layer, using the fourth region as a mask,
    wherein the second layer is capable of absorbing the laser beam, and
    wherein the third layer is capable of transmitting the laser beam.

2. The method of manufacturing a semiconductor device according to claim 1, wherein a material of the first layer is a conductive material, a semiconductor material or an insulating material.

3. The method of manufacturing a semiconductor device according to claim 1, wherein a remaining portion of the first layer serves as an electrode.

4. The method of manufacturing a semiconductor device according to claim 1, wherein the semiconductor device is a display panel in which a gate electrode is formed by the first layer.

5. The method of manufacturing a semiconductor device according to claim 1, further comprising the step of:
    removing the fourth region, after the step of etching the first layer.

6. The method of manufacturing a semiconductor device according to claim 5, further comprising the step of:
    removing the second region, after the step of removing the fourth region.

7. The method of manufacturing a semiconductor device according to claim 1, wherein the etching is a dry etching.

8. The method of manufacturing a semiconductor device according to claim 1, wherein the laser beam has a rectangular shape.

9. The method of manufacturing a semiconductor device according to claim 1, wherein the electrooptic element as an adjustable mask is a digital micromirror device.

10. The method of manufacturing a semiconductor device according to claim 1, wherein the laser beam has an energy density within a range of 1 $\mu J/cm^2$ to 100 $J/cm^2$.

11. The method of manufacturing a semiconductor device according to claim 1, wherein the second layer is formed using a material having a band gap energy that is lower than the energy of the laser beam.

12. The method of manufacturing a semiconductor device according to claim 1, wherein the third layer is formed using a material having a band gap energy that is larger than an energy of the laser beam.

13. A method of manufacturing a semiconductor device comprising:
    forming a first layer over a substrate;
    forming a second layer over the first layer, wherein the second layer has a first region and a second region;

forming a third layer over the second layer, wherein the third layer has a third region over and in contact with the first region and a fourth region over and in contact with the second region;

selectively removing a surface of the first region and the third region, by selectively irradiating the first region with a laser beam via the third region, using an electrooptic element as an adjustable mask; and selectively etching a remaining portion of the first region and the first layer, using the fourth region as a mask, wherein the second layer is capable of absorbing the laser beam, and wherein the third layer is capable of transmitting the laser beam.

14. The method of manufacturing a semiconductor device according to claim 13, wherein a material of the first layer is a conductive material, a semiconductor material or an insulating material.

15. The method of manufacturing a semiconductor device according to claim 13, wherein a remaining portion of the first layer serves as an electrode.

16. The method of manufacturing a semiconductor device according to claim 13, wherein the semiconductor device is a display panel in which a gate electrode is formed by the first layer.

17. The method of manufacturing a semiconductor device according to claim 13, further comprising the step of:
removing the fourth region, after the step of etching the first layer.

18. The method of manufacturing a semiconductor device according to claim 17, further comprising the step of:
removing the second region, after the step of removing the fourth region.

19. The method of manufacturing a semiconductor device according to claim 13, wherein the etching is a dry etching.

20. The method of manufacturing a semiconductor device according to claim 13, wherein the laser beam has a rectangular shape.

21. The method of manufacturing a semiconductor device according to claim 13, wherein the electrooptic element as an adjustable mask is a digital micromirror device.

22. The method of manufacturing a semiconductor device according to claim 13, wherein the laser beam has an energy density within a range of 1 $\mu$J/cm$^2$ to 100 J/cm$^2$.

23. The method of manufacturing a semiconductor device according to claim 13, wherein the second layer is formed using a material having a band gap energy that is lower than the energy of the laser beam.

24. The method of manufacturing a semiconductor device according to claim 13, wherein the third layer is formed using a material having a band gap energy that is larger than an energy of the laser beam.

25. A method of manufacturing a semiconductor device comprising:
forming a first layer over a substrate;
forming a second layer over the first layer, wherein the second layer has a first region and a second region;
forming a third layer over the second layer, wherein the third layer has a third region over and in contact with the first region and a fourth region over and in contact with the second region;
selectively removing the first region and the third region, by selectively irradiating the first region with a laser beam via the third region, using an electrooptic element as an adjustable mask; and
selectively etching the first layer, using the fourth region as a mask,
wherein the second layer is capable of absorbing the laser beam, and
wherein the third layer is capable of transmitting the laser beam.

26. The method of manufacturing a semiconductor device according to claim 25, wherein a material of the first layer is a conductive material, a semiconductor material or an insulating material.

27. The method of manufacturing a semiconductor device according to claim 25, wherein a remaining portion of the first layer serves as an electrode.

28. The method of manufacturing a semiconductor device according to claim 25, wherein the semiconductor device is a display panel in which a gate electrode is formed by the first layer.

29. The method of manufacturing a semiconductor device according to claim 25, further comprising the step of:
removing the fourth region, after the step of etching the first layer.

30. The method of manufacturing a semiconductor device according to claim 29, further comprising the step of:
removing the second region, after the step of removing the fourth region.

31. The method of manufacturing a semiconductor device according to claim 25, wherein the etching is a dry etching.

32. The method of manufacturing a semiconductor device according to claim 25, wherein the laser beam has a rectangular shape.

33. The method of manufacturing a semiconductor device according to claim 25, wherein the electrooptic element as an adjustable mask is a digital micromirror device.

34. The method of manufacturing a semiconductor device according to claim 25, wherein the laser beam has an energy density within a range of 1 $\mu$J/cm$^2$ to 100 J/cm$^2$.

35. The method of manufacturing a semiconductor device according to claim 25, wherein the second layer is formed using a material having a band gap energy that is lower than the energy of the laser beam.

36. The method of manufacturing a semiconductor device according to claim 25, wherein the third layer is formed using a material having a band gap energy that is larger than an energy of the laser beam.

* * * * *